US011394386B2

(12) United States Patent
Lin et al.

(10) Patent No.: US 11,394,386 B2
(45) Date of Patent: *Jul. 19, 2022

(54) LOGIC DRIVE USING STANDARD COMMODITY PROGRAMMABLE LOGIC IC CHIPS

(71) Applicant: iCometrue Company Ltd., Zhubei (TW)

(72) Inventors: Mou-Shiung Lin, Hsinchu (TW); Jin-Yuan Lee, Hsinchu (TW)

(73) Assignee: iCometrue Company Ltd., Hsin-Chu County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/950,893

(22) Filed: Nov. 17, 2020

(65) Prior Publication Data

US 2021/0075423 A1    Mar. 11, 2021

Related U.S. Application Data

(63) Continuation of application No. 16/835,287, filed on Mar. 30, 2020, now Pat. No. 10,886,924, which is a
(Continued)

(51) Int. Cl.
*H03K 19/1776* (2020.01)
*H03K 19/17728* (2020.01)
(Continued)

(52) U.S. Cl.
CPC ..... *H03K 19/1776* (2013.01); *H01L 23/5382* (2013.01); *H01L 23/5384* (2013.01);
(Continued)

(58) Field of Classification Search
CPC ......... H03K 19/1776; H03K 19/17728; H03K 19/1737; H03K 19/21; H03K 19/20;
(Continued)

(56) References Cited

U.S. PATENT DOCUMENTS

| 4,870,302 A | 9/1989 | Freeman |
| 5,272,368 A | 12/1993 | Turner et al. |

(Continued)

FOREIGN PATENT DOCUMENTS

| CN | 103681367 | 3/2014 |
| CN | 104078453 | 10/2014 |

(Continued)

*Primary Examiner* — Don P Le

(57) ABSTRACT

A three-dimensional programmable interconnection system based on a multi-chip package includes: a programmable metal bump or pad at a bottom of the multi-chip package; a first programmable interconnect provided by an interposer of the multi-chip package; a second programmable interconnect provided by the interposer; and a switch provided by a first semiconductor chip of the multi-chip package, wherein the switch is configured to control connection between the first and second programmable interconnects, wherein the programmable metal bump or pad couples to a second semiconductor chip of the multi-chip package through the switch and the first and second programmable interconnects, wherein the first and second semiconductor chips are over the interposer.

20 Claims, 31 Drawing Sheets

Related U.S. Application Data continuation of application No. 16/275,272, filed on Feb. 13, 2019, now Pat. No. 10,623,000.

(60) Provisional application No. 62/630,369, filed on Feb. 14, 2018, provisional application No. 62/675,785, filed on May 24, 2018, provisional application No. 62/729,527, filed on Sep. 11, 2018, provisional application No. 62/741,513, filed on Oct. 4, 2018, provisional application No. 62/755,415, filed on Nov. 2, 2018, provisional application No. 62/768,978, filed on Nov. 18, 2018.

(51) Int. Cl.
*H01L 23/00* (2006.01)
*H01L 25/18* (2006.01)
*H01L 23/538* (2006.01)
*H03K 19/20* (2006.01)
*H01L 25/065* (2006.01)

(52) U.S. Cl.
CPC .............. *H01L 24/13* (2013.01); *H01L 24/16* (2013.01); *H01L 25/18* (2013.01); *H03K 19/17728* (2013.01); *H01L 23/5386* (2013.01); *H01L 25/0652* (2013.01); *H01L 2224/13023* (2013.01); *H01L 2224/13147* (2013.01); *H01L 2224/16227* (2013.01); *H01L 2924/1431* (2013.01); *H01L 2924/1432* (2013.01); *H01L 2924/1436* (2013.01); *H01L 2924/1437* (2013.01); *H03K 19/20* (2013.01)

(58) Field of Classification Search
CPC ... H01L 27/24; H01L 27/11517; H01L 25/18; H01L 23/5386; H01L 24/16; H01L 24/13; H01L 2924/1432; H01L 2924/1443; H01L 2924/1437; H01L 2924/1436; H01L 2924/1431; H01L 2224/13023; H01L 2224/16227; H01L 2224/13147
USPC .......................................................... 326/41
See application file for complete search history.

(56) References Cited

U.S. PATENT DOCUMENTS

| | | | |
|---|---|---|---|
| 5,587,603 A | 12/1996 | Kowshik | |
| 5,592,102 A * | 1/1997 | Lane | G06F 15/7867 326/10 |
| 5,689,195 A * | 11/1997 | Cliff | H03K 19/1736 326/39 |
| 5,796,662 A * | 8/1998 | Kalter | G11C 29/848 365/200 |
| 6,020,633 A | 2/2000 | Erickson | |
| 6,167,558 A * | 12/2000 | Trimberger | G01R 31/318519 716/117 |
| 6,356,478 B1 | 3/2002 | McCollum | |
| 6,388,466 B1 | 5/2002 | Wittig et al. | |
| 6,404,226 B1 * | 6/2002 | Schadt | H01L 27/118 257/203 |
| 6,687,167 B2 | 2/2004 | Guaitini et al. | |
| 6,798,240 B1 | 9/2004 | Pedersen | |
| 6,812,086 B2 | 11/2004 | Murthy et al. | |
| 6,828,823 B1 | 12/2004 | Tsui | |
| 6,943,580 B2 | 9/2005 | Lewis et al. | |
| 6,998,872 B1 | 2/2006 | Chirania et al. | |
| 7,030,652 B1 | 4/2006 | Lewis et al. | |
| 7,061,271 B1 | 6/2006 | Young et al. | |
| 7,193,433 B1 | 3/2007 | Young | |
| 7,219,237 B1 | 5/2007 | Trimberger | |
| 7,366,306 B1 | 4/2008 | Trimberger | |
| 7,385,417 B1 | 6/2008 | Agrawal et al. | |
| 7,420,390 B1 | 9/2008 | Hutton et al. | |
| 7,550,994 B1 | 6/2009 | Camarota | |
| 7,598,555 B1 | 10/2009 | Papworth Parkin | |
| 7,653,891 B1 | 1/2010 | Anderson et al. | |
| 7,747,025 B1 | 6/2010 | Trimberger | |
| 7,853,799 B1 | 12/2010 | Trimberger | |
| 7,933,140 B2 | 4/2011 | Wang et al. | |
| 7,944,231 B2 | 5/2011 | Javerliac | |
| 7,948,266 B2 | 5/2011 | Schmit et al. | |
| 7,973,556 B1 | 7/2011 | Noguera Serra et al. | |
| 8,064,224 B2 | 11/2011 | Mahajan et al. | |
| 8,081,079 B1 | 12/2011 | Camarota | |
| 8,159,268 B1 | 4/2012 | Madurawe | |
| 8,243,527 B2 | 8/2012 | Hung et al. | |
| 8,354,297 B2 | 1/2013 | Pagaila et al. | |
| 8,378,407 B2 | 2/2013 | Audzeyeu et al. | |
| 8,531,032 B2 | 9/2013 | Yu et al. | |
| 8,546,955 B1 | 10/2013 | Wu | |
| 8,592,886 B2 | 11/2013 | Hsu et al. | |
| 8,709,865 B2 | 4/2014 | Hu et al. | |
| 8,742,579 B2 | 6/2014 | Pagaila et al. | |
| 8,786,060 B2 | 7/2014 | Yen et al. | |
| 8,796,137 B2 | 8/2014 | Pagaila et al. | |
| 8,866,292 B2 | 10/2014 | Beer et al. | |
| 8,872,349 B2 | 10/2014 | Chiu et al. | |
| 8,878,360 B2 | 11/2014 | Meyer et al. | |
| 8,883,561 B2 | 11/2014 | Park et al. | |
| 8,885,334 B1 | 11/2014 | Baxter | |
| 8,895,440 B2 | 11/2014 | Choi et al. | |
| 8,912,822 B2 | 12/2014 | Yasuda | |
| 8,916,421 B2 | 12/2014 | Gong et al. | |
| 8,941,230 B2 | 1/2015 | Kyozuka et al. | |
| 8,952,489 B2 | 2/2015 | Elian et al. | |
| 8,952,521 B2 | 2/2015 | Wojnowski et al. | |
| 8,987,918 B2 | 3/2015 | Razdan et al. | |
| 8,993,377 B2 | 3/2015 | Koo et al. | |
| 9,003,221 B1 | 4/2015 | Abugharbieh et al. | |
| 9,082,806 B2 | 7/2015 | Lin et al. | |
| 9,106,229 B1 | 8/2015 | Hutton | |
| 9,135,185 B2 | 9/2015 | Loh et al. | |
| 9,147,638 B2 | 9/2015 | Liu et al. | |
| 9,224,647 B2 | 12/2015 | Koo et al. | |
| 9,225,512 B1 | 12/2015 | Trimberger | |
| 9,252,127 B1 | 2/2016 | Shen et al. | |
| 9,263,370 B2 | 2/2016 | Shenoy et al. | |
| 9,281,292 B2 | 3/2016 | Hu et al. | |
| 9,324,672 B2 | 4/2016 | Pagaila et al. | |
| 9,331,060 B2 | 5/2016 | Otremba et al. | |
| 9,343,442 B2 | 5/2016 | Chen et al. | |
| 9,349,703 B2 | 5/2016 | Chiu et al. | |
| 9,349,713 B2 | 5/2016 | Kim et al. | |
| 9,362,187 B2 | 6/2016 | Ossimitz | |
| 9,368,458 B2 | 6/2016 | Wu et al. | |
| 9,385,006 B2 | 7/2016 | Lin | |
| 9,385,009 B2 | 7/2016 | Lin et al. | |
| 9,385,105 B2 | 7/2016 | Meyer et al. | |
| 9,396,998 B2 | 7/2016 | Kurita et al. | |
| 9,397,050 B2 | 7/2016 | Shin et al. | |
| 9,406,619 B2 | 8/2016 | Pagaila et al. | |
| 9,406,658 B2 | 8/2016 | Lee et al. | |
| 9,437,260 B2 | 9/2016 | Prenat et al. | |
| 9,449,930 B2 | 9/2016 | Kim et al. | |
| 9,455,218 B2 | 9/2016 | Ooi et al. | |
| 9,508,626 B2 | 11/2016 | Pagaila et al. | |
| 9,524,955 B2 | 12/2016 | Huang et al. | |
| 9,543,276 B2 | 1/2017 | Jee et al. | |
| 9,583,431 B1 | 2/2017 | Rahman | |
| 9,593,009 B2 | 3/2017 | Fuergut et al. | |
| 9,607,967 B1 | 3/2017 | Shih | |
| 9,627,365 B1 | 4/2017 | Yu et al. | |
| 9,640,259 B2 | 5/2017 | Li et al. | |
| 9,679,863 B2 | 6/2017 | Lin et al. | |
| 9,704,843 B2 | 7/2017 | Kilger et al. | |
| 9,735,113 B2 | 8/2017 | Chi et al. | |
| 9,763,329 B1 | 9/2017 | Mason | |
| 9,773,757 B2 | 9/2017 | Yu et al. | |
| 9,806,058 B2 | 10/2017 | Wei et al. | |
| 9,812,337 B2 | 11/2017 | Chen et al. | |
| 9,818,720 B2 | 11/2017 | Wei et al. | |
| 9,831,148 B2 | 11/2017 | Yu et al. | |

(56) References Cited

U.S. PATENT DOCUMENTS

| | | |
|---|---|---|
| 9,859,896 B1 | 1/2018 | Gaide et al. |
| 9,881,850 B2 | 1/2018 | Yu et al. |
| 9,887,206 B2 | 2/2018 | Su et al. |
| 9,893,732 B1* | 2/2018 | Lewis ............... H03K 19/00392 |
| 9,899,248 B2 | 2/2018 | Yu et al. |
| 9,899,355 B2 | 2/2018 | Yuan et al. |
| 9,935,113 B2 | 4/2018 | Wu et al. |
| 9,966,325 B2 | 5/2018 | Beyne |
| 9,997,464 B2 | 6/2018 | Hsieh et al. |
| 10,015,916 B1 | 7/2018 | Karp |
| 10,026,681 B2 | 7/2018 | Ko et al. |
| 10,033,383 B1 | 7/2018 | Richter et al. |
| 10,037,963 B2 | 7/2018 | Chen et al. |
| 10,038,647 B1 | 7/2018 | Lesea |
| 10,043,768 B2 | 8/2018 | Meyer et al. |
| 10,056,351 B2 | 8/2018 | Yu et al. |
| 10,056,907 B1 | 8/2018 | Asnaashari |
| 10,062,648 B2 | 8/2018 | Hsieh et al. |
| 10,062,651 B2 | 8/2018 | Liang et al. |
| 10,079,243 B2 | 9/2018 | Ramkumar |
| 10,109,588 B2 | 10/2018 | Jeong et al. |
| 10,109,617 B2 | 11/2018 | Sugiyama et al. |
| 10,153,222 B2 | 12/2018 | Yu et al. |
| 10,153,239 B2 | 12/2018 | Wang et al. |
| 10,157,828 B2 | 12/2018 | Hsu et al. |
| 10,157,849 B2 | 12/2018 | Huang et al. |
| 10,162,139 B1 | 12/2018 | Wang et al. |
| 10,163,798 B1 | 12/2018 | Alur et al. |
| 10,163,802 B2 | 12/2018 | Lin et al. |
| 10,177,188 B2 | 1/2019 | Kang et al. |
| 10,204,684 B2 | 2/2019 | Widjaja |
| 10,211,070 B2 | 2/2019 | Lee et al. |
| 10,211,182 B2 | 2/2019 | Meyer et al. |
| 10,256,219 B2 | 4/2019 | Chew |
| 10,290,611 B2 | 5/2019 | Yu et al. |
| 10,325,882 B2 | 6/2019 | Kang et al. |
| 10,333,623 B1 | 6/2019 | Liao et al. |
| 10,340,249 B1 | 7/2019 | Yu et al. |
| 10,373,885 B2 | 8/2019 | Yu et al. |
| 10,419,001 B2 | 9/2019 | Jo et al. |
| 10,431,536 B2 | 10/2019 | Kim et al. |
| 10,447,274 B2 | 10/2019 | Lee et al. |
| 10,476,505 B2 | 11/2019 | Ngai |
| 10,490,521 B2 | 11/2019 | Hu et al. |
| 10,490,540 B2 | 11/2019 | Yu et al. |
| 10,504,835 B1 | 12/2019 | Wang et al. |
| 10,510,634 B2 | 12/2019 | Lin et al. |
| 10,510,650 B2 | 12/2019 | Yu et al. |
| 10,522,449 B2 | 12/2019 | Chen et al. |
| 10,541,227 B2 | 1/2020 | Yeh et al. |
| 10,541,228 B2 | 1/2020 | Chen et al. |
| 10,622,321 B2 | 4/2020 | Yu et al. |
| 10,741,537 B2 | 8/2020 | Lu et al. |
| 10,784,248 B2 | 9/2020 | Yu et al. |
| 10,797,031 B2 | 10/2020 | Liao et al. |
| 10,892,011 B2 | 1/2021 | Lin et al. |
| 2001/0045844 A1 | 11/2001 | New et al. |
| 2003/0122578 A1 | 7/2003 | Masui et al. |
| 2004/0041584 A1 | 3/2004 | Sunaga et al. |
| 2004/0145850 A1 | 7/2004 | Fukumoto et al. |
| 2004/0222817 A1 | 11/2004 | Madurawe |
| 2005/0185457 A1 | 8/2005 | Kim et al. |
| 2005/0218929 A1 | 10/2005 | Wang et al. |
| 2007/0166912 A1 | 7/2007 | Fenigstein et al. |
| 2007/0279987 A1 | 12/2007 | Fang et al. |
| 2009/0114971 A1 | 5/2009 | Cai et al. |
| 2009/0243650 A1 | 10/2009 | Madurawe |
| 2009/0243652 A1 | 10/2009 | Dorairaj et al. |
| 2009/0267238 A1 | 10/2009 | Joseph |
| 2010/0039136 A1 | 2/2010 | Chua-Eoan et al. |
| 2010/0157669 A1 | 6/2010 | Audzeyeu |
| 2010/0283085 A1 | 11/2010 | Bemanian |
| 2011/0026232 A1 | 2/2011 | Lin et al. |
| 2011/0221470 A1 | 9/2011 | Javerliac et al. |
| 2012/0193785 A1 | 8/2012 | Lin et al. |
| 2012/0217549 A1 | 8/2012 | Widjaja |
| 2013/0082399 A1 | 4/2013 | Kim et al. |
| 2013/0257477 A1 | 10/2013 | Yasuda et al. |
| 2013/0285253 A1 | 10/2013 | Aoki et al. |
| 2014/0017882 A1 | 1/2014 | Lei |
| 2014/0070403 A1 | 3/2014 | Pan et al. |
| 2014/0131858 A1 | 5/2014 | Pan et al. |
| 2014/0183731 A1 | 7/2014 | Lin et al. |
| 2014/0185264 A1 | 7/2014 | Chen et al. |
| 2014/0203412 A1 | 7/2014 | Wang et al. |
| 2014/0210097 A1 | 7/2014 | Chen |
| 2014/0254232 A1 | 9/2014 | Wu |
| 2014/0302659 A1 | 10/2014 | Phatak |
| 2015/0008957 A1 | 1/2015 | Olgiati et al. |
| 2015/0014844 A1 | 1/2015 | Wu et al. |
| 2015/0116965 A1 | 4/2015 | Kim et al. |
| 2015/0227662 A1* | 8/2015 | Lepercq ................. G06F 30/34 716/117 |
| 2015/0327367 A1 | 11/2015 | Shen |
| 2016/0118390 A1 | 4/2016 | Liaw |
| 2016/0133571 A1 | 5/2016 | Lee et al. |
| 2016/0173101 A1 | 6/2016 | Gao et al. |
| 2016/0190113 A1 | 6/2016 | Sharan et al. |
| 2016/0217835 A1 | 7/2016 | Blott et al. |
| 2016/0351626 A1 | 12/2016 | McCollum |
| 2016/0372449 A1 | 12/2016 | Rusu et al. |
| 2017/0071552 A1 | 3/2017 | Harpe et al. |
| 2017/0301650 A1 | 10/2017 | Yu |
| 2018/0053730 A1 | 2/2018 | Shao |
| 2018/0061742 A1 | 3/2018 | Ananiev |
| 2018/0076179 A1 | 3/2018 | Hsu et al. |
| 2018/0102776 A1 | 4/2018 | Chandrasekar et al. |
| 2018/0150667 A1 | 5/2018 | Yu et al. |
| 2018/0151477 A1 | 5/2018 | Yu et al. |
| 2018/0151501 A1 | 5/2018 | Yu et al. |
| 2018/0158746 A1 | 6/2018 | Lin |
| 2018/0165396 A1 | 6/2018 | Lin et al. |
| 2018/0174865 A1 | 6/2018 | Yu et al. |
| 2018/0204810 A1 | 7/2018 | Yu et al. |
| 2018/0204828 A1 | 7/2018 | Yu et al. |
| 2018/0210799 A1* | 7/2018 | Gao .................. G06F 11/1088 |
| 2018/0226349 A1 | 8/2018 | Yu et al. |
| 2018/0247905 A1 | 8/2018 | Yu et al. |
| 2018/0269188 A1 | 9/2018 | Yu et al. |
| 2018/0275193 A1 | 9/2018 | Rouge et al. |
| 2018/0284186 A1 | 10/2018 | Chadha |
| 2018/0286776 A1 | 10/2018 | Yu et al. |
| 2018/0301351 A1 | 10/2018 | Yu et al. |
| 2018/0301376 A1 | 10/2018 | Shih et al. |
| 2018/0350629 A1 | 12/2018 | Liu et al. |
| 2018/0350763 A1 | 12/2018 | Yu et al. |
| 2018/0358312 A1 | 12/2018 | Yu et al. |
| 2018/0374824 A1 | 12/2018 | Yu et al. |
| 2019/0013276 A1 | 1/2019 | Lee et al. |
| 2019/0019756 A1 | 1/2019 | Yu et al. |
| 2019/0020343 A1 | 1/2019 | Lin et al. |
| 2019/0051641 A1 | 2/2019 | Lin et al. |
| 2019/0057932 A1 | 2/2019 | Wu et al. |
| 2019/0097304 A1 | 3/2019 | Hsiao et al. |
| 2019/0129817 A1* | 5/2019 | Zhuo .................. G06F 11/2094 |
| 2019/0221547 A1 | 7/2019 | Drab et al. |
| 2019/0238134 A1 | 8/2019 | Lin et al. |
| 2019/0238135 A1 | 8/2019 | Lin et al. |
| 2019/0245543 A1 | 8/2019 | Lin et al. |
| 2019/0253056 A1 | 8/2019 | Lin et al. |
| 2019/0304803 A1 | 10/2019 | Hu et al. |
| 2019/0333871 A1 | 10/2019 | Chen et al. |
| 2019/0347790 A1 | 11/2019 | Lin et al. |
| 2019/0363715 A1 | 11/2019 | Lin et al. |
| 2019/0372574 A1 | 12/2019 | Lin et al. |
| 2020/0058617 A1 | 2/2020 | Wu et al. |
| 2020/0082885 A1 | 3/2020 | Lin et al. |
| 2020/0111734 A1 | 4/2020 | Lin et al. |
| 2020/0144224 A1 | 5/2020 | Lin et al. |
| 2020/0161242 A1 | 5/2020 | Lin et al. |
| 2020/0373215 A1 | 11/2020 | Wu et al. |
| 2021/0005592 A1 | 1/2021 | Lin et al. |
| 2021/0043557 A1 | 2/2021 | Lin et al. |

(56) References Cited

U.S. PATENT DOCUMENTS

2021/0050300 A1 2/2021 Lin et al.
2021/0090983 A1 3/2021 Lin et al.
2021/0232744 A1 7/2021 Lin et al.

FOREIGN PATENT DOCUMENTS

| CN | 104282650 | 1/2015 |
| CN | 105745752 | 7/2016 |
| CN | 104064556 | 4/2019 |
| WO | WO00/36748 | 6/2000 |
| WO | WO2005010976 | 2/2005 |
| WO | WO2016160063 | 10/2016 |

* cited by examiner

| A0 | A1 | Dout | |
|----|----|------|----|
| 0 | 0 | 1 | D0 |
| 0 | 1 | 1 | D1 |
| 1 | 0 | 1 | D2 |
| 1 | 1 | 0 | D3 |

Before reconfiguration

| $IU_{(n-1)}$ | $CPM_{(n-1)}$ | $L_{(n-1)}$ | $DIM_{(n-1)}$ |
|---|---|---|---|
| $IU_{(n-1)a}$ | $CPM_{(a,1,1)}$ | $L_{(n-1)a}$ | $DIM_{(a,1,1')}$, $DIM_{(a,2,2')}$ |
| $IU_{(n-1)b}$ | $CPM_{(b,2,2)}$, $CPM_{(b,3,3)}$ | $L_{(n-1)b}$ | $DIM_{(b,3,3')}$, $DIM_{(b,4,4')}$ |
| $IU_{(n-1)c}$ | $CPM_{(c,4,4)}$ | $L_{(n-1)c}$ | $DIM_{(c,5,5')}$, $DIM_{(c,6,6')}$, $DIM_{(c,7,6)}$ |

After reconfiguration

| $IUC_n$ | $CPMC_n$ | $LC_n$ | $DIMC_n$ |
|---|---|---|---|
| $IUC_{ne}$ | $CPMC_{(e,1,1)}$ | $LC_{ne}$ | $DIMC_{(e,1,1')}$, $DIMC_{(e,2,2')}$ |
| $IUC_{nf}$ | $CPMC_{(f,2,4)}$, $CPMC_{(f,3,5)}$ | $LC_{nf}$ | $DIMC_{(f,3,8')}$, $DIMC_{(f,4,9')}$, $DIMC_{(f,5,10')}$ |
| $IUC_{ng}$ | $CPMC_{(g,4,2)}$, $CPMC_{(g,5,5)}$ | $LC_{ng}$ | $DIMC_{(g,6,11')}$, $DIMC_{(g,8,5')}$ |
| $IUC_{nh}$ | $CPMC_{(h,6,6)}$ | $LC_{nh}$ | $DIMC_{(h,7,7')}$, $DIMC_{(h,9,6')}$ |

Fig. 23

LOGIC DRIVE USING STANDARD COMMODITY PROGRAMMABLE LOGIC IC CHIPS

PRIORITY CLAIM

This application is a continuation of application Ser. No. 16/835,287, filed Mar. 30, 2020, now pending, which is a continuation of application Ser. No. 16/275,272, filed Feb. 13, 2019, patent Ser. No. 10/623,000, which claims priority benefits from U.S. provisional application No. 62/630,369, filed on Feb. 14, 2018 and entitled "LOGIC DRIVE WITH BRAIN-LIKE PLASTICITY AND INTEGRALITY"; U.S. provisional application No. 62/675,785, filed on May 24, 2018 and entitled "LOGIC DRIVE WITH BRAIN-LIKE ELASTICITY AND INTEGRALITY"; U.S. provisional application No. 62/729,527, filed on Sep. 11, 2018 and entitled "LOGIC DRIVE WITH BRAIN-LIKE ELASTICITY AND INTEGRALITY USING STANDARD COMMODITY PROGRAMMABLE LOGIC IC CHIPS"; U.S. provisional application No. 62/741,513, filed on Oct. 4, 2018 and entitled "LOGIC DRIVE BASED ON STANDARDIZED COMMODITY PROGRAMMABLE LOGIC SEMICONDUCTOR IC CHIPS"; U.S. provisional application No. 62/755,415, filed on Nov. 2, 2018 and entitled "LOGIC DRIVE BASED ON STANDARDIZED COMMODITY PROGRAMMABLE LOGIC/MEMORY SEMICONDUCTOR IC CHIP SCALE PACKAGES"; and U.S. provisional application No. 62/768,978, filed on Nov. 18, 2018 and entitled "LOGIC DRIVE BASED ON STANDARDIZED COMMODITY PROGRAMMABLE LOGIC/MEMORY SEMICONDUCTOR IC CHIP SCALE PACKAGES". The present application incorporates the foregoing disclosures herein by reference.

BACKGROUND OF THE DISCLOSURE

Field of the Disclosure

The present invention relates to a logic package, logic package drive, logic device, logic module, logic drive, logic disk, logic disk drive, logic solid-state disk, logic solid-state drive, Field Programmable Gate Array (FPGA) logic disk, or FPGA logic drive (to be abbreviated as "logic drive" below, that is when "logic drive" is mentioned below, it means and reads as "logic package, logic package drive, logic device, logic module, logic drive, logic disk, logic disk drive, logic solid-state disk, logic solid-state drive, FPGA logic disk, or FPGA logic drive") comprising plural FPGA IC chips for field programming purposes, and more particularly to a standardized commodity logic drive formed by using plural standardized commodity FPGA IC chips comprising non-volatile random access memory cells, and to be used for different specific applications when field programmed or user programmed.

Brief Description of the Related Art

The Field Programmable Gate Array (FPGA) semiconductor integrated circuit (IC) has been used for development of new or innovated applications, or for small volume applications or business demands. When an application or business demand expands to a certain volume and extends to a certain time period, the semiconductor IC supplier may usually implement the application in an Application Specific IC (ASIC) chip, or a Customer-Owned Tooling (COT) IC chip. The switch from the FPGA design to the ASIC or COT design is because the current FPGA IC chip, for a given application and compared with an ASIC or COT chip, (1) has a larger semiconductor chip size, lower fabrication yield, and higher fabrication cost, (2) consumes more power, and (3) gives lower performance. When the semiconductor technology nodes or generations migrate, following the Moore's Law, to advanced nodes or generations (for example below 20 nm), the Non-Recurring Engineering (NRE) cost for designing an ASIC or COT chip increases greatly (more than US $5M or even exceeding US $10M, US $20M, US $50M or US $100M), FIG. 27. The cost of a photo mask set for an ASIC or COT chip at the 16 nm technology node or generation may be over US $1M, US $2M, US $3M, or US $5M. The high NRE cost in implementing the innovation and/or application using the advanced IC technology nodes or generations slows down or even stops the innovation and/or application using advanced and powerful semiconductor technology nodes or generations. A new approach or technology is needed to inspire the continuing innovation and to lower down the barrier for implementing the innovation in the semiconductor IC chips using the advanced and powerful semiconductor technology nodes or generations.

SUMMARY OF THE DISCLOSURE

One aspect of the disclosure provides a standardized commodity logic drive in a multi-chip package comprising plural FPGA IC chips and one or more non-volatile memory IC chips for use in different algorithms, architectures and/or applications requiring logic, computing and/or processing functions by field programming. Uses of the standardized commodity logic drive is analogues to uses of a standardized commodity data storage device or drive, for example, solid-state disk (drive), data storage hard disk (drive), data storage floppy disk, Universal Serial Bus (USB) flash drive, USB drive, USB stick, flash-disk, or USB memory, and differs in that the latter has memory functions for data storage, while the former has logic functions for processing and/or computing.

Another aspect of the disclosure provides a method to reduce Non-Recurring Engineering (NRE) expenses for implementing (i) an innovation, (ii) an innovation process or application, and/or (iii) accelerating workload processing or application in semiconductor IC chips by using the standardized commodity logic drive, FIG. 25. A person, user, or developer with an innovation and/or an application concept or idea or an aim for accelerating workload processing may purchase the standardized commodity logic drive and develop or write software codes or programs to load into the standardized commodity logic drive to implement his/her innovation and/or application concept or idea; wherein said innovation and/or application (maybe abbreviated as innovation below) comprises (i) innovative algorithms and/or architectures of computing, processing, learning and/or inferencing, and/or (ii) innovative and/or specific applications. The standard commodity logic drive comprises plural FPGA IC chips fabricated by using advanced technology nodes or generations more advanced than 20 nm or 10 nm. The innovation is implemented in the logic drive by changing the hardware of FPGA IC chips by altering the programming interconnection and LUTs therein. Compared to the implementation by developing a logic ASIC or COT IC chip, implementing the same or similar innovation and/or application using the logic drive may reduce the NRE cost down to smaller than US $1M by developing a software and installing it in the purchased or rented standard commodity logic drive. The aspect of the disclosure inspires the innovation and lowers the barrier for implementing the innovation in IC chips designed and fabricated using an advanced IC technology node or generation, for example, a technology node or generation more advanced than or below 20 nm or 10 nm.

Another aspect of the disclosure provides a "public innovation platform" by using logic drives for innovators to easily and cheaply implement or realize their innovation (algorithms, architectures and/or applications) in semiconductor IC chips fabricated using advanced IC technology nodes more advanced than 20 nm or 10 nm, and for example, using a technology node of 16 nm, 10 nm, 7 nm, 5 nm or 3 nm, FIG. 25. In early days, 1990's, innovators could implement their innovation (algorithms, architectures and/or applications) by designing IC chips and fabricate their designed IC chips in a semiconductor foundry fab using technology nodes at 1 μm, 0.8 μm, 0.5 μm, 0.35 μm, 0.18 μm or 0.13 μm, at a cost of about several hundred thousands of US dollars. The IC foundry fab was then the "public innovation platform". However, when IC technology nodes migrate to a technology node more advanced than 20 nm or 10 nm, and for example to the technology node of 16 nm, 10 nm, 7 nm, 5 nm or 3 nm, only a few giant system or IC design companies, not the public innovators, can afford to use the semiconductor IC foundry fab. It costs about or over 5 million US dollars to develop and implement an IC chip using these advanced technology nodes. The semiconductor IC foundry fab is now not "public innovation platform" anymore, it is "club innovation platform" for club innovators only. The concept of the disclosed logic drives, comprising standard commodity FPGA IC chips, provides public innovators "public innovation platform" back to semiconductor IC industry again; just as in 1990's. The innovators can implement or realize their innovation (algorithms, architectures and/or applications) by using logic drives (comprising FPGA IC chips fabricated using advanced than 20 nm or 10 nm technology nodes) and writing software programs in common programing languages, for example, C, Java, C++, C#, Scala, Swift, Matlab, Assembly Language, Pascal, Python, Visual Basic, PL/SQL or JavaScript languages, at a cost of less than 500K or 300K US dollars. The innovators can install their developed software using their own standard commodity logic drives or rented standard commodity logic drives in data centers or clouds through networks.

Another aspect of the disclosure provides a method to change the current logic ASIC or COT IC chip business into a commodity logic IC chip business, like the current commodity DRAM, or commodity NAND flash memory IC chip business, by using the standardized commodity logic drive. Since the performance, power consumption, and engineering and manufacturing costs of the standardized commodity logic drive may be better or equal to that of the ASIC or COT IC chip for a same innovation (algorithms, architectures and/or applications) or an aim for accelerating workload processing, the standardized commodity logic drive may be used as an alternative for designing an ASIC or COT IC chip. The current logic ASIC or COT IC chip design, manufacturing and/or product companies (including fabless IC design and product companies, IC foundry or contracted manufactures (may be product-less), and/or vertically-integrated IC design, manufacturing and product companies) may become companies like the current commodity DRAM, or NAND flash memory IC chip design, manufacturing, and/or product companies; or like the current DRAM module design, manufacturing, and/or product companies; or like the current flash memory module, flash USB stick or drive, or flash solid-state drive or disk drive design, manufacturing, and/or product companies.

Another aspect of the disclosure provides the standardized commodity logic drive, wherein a person, user, customer, or software developer, or algorithm/architecture/application developer may purchase the standardized commodity logic drive and write software codes to program the logic drive for his/her desired algorithms, architectures and/or applications, for example, in algorithms, architectures and/or applications of Artificial Intelligence (AI), machine learning, deep learning, big data, Internet Of Things (IOT), Virtual Reality (VR), Augmented Reality (AR), car electronics, Graphic Processing (GP), Digital Signal Processing (DSP), Micro Controlling (MC), and/or Central Processing (CP).

Another aspect of the disclosure provides a method to change the current logic ASIC or COT IC chip hardware business into a software business by using the standardized commodity logic drive. The current ASIC or COT IC chip design companies or suppliers may become software developers or suppliers; they may adapt the following business models: (1) become software companies to develop and sell/rent software for their innovation (algorithms, architectures and/or applications), and let their customers or users to install software in the customers' or users' own standard commodity logic drive. Alternatively, the software may be installed in the clouds or data centers and rented to users or customers; and/or (2) still hardware companies by selling hardware without performing ASIC or COT IC chip design and/or production. They may install their in-house developed software for the innovation (algorithms, architectures and/or applications) in one or plural non-volatile memory IC chip or chips in the purchased standard commodity logic drive; and sell the program-installed logic drive to their customers or users. They may write software codes into the standard commodity logic drive (that is, loading the software codes in the non-volatile memory IC chip or chips in or of the standardized commodity logic drive for their desired algorithms, architectures and/or applications.

Another aspect of the disclosure provides a method to change the current system design, manufactures and/or product business into a standard commodity system/product business, like current commodity DRAM, or flash memory business, by using the standardized commodity logic drive. The system, computer, processor, smart-phone, or electronic equipment or device may become a standard commodity hardware comprising mainly a standard commodity memory drive and a standard commodity logic drive. The memory drive may be a hard disk drive, a flash drive, a solid-state drive, or a memory drive packaged in a multichip package as the logic drive disclosed in this invention. The logic drive in the aspect of the disclosure may have big enough or adequate number of inputs/outputs (I/Os) to support I/O ports for used for programming all or most desired algorithms, architectures and/or applications, for example, in algorithms, architectures and/or applications of Artificial Intelligence (AI), machine learning, deep learning, big data, Internet Of Things (IOT), Virtual Reality (VR), Augmented Reality (AR), car electronics, Graphic Processing (GP), Digital Signal Processing (DSP), Micro Controlling (MC), and/or Central Processing (CP).

Another aspect of the disclosure provides a standard commodity FPGA IC chip for use in the standard commodity logic drive. The standard commodity FPGA IC chip is designed, implemented and fabricated using an advanced semiconductor technology node or generation, for example more advanced than or equal to, or below or equal to 20 nm or 10 nm, for example using the technology node of 16 nm, 14 nm, 12 nm, 10 nm, 7 nm, 5 nm or 3 nm. The manufacturing cost of the standard commodity FPGA IC chip can be reduced due to: (i) optimized chip size: Since the FPGA functions can be partitioned into several FPGA IC chips packaged in the logic drive, the FPGA chip size can be optimized for maximum manufacturing yield, therefore resulting in a minimum manufacturing cost; (ii) regular circuit arrays: All or most control and/or Input/Output (I/O) circuits or units (for example, the off-logic-drive I/O circuits, i.e., large I/O circuits, communicating with circuits or components external or outside of the logic drive) are outside of, or not included in, the standard commodity FPGA IC chip, but are included in another dedicated control chip or dedicated I/O chip packaged in the same logic drive. All or most area of the standard commodity FPGA IC chip is used for regular circuit arrays comprising logic gate arrays, computing units or operators, Look-Up-Tables (LUTs) and multiplexers, and/or programmable interconnection. For example, greater than 80%, 85%, 90%, 95% or 99% area (not counting the seal ring and the dicing area of the chip; that means, only including area up to the inner boundary of the seal ring) is used for the regular circuit arrays; or, all or most transistors of the standard commodity FPGA IC chip are used for the regular circuit arrays, for example, greater than 85%, 90%, 95% or 99% of the total number of transistors are used for the repetitive circuit arrays. A manufacture process can be tuned for the regular circuit arrays with a high manufacture yield and therefore reducing the manufacture costs.

Another aspect of the disclosure provides a method of circuit repair for a standard commodity FPGA IC chip for use in the standard commodity logic drive, wherein the method of the circuit repair increases the yield of the FPGA IC chip, therefore reducing the manufacture cost of the FPGA IC chip.

Another aspect of the disclosure provides the standard commodity logic drive in a multi-chip package comprising the standard commodity plural FPGA IC chips, for use in different algorithms, architectures and/or applications requiring logic, computing and/or processing functions by field programming, wherein the standard commodity plural FPGA IC chips, each is in a bare-die format or in a single-chip or multi-chip package. Each of standard commodity plural FPGA IC chips may have standard common features, counts or specifications: (1) logic blocks including (i) system gates with the count greater than or equal to 2M, 10M, 20M, 50M or 100M, (ii) logic cells or elements with the count greater than or equal to 64K, 128K, 512K, 1M, 4M or 8M, (iii) hard macros, for example DSP slices, microcontroller macros, multiplexer macros, fixed-wired adders, and/or fixed-wired multipliers and/or (iv) blocks of memory with the bit count equal to or greater than 1M, 10M, 50M, 100M, 200M or 500M bits; (2) the number of inputs to each of the logic blocks or operators: the number of inputs to each of the logic block or operator may be greater or equal to 4, 8, 16, 32, 64, 128, or 256; (3) the power supply voltage: the voltage may be between 0.1V and 2.5V, 0.1V and 2V, 0.1V and 1.5V, or 0.1V and 1V; (4) the I/O pads, in terms of layout, location, number and function. Since the FPGA chips are standard commodity IC chips, the number of FPGA chip designs or products for each technology node is reduced to a small number, therefore, the expensive photo masks or mask sets for fabricating the FPGA chips using advanced semiconductor nodes or generations are reduced to a few mask sets. For example, reduced down to between 3 and 20 mask sets, 3 and 10 mask sets, 3 and 5 mask sets, or 1 and 3 mask sets for a specific technology node or generation. The NRE and production expenses are therefore greatly reduced. With the few designs and products, the manufacturing processes may be tuned or optimized for the few chip designs or products, and resulting in very high manufacturing chip yields. This is similar to the current advanced standard commodity DRAM or NAND flash memory design and production. Furthermore, the chip inventory management becomes easy, efficient and effective; therefore, resulting in a shorter FPGA chip delivery time and becoming very cost-effective.

Another aspect of the disclosure provides the standard commodity logic drive in a multi-chip package comprising plural standard commodity FPGA IC chips and one or more non-volatile memory IC chips, for use in different algorithms, architectures and/or applications requiring logic, computing and/or processing functions by field programming, wherein the plural standard commodity FPGA IC chips, each is in a bare-die format or in a single-chip or multi-chip package format. The standard commodity logic drive may have standard common features, counts or specifications: (1) logic blocks including (i) system gates with the count greater than or equal to 8M, 40M, 80M, 200M or 400M, (ii) logic cells or elements with the count greater than or equal to 256K, 512K, 2M, 4M, 16M or 32M, (iii) hard macros, for example DSP slices, microcontroller macros, multiplexer macros, fixed-wired adders, and/or fixed-wired multipliers and/or (iv) blocks of memory with the bit count equal to or greater than 4M, 40M, 200M, 400M, 800M or 2 G bits; (2) the power supply voltage: the voltage may be between 0.1V and 12V, 0.1V and 7V, 0.1V and 3V, 0.1V and 2V, 0.1V and 1.5V, or 0.1V and 1V; (3) the I/O pads in the multi-chip package of the standard commodity logic drive, in terms of layout, location, number and function; wherein the logic drive may comprise the I/O pads, metal pillars or bumps connecting or coupling to one or multiple (2, 3, 4, or more than 4) Universal Serial Bus (USB) ports, one or more IEEE 1394 ports, one or more Ethernet ports, one or more audio ports or serial ports, for example, RS-232 or COM (communication) ports, wireless transceiver I/Os, and/or Bluetooth transceiver I/Os, and etc. Since the logic drives are standard commodity products, the product inventory management becomes easy, efficient and effective, therefore resulting in a shorter logic drive delivery time and becoming cost-effective.

Another aspect of the disclosure provides the standard commodity logic drive in a multi-chip package comprising plural standard commodity FPGA IC chips and one or more non-volatile memory IC chips, further comprising a dedicated control chip and/or a dedicated I/O chip, designed, implemented and fabricated using varieties of semiconductor technology nodes or generations, including old or matured technology nodes or generations, for example, less advanced than or equal to, or more mature than 20 nm or 30 nm, and for example using the technology node of 22 nm, 28 nm, 40 nm, 90 nm, 130 nm, 180 nm, 250 nm, 350 nm or 500 nm. The dedicated I/O chip comprises large I/O circuits (output capacitance larger than 2 pF) for communicating or coupling with external circuits of the logic drive, and a small I/O circuits (output capacitance smaller than 2 pF) for communicating or coupling with the FPGA chips in the logic drive.

Another aspect of the disclosure provides the logic drive in a multi-chip package comprising plural standard commodity FPGA IC chips, further comprising a processing and/or computing IC chip, for example, a Central Processing Unit (CPU) chip, a Graphic Processing Unit (GPU) chip, a Digital Signal Processing (DSP) chip, a Tensor Processing Unit (TPU) chip, and/or an Application Processing Unit (APU) chip.

Another aspect of the disclosure provides the logic drive in a multi-chip package comprising plural standard commodity FPGA IC chips, further comprising high speed, wide bit width, high bandwidth memory (HBM) SRAM or DRAM IC chips. The HBM IC chip may have a data bit width of equal to or greater than 64, 128, 256, 512, 1024, 2048, 4096, 8K, or 16K.

Another aspect of the disclosure provides the standard commodity logic drive in a multi-chip package comprising plural standard commodity FPGA IC chips and one or more non-volatile IC chips, for use in different applications requiring logic, computing and/or processing functions by field programming; wherein the one or more non-volatile memory IC chips comprises a NAND flash chip or chips, in a bare-die format or in a multi-chip flash package format. The standard commodity logic drive may have a standard non-volatile memory density, capacity or size of the logic drive is greater than or equal to 8 MB, 64 MB, 128 GB, 512 GB, 1 GB, 4 GB, 16 GB, 64 GB, 256 GB, or 512 GB, wherein "B" is bytes, each byte has 8 bits.

Another aspect of the disclosure provides a logic drive in a multi-chip package format further comprising an Innovated ASIC or COT (abbreviated as IAC below) chip for Intellectual Property (IP) circuits, Application Specific (AS) circuits, analog circuits, mixed-mode signal circuits, Radio-Frequency (RF) circuits, and/or transmitter, receiver, transceiver circuits, etc. The IAC chip is designed, implemented and fabricated using varieties of semiconductor technology nodes or generations, including old or matured technology nodes or generations, for example, less advanced than or equal to, or above or equal to 20 nm, 30 nm, 40 nm, 50 nm, 90 nm, 130 nm, 250 nm, 350 nm or 500 nm. Since the IAC chip in this aspect of disclosure may be designed and fabricated using older or less advanced technology nodes or generations, its NRE cost is cheaper than or less than that of the current or conventional ASIC or COT chip designed and fabricated using an advanced IC technology node or generation, for example, more advanced than or below 20 nm or 10 nm. Implementing the same or similar innovation or application using the logic drive including the IAC chip designed and fabricated using older or less advanced technology nodes or generations may reduce NRE cost down to less than US $3M or US $1M. Compared to the implementation by developing the current conventional logic ASIC or COT IC chip, the NRE cost of developing the IAC chip for the same or similar innovation or application may be reduced by a factor of larger than 2, 5, 10, 20, or 30.

Another aspect of the disclosure provides the standard commodity FPGA IC chip for use in the logic drive. The standard commodity FPGA chip is designed, implemented and fabricated using an advanced semiconductor technology node or generation, for example more advanced than or equal to, or below or equal to 20 nm or 10 nm. The standard commodity FPGA IC chips comprises a First Interconnection Scheme in, on or of the Chip (FISC) and a Second Interconnection Scheme in, on or of the Chip (SISC) on or over the FISC structure. The FISC is formed by processes comprising a damascene copper electroplating process, and the SISC is formed by processes comprising an embossing copper electroplating process.

Another aspect of the disclosure provides an interposer for flip-chip assembly or packaging in forming the multi-chip package of the logic drive. The multi-chip package is based on multiple-Chips-On-an-Interposer (COIP) flip-chip packaging method. The interposer or substrate in the COIP multi-chip package comprises: (1) high density interconnects for fan-out and interconnection between IC chips flip-chip-assembled, bonded or packaged on or over the interposer. The high density interconnects comprise a First Interconnection Scheme on or of the Interposer (FISIP) and/or a Second Interconnection Scheme on or of the Interposer (SISIP). The FISIP is formed by processes comprising a damascene copper electroplating process, and the SISIP is formed by processes comprising an embossing copper electroplating process. (2) micro metal pads, bumps or pillars on or over the high density interconnects, (3) Trough-Silicon-Vias (TSVs) in the interposer. The IC chips or packages to be flip-chip assembled, bonded or packaged, to the interposer include the chips or packages: the standard commodity FPGA chips, the non-volatile chips or packages, the dedicated control chip, the dedicated I/O chip, IAC, SRAM or DRAM HBM IC chips and/or processing and/or computing IC chip, for example CPU, GPU, DSP, TPU, or APU chip.

Another aspect of the disclosure provides a method for forming the logic drive in a COIP multi-chip package using an interposer comprising the FISIP, the SISIP, micro copper bumps or pillars and TSVs based on a flip-chip assembled multi-chip packaging technology and process.

Another aspect of the disclosure provides the standard commodity COIP multi-chips packaged logic drive. The standard commodity COIP logic drive may be in a shape of square or rectangle, with a certain standard widths, lengths and thicknesses. An industry standard may be set for the shape and dimensions of the logic drive. Furthermore, the metal bumps or pillars on or under the interposer in the logic drive may be in a standard footprint, for example, in an area array of M×N with a standard dimension of pitch and space between neighboring two metal bumps or pillars. The location of each metal bumps or pillars is also at a standard location.

Another aspect of the disclosure provides a method for forming a single-layer-packaged logic drive suitable for the stacked POP (Package-On-Package) assembling technology. The single-layer-packaged logic drive comprises a Backside metal Interconnection Scheme (abbreviated as BISD in below) at the backside of the single-layer-packaged logic drive and Through-Package-Vias, or Thought Polymer Vias (TPVs) in the gaps between chips in or of the logic drive, and/or in the peripheral area of the logic drive package and outside the edges of chips in or of the logic drive (the side with transistors of the IC chips are facing down).

Another aspect of the disclosure provides a method for forming a stacked logic driver using the single-layer-packaged logic drive with the BISD and TPVs.

Another aspect of the disclosure provides the logic drive in a multi-chip package format further comprising one or plural dedicated programmable interconnection IC (DPIIC) chip or chips. The DPIIC chip comprises 5T or 6T SRAM cells and cross-point switches, and is used for programming the interconnection between circuits or interconnections of the standard commodity FPGA chips. The 5T or 6T SRAM cells and cross-point switches on the DPIIC are used for programming interconnects of the FISIP and/or SISIP on the interposer. The programmable interconnects comprise interconnection metal lines or traces of the FISIP and/or SISIP between the standard commodity FPGA chips, with cross-point switch circuits in the middle of interconnection metal lines or traces of the FISIP and/or SISIP.

Another aspect of the disclosure provides the standardized commodity logic drive (for example, the single-layer-packaged logic drive) with a fixed design, layout or footprint of (i) the metal pads, pillars or bumps (copper pillars or bumps, solder bumps or gold bumps) on or under the TSVs of the interposer, and (ii) copper pads, copper pillars or solder bumps (on or over the BISD) on the backside (top side, the side with the transistors of IC chips are faced down) of the standard commodity logic drive. The standardized commodity logic drive may be used, customized for different applications by software coding or programming, using the programmable metal pads, pillars or bumps on or under the TSVs of the interposer, and/or using programmable copper pads, copper pillars or bumps, or solder bumps on or over the BISD (through programmable TPVs) for different applications.

Another aspect of the disclosure provides the logic drive, either in the single-layer-packaged or in a stacked format, comprising IC chips, logic blocks (comprising LUTs, cross-point switches, multiplexers, switch buffers, logic circuits, switch buffers, logic gates, and/or computing circuits) and/or memory cells or arrays, immersing in a super-rich interconnection scheme or environment. The logic blocks (comprising LUTs, cross-point switches, multiplexers, logic circuits, logic gates, and/or computing circuits) and/or memory cells or arrays of each of the multiple standard commodity FPGA IC chips (and/or other IC chips in the single-layer-packaged or in a stacked logic drive) are immersed in a programmable 3D Immersive IC Interconnection Environment (IIIE). The programmable 3D IIIE on, in, or of the logic driver package provides the super-rich interconnection scheme or environment based on (1) the programmable FISC, the SISC and micro copper pillars or bumps on, in or of the IC chips, (2) the programmable FISIP and/or SISIP, TPVs, micro copper pillars or bumps, and TSVs of the interposer or substrate, (3) programmable metal pads, pillars or bumps on or under the TSVs of the interposer, (4) the programmable BISD, and (5) programmable copper pads, copper pillars or bumps, or solder bumps on or over the BISD. The programmable capability of the above interconnects, vias and metal bumps are provided by the DPIIC chips and/or FPGA IC chips in the logic drive.

Another aspect of the disclosure provides the programmable 3D IIIE with similar or analogous connections, interconnection and/or functions of a human brain: (1) transistors and/or logic blocks (comprising, for example, logic gates, logic circuits, computing operators, computing circuits, LUTs, and/or cross-point switches) are similar or analogous to the neurons (cell bodies) or the nerve cells; (2) The interconnection schemes and/or structures of the logic drives are similar or analogous to the axons or dendrites connecting or coupling to the neurons (cell bodies) or the nerve cells.

Another aspect of the disclosure provides a reconfigurable elastic and/or integral architecture for system/machine computing or processing using integral and alterable memory units and logic units of the logic drive. The data or information stored in the Data or Information Memory (DIM) cells in the logic drive may be used to reconfigure, change or alter the Data or Information in the Configuration Programming Memory (CPM) cells, therefore reconfigure, change or alter the logic blocks in the FPGA IC chips of the logic drive.

Another aspect of the disclosure provides a standard commodity memory drive, package, package drive, device, module, disk, disk drive, solid-state disk, or solid-state drive (to be abbreviated as "drive" below, that is when "drive" is mentioned below, it means and reads as "drive, package, package drive, device, module, disk, disk drive, solid-state disk, or solid-state drive"), in a multi-chip package comprising plural standard commodity memory IC chips for use in data storage. The plural memory IC chips comprise NAND flash chips and/or DRAM chips, in a bare-die format or in a package format. The standard commodity memory drive is formed by the same processes as that for forming the logic drive. Alternatively, the plural non-volatile memory IC chips may comprise Non-Volatile Radom-Access-Memory (NVRAM) IC chips, in a bare-die format or in a package format. The NVRAM may be a Ferroelectric RAM (FRAM), Magnetoresistive RAM (MRAM), Resistive RAM (RRAM), or Phase-change RAM (PRAM).

These, as well as other components, steps, features, benefits, and advantages of the present application, will now become clear from a review of the following detailed description of illustrative embodiments, the accompanying drawings, and the claims.

BRIEF DESCRIPTION OF THE DRAWINGS

The drawings disclose illustrative embodiments of the present application. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same reference number or reference indicator appears in different drawings, it may refer to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings:

FIG. 23 shows two tables illustrating reconfiguration for a commodity standard logic drive in accordance with an embodiment of the present application.

Figure 1A:
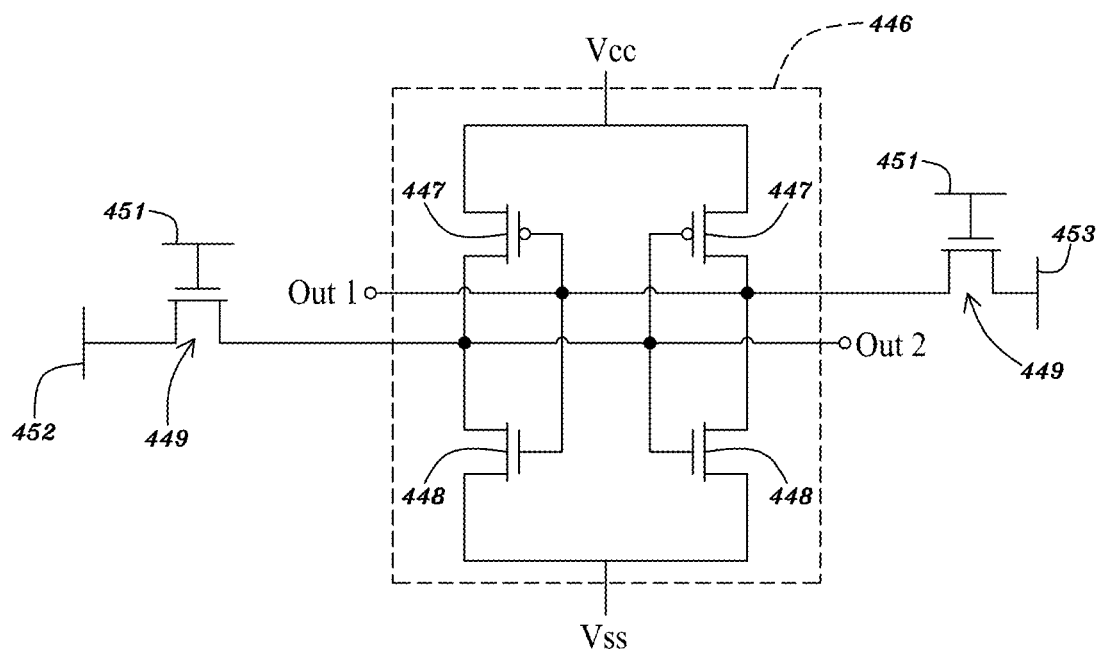
FIGS. 1A and 1B are circuit diagrams illustrating various types of memory cells in accordance with an embodiment of the present application.

While certain embodiments are depicted in the drawings, one skilled in the art will appreciate that the embodiments depicted are illustrative and that variations of those shown, as well as other embodiments described herein, may be envisioned and practiced within the scope of the present application.

DETAILED DESCRIPTION OF THE DISCLOSURE

Illustrative embodiments are now described. Other embodiments may be used in addition or instead. Details that may be apparent or unnecessary may be omitted to save space or for a more effective presentation. Conversely, some embodiments may be practiced without all of the details that are disclosed.

Specification for Static Random-Access Memory (SRAM) cells (1) First Type of SRAM Cell (6T SRAM Cell)

FIG. 1A is a circuit diagram illustrating a 6T SRAM cell in accordance with an embodiment of the present application. Referring to FIG. 1A, a first type of static random-access memory (SRAM) cell 398, i.e., 6T SRAM cell, may have a memory unit 446 composed of 4 data-latch transistors 447 and 448, that is, two pairs of a P-type MOS transistor 447 and N-type MOS transistor 448 both having respective drain terminals coupled to each other, respective gate terminals coupled to each other and respective source terminals coupled to the voltage Vcc of power supply and to the voltage Vss of ground reference. The gate terminals of the P-type and N-type MOS transistors 447 and 448 in the left pair are coupled to the drain terminals of the P-type and N-type MOS transistors 447 and 448 in the right pair, acting as an output Out1 of the memory unit 446. The gate terminals of the P-type and N-type MOS transistors 447 and 448 in the right pair are coupled to the drain terminals of the P-type and N-type MOS transistors 447 and 448 in the left pair, acting as an output Out2 of the memory unit 446.

Referring to FIG. 1A, the first type of SRAM cell 398 may further include two switches or transfer (write) transistor 449, such as N-type or P-type MOS transistors, a first one of which has a gate terminal coupled to a word line 451 and a channel having a terminal coupled to a bit line 452 and another terminal coupled to the drain terminals of the P-type and N-type MOS transistors 447 and 448 in the left pair and the gate terminals of the P-type and N-type MOS transistors 447 and 448 in the right pair, and a second one of which has a gate terminal coupled to the word line 451 and a channel having a terminal coupled to a bit-bar line 453 and another terminal coupled to the drain terminals of the P-type and N-type MOS transistors 447 and 448 in the right pair and the gate terminals of the P-type and N-type MOS transistors 447 and 448 in the left pair. A logic level on the bit line 452 is opposite a logic level on the bit-bar line 453. The switch 449 may be considered as a programming transistor for writing a programing code or data into storage nodes of the 4 data-latch transistors 447 and 448, i.e., at the drains and gates of the 4 data-latch transistors 447 and 448. The switches 449 may be controlled via the word line 451 to turn on connection from the bit line 452 to the drain terminals of the P-type and N-type MOS transistors 447 and 448 in the left pair and the gate terminals of the P-type and N-type MOS transistors 447 and 448 in the right pair via the channel of the first one of the switches 449, and thereby the logic level on the bit line 452 may be reloaded into the conductive line between the gate terminals of the P-type and N-type MOS transistors 447 and 448 in the right pair and the conductive line between the drain terminals of the P-type and N-type MOS transistors 447 and 448 in the left pair. Further, the bit-bar line 453 may be coupled to the drain terminals of the P-type and N-type MOS transistors 447 and 448 in the right pair and the gate terminals of the P-type and N-type MOS transistors 447 and 448 in the left pair via the channel of the second one of the switches 449, and thereby the logic level on the bit line 453 may be reloaded into the conductive line between the gate terminals of the P-type and N-type MOS transistors 447 and 448 in the left pair and the conductive line between the drain terminals of the P-type and N-type MOS transistors 447 and 448 in the right pair. Thus, the logic level on the bit line 452 may be registered or latched in the conductive line between the gate terminals of the P-type and N-type MOS transistors 447 and 448 in the right pair and in the conductive line between the drain terminals of the P-type and N-type MOS transistors 447 and 448 in the left pair; a logic level on the bit line 453 may be registered or latched in the conductive line between the gate terminals of the P-type and N-type MOS transistors 447 and 448 in the left pair and in the conductive line between the drain terminals of the P-type and N-type MOS transistors 447 and 448 in the right pair.

(2) Second Type of SRAM Cell (5T SRAM Cell)

Figure 1B:
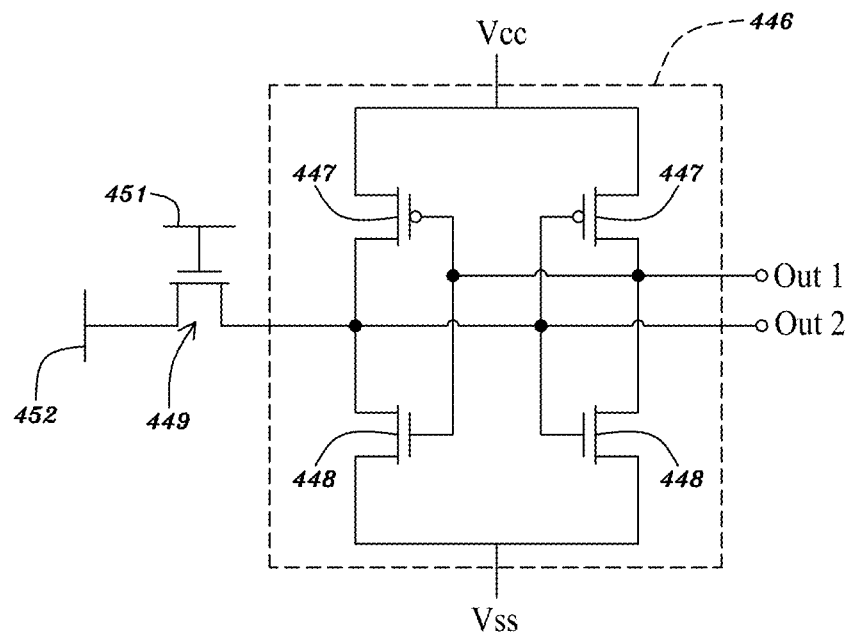

FIG. 1B is a circuit diagram illustrating a 5T SRAM cell in accordance with an embodiment of the present application. Referring to FIG. 1B, a second type of static random-access memory (SRAM) cell 398, i.e., 5T SRAM cell, may have the memory unit 446 as illustrated in FIG. 1A. The second type of static random-access memory (SRAM) cell 398 may further have a switch or transfer (write) transistor 449, such as N-type or P-type MOS transistor, having a gate terminal coupled to a word line 451 and a channel having a terminal coupled to a bit line 452 and another terminal coupled to the drain terminals of the P-type and N-type MOS transistors 447 and 448 in the left pair and the gate terminals of the P-type and N-type MOS transistors 447 and 448 in the right pair. The switch 449 may be considered as a programming transistor for writing a programing code or data into storage nodes of the 4 data-latch transistors 447 and 448, i.e., at the drains and gates of the 4 data-latch transistors 447 and 448. The switch 449 may be controlled via the word line 451 to turn on connection from the bit line 452 to the drain terminals of the P-type and N-type MOS transistors 447 and 448 in the left pair and the gate terminals of the P-type and N-type MOS transistors 447 and 448 in the right pair via the channel of the switch 449, and thereby a logic level on the bit line 452 may be reloaded into the conductive line between the gate terminals of the P-type and N-type MOS transistors 447 and 448 in the right pair and the conductive line between the drain terminals of the P-type and N-type MOS transistors 447 and 448 in the left pair. Thus, the logic level on the bit line 452 may be registered or latched in the conductive line between the gate terminals of the P-type and N-type MOS transistors 447 and 448 in the right pair and in the conductive line between the drain terminals of the P-type and N-type MOS transistors 447 and 448 in the left pair; a logic level, opposite to the logic level on the bit line 452, may be registered or latched in the conductive line between the gate terminals of the P-type and N-type MOS transistors 447 and 448 in the left pair and in the conductive line between the drain terminals of the P-type and N-type MOS transistors 447 and 448 in the right pair.

Specification for Pass/No-Pass Switches (1) First Type of Pass/No-Pass Switch

Figure 2C:
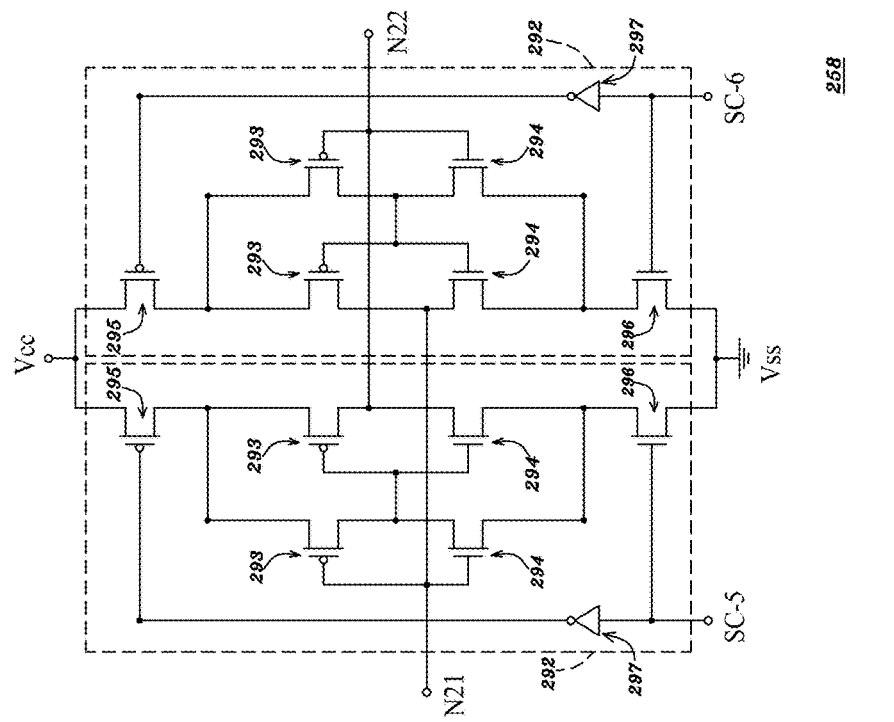
FIGS. 2A-2C are circuit diagrams illustrating various types of pass/no-pass switch in accordance with an embodiment of the present application.
Figure 2B:
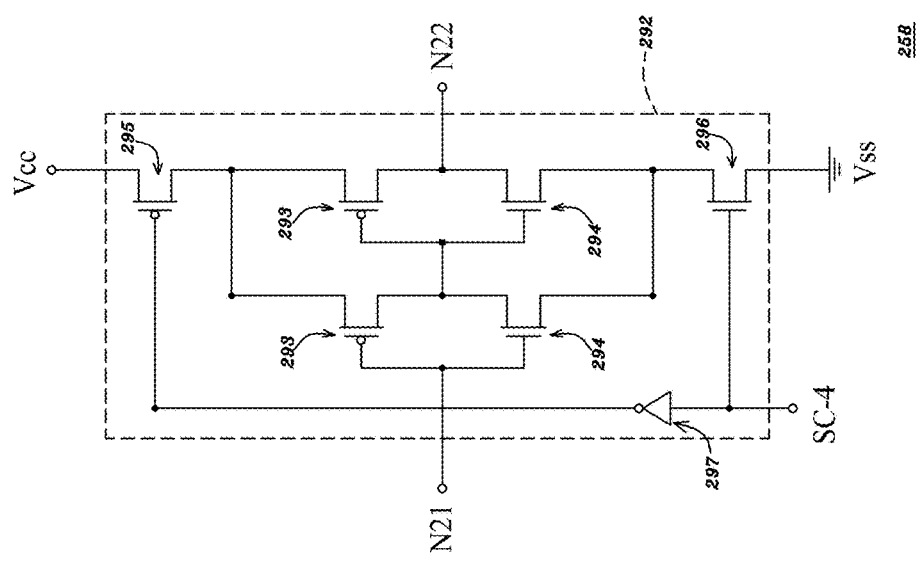
Figure 2A:
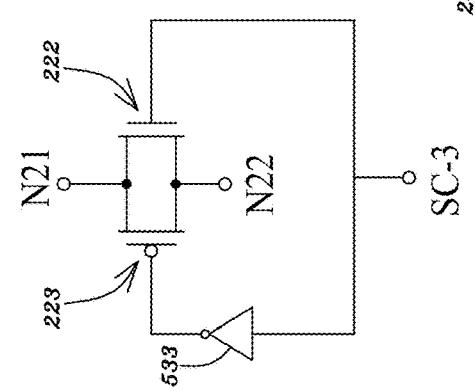

FIG. 2A is a circuit diagram illustrating a first type of pass/no-pass switch in accordance with an embodiment of the present application. Referring to FIG. 2A, a first type of pass/no-pass switch 258 may include an N-type metal-oxide-semiconductor (MOS) transistor 222 and a P-type metal-oxide-semiconductor (MOS) transistor 223 coupling in parallel to each other. Each of the N-type and P-type metal-oxide-semiconductor (MOS) transistors 222 and 223 of the pass/no-pass switch 258 of the first type may be provided with a channel having an end coupling to a node N21 and the other opposite end coupling to a node N22. Thereby, the first type of pass/no-pass switch 258 may be set to turn on or off connection between the nodes N21 and N22. The first type of pass/no-pass switch 258 may further include an inverter 533 configured to invert its input coupling to a gate terminal of the N-type MOS transistor 222 and a node SC-3 into its output coupling to a gate terminal of the P-type MOS transistor 223.

(2) Second Type of Pass/No-Pass Switch

FIG. 2B is a circuit diagram illustrating a second type of pass/no-pass switch in accordance with an embodiment of the present application. Referring to FIG. 2B, a second type of pass/no-pass switch 258 may be a multi-stage tri-state buffer 292, i.e., switch buffer, having a pair of a P-type MOS transistor 293 and N-type MOS transistor 294 in each stage, both having respective drain terminals coupling to each other and respective source terminals configured to couple to the voltage Vcc of power supply and to the voltage Vss of ground reference. In this case, the multi-stage tri-state buffer 292 is two-stage tri-state buffer, i.e., two-stage inverter buffer, having two pairs of the P-type MOS transistor 293 and N-type MOS transistor 294 in the two respective stages, i.e., first and second stages. A node N21 may couple to gate terminals of the P-type MOS and N-type MOS transistors 293 and 294 in the pair in the first stage. The drain terminals of the P-type MOS and N-type MOS transistors 293 and 294 in the pair in the first stage may couple to gate terminals of the P-type MOS and N-type MOS transistors 293 and 294 in the pair in the second stage, i.e., output stage. The drain terminals of the P-type MOS and N-type MOS transistors 293 and 294 in the pair in the second stage, i.e., output stage, may couple to a node N22.

Referring to FIG. 2B, the multi-stage tri-state buffer 292 may further include a switching mechanism configured to enable or disable the multi-stage tri-state buffer 292, wherein the switching mechanism may be composed of (1) a control P-type MOS transistor 295 having a source terminal coupling to the voltage Vcc of power supply and a drain terminal coupling to the source terminals of the P-type MOS transistors 293 in the first and second stages, (2) a control N-type MOS transistor 296 having a source terminal coupling to the voltage Vss of ground reference and a drain terminal coupling to the source terminals of the N-type MOS transistors 294 in the first and second stages and (3) an inverter 297 configured to invert its input coupling to a gate terminal of the control N-type MOS transistor 296 and a node SC-4 into its output coupling to a gate terminal of the control P-type MOS transistor 295.

For example, referring to FIG. 2B, when a logic level of "1" couples to the node SC-4 to turn on the multi-stage tri-state buffer 292, a signal may be transmitted from the node N21 to the node N22. When a logic level of "0" couples to the node SC-4 to turn off the multi-stage tri-state buffer 292, no signal transmission may occur between the nodes N21 and N22.

(3) Third Type of Pass/No-Pass Switch

FIG. 2C is a circuit diagram illustrating a third type of pass/no-pass switch in accordance with an embodiment of the present application. For an element indicated by the same reference number shown in FIGS. 2B and 2C, the specification of the element as seen in FIG. 2C may be referred to that of the element as illustrated in FIG. 2B. Referring to FIG. 2C, a third type of pass/no-pass switch 258 may include a pair of the multi-stage tri-state buffers 292, i.e., switch buffers, as illustrated in FIG. 2B. The gate terminals of the P-type and N-type MOS transistors 293 and 294 in the first stage in the left one of the multi-stage tri-state buffers 292 in the pair may couple to the drain terminals of the P-type and N-type MOS transistors 293 and 294 in the second stage, i.e., output stage, in the right one of the multi-stage tri-state buffers 292 in the pair and to a node N21. The gate terminals of the P-type and N-type MOS transistors 293 and 294 in the first stage in the right one of the multi-stage tri-state buffers 292 in the pair may couple to the drain terminals of the P-type and N-type MOS transistors 293 and 294 in the second stage, i.e., output stage, in the left one of the multi-stage tri-state buffers 292 in the pair and to a node N22. For the left one of the multi-stage tri-state buffers 292 in the pair, its inverter 297 is configured to invert its input coupling to the gate terminal of its control N-type MOS transistor 296 and a node SC-5 into its output coupling to the gate terminal of its control P-type MOS transistor 295. For the right one of the multi-stage tri-state buffers 292 in the pair, its inverter 297 is configured to invert its input coupling to the gate terminal of its control N-type MOS transistor 296 and a node SC-6 into its output coupling to the gate terminal of its control P-type MOS transistor 295.

For example, referring to FIG. 2C, when a logic level of "1" couples to the node SC-5 to turn on the left one of the multi-stage tri-state buffers 292 in the pair and a logic level of "0" couples to the node SC-6 to turn off the right one of the multi-stage tri-state buffers 292 in the pair, a signal may be transmitted from the node N21 to the node N22. When a logic level of "0" couples to the node SC-5 to turn off the left one of the multi-stage tri-state buffers 292 in the pair and a logic level of "1" couples to the node SC-6 to turn on the right one of the multi-stage tri-state buffers 292 in the pair, a signal may be transmitted from the node N22 to the node N21. When a logic level of "0" couples to the node SC-5 to turn off the left one of the multi-stage tri-state buffers 292 in the pair and a logic level of "0" couples to the node SC-6 to turn off the right one of the multi-stage tri-state buffers 292 in the pair, no signal transmission may occur between the nodes N21 and N22. When a logic level of "1" couples to the node SC-5 to turn on the left one of the multi-stage tri-state buffers 292 in the pair and a logic level of "1" couples to the node SC-6 to turn on the right one of the multi-stage tri-state buffers 292 in the pair, signal transmission may occur in either of directions from the node N21 to the node N22 and from the node N22 to the node N21.

Figure 3A:
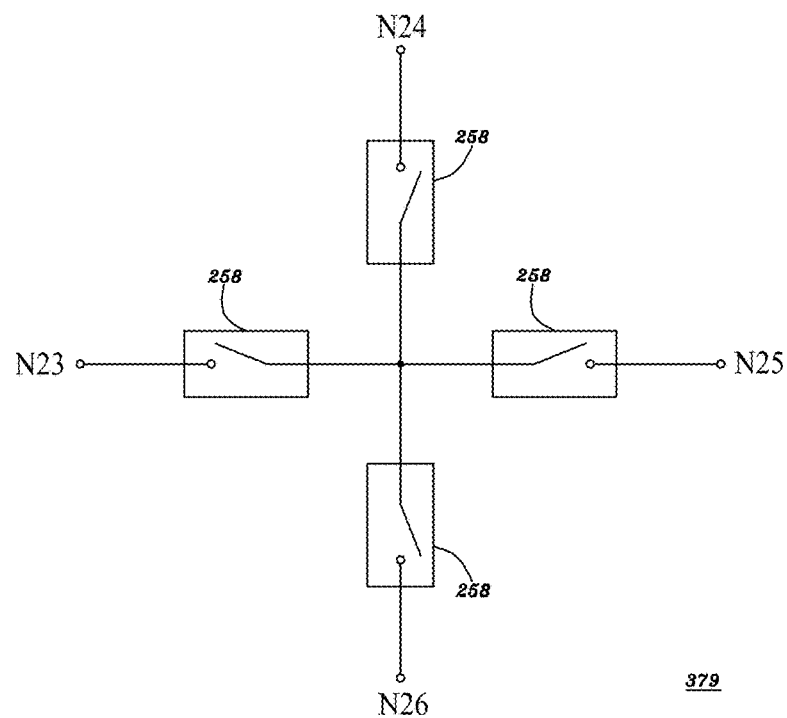
FIGS. 3A and 3B are circuit diagrams illustrating various types of cross-point switches in accordance with an embodiment of the present application.

Specification for Cross-Point Switches Constructed from Pass/No-Pass Switches (1) First Type of Cross-Point Switch FIG. 3A is a circuit diagram illustrating a first type of cross-point switch composed of four pass/no-pass switches in accordance with an embodiment of the present application. Referring to FIG. 3A, four pass/no-pass switches 258, each of which may be one of the first and third types of pass/no-pass switches 258 as illustrated in FIGS. 2A and 2C respectively, may compose a first type of cross-point switch 379. The first type of cross-point switch 379 may have four terminals N23-N26 each configured to be switched to couple to another one of its four terminals N23-N26 via two of its four pass/no-pass switches 258. The first type of cross-point switch 379 may have a central node configured to couple to its four terminals N23-N26 via its four respective pass/no-pass switches 258. Each of the pass/no-pass switches 258 may have one of its nodes N21 and N22 coupling to one of the four terminals N23-N26 and the other one of its nodes N21 and N22 coupling to the central node of the cross-point switch 379 of the first type. For example, the first type of cross-point switch 379 may have its terminal N23 configured to be switched to couple to its terminal N24 via left and top ones of its four pass/no-pass switches 258, to its terminal N25 via left and right ones of its four pass/no-pass switches 258 and/or to its terminal N26 via left and bottom ones of its four pass/no-pass switches 258.

(2) Second Type of Cross-Point Switch

Figure 3B:
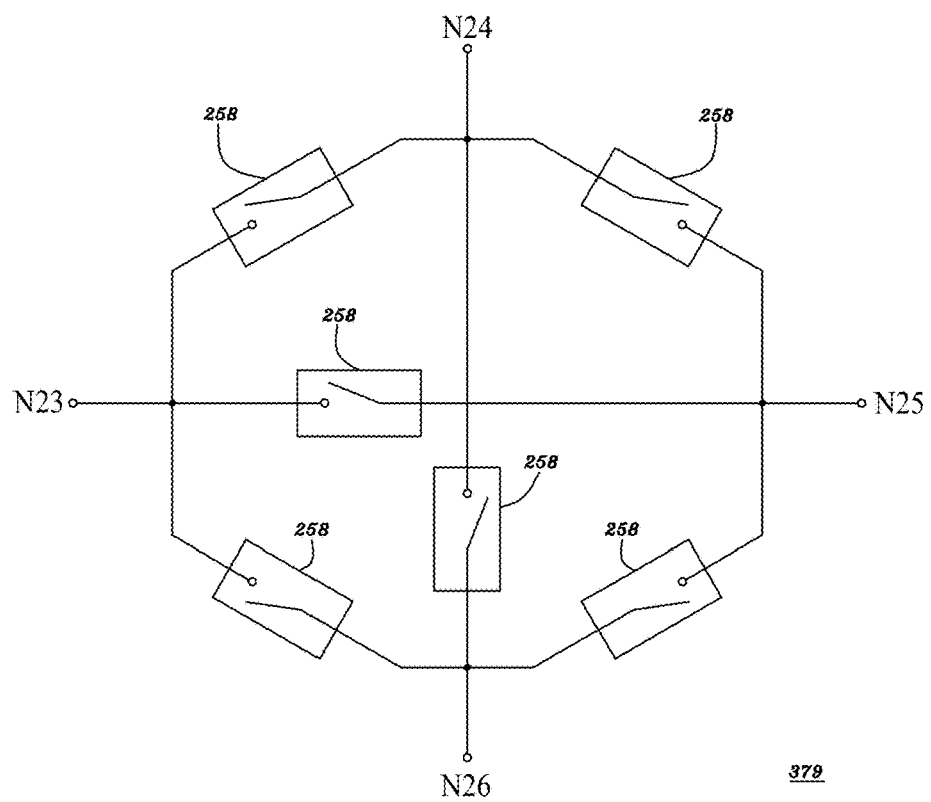

FIG. 3B is a circuit diagram illustrating a second type of cross-point switch composed of six pass/no-pass switches in accordance with an embodiment of the present application. Referring to FIG. 3B, six pass/no-pass switches 258, each of which may be one of the first and three types of pass/no-pass switches as illustrated in FIGS. 2A and 2C respectively, may compose a second type of cross-point switch 379. The second type of cross-point switch 379 may have four terminals N23-N26 each configured to be switched to couple to another one of its four terminals N23-N26 via one of its six pass/no-pass switches 258. Each of the pass/no-pass switches 258 may have one of its nodes N21 and N22 coupling to one of the four terminals N23-N26 and the other one of its nodes N21 and N22 coupling to another one of the four terminals N23-N26. For example, the second type of cross-point switch 379 may have its terminal N23 configured to be switched to couple to its terminal N24 via a first one of its six pass/no-pass switches 258 between its terminals N23 and N24, to its terminal N25 via a second one of its six pass/no-pass switches 258 between its terminals N23 and N25 and/or to its terminal N26 via a third one of its six pass/no-pass switches 258 between its terminals N23 and N26.

Specification for Multiplexer (MUXER)

Figure 4:
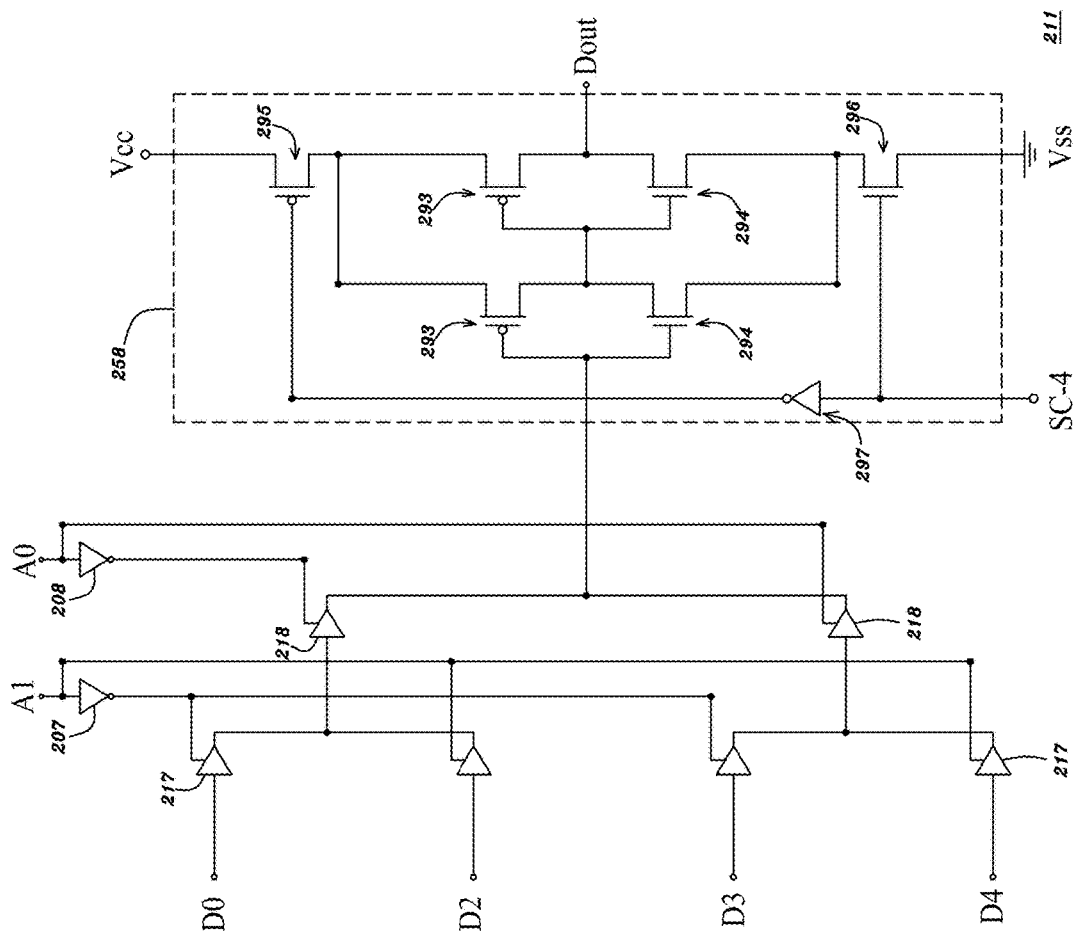
FIG. 4 is a circuit diagram illustrating a multiplexer in accordance with an embodiment of the present application.

FIG. 4 is a circuit diagram illustrating a multiplexer in accordance with an embodiment of the present application. Referring to FIG. 4, a multiplexer (MUXER) 211 may select one from its first set of inputs arranged in parallel into its output based on a combination of its second set of inputs arranged in parallel. For example, the multiplexer (MUXER) 211 may have four inputs D0-D3 arranged in parallel to act as its first set of inputs and two inputs A0-A1 arranged in parallel to act as its second set of inputs. The multiplexer (MUXER) 211 may select one from its first set of four inputs D0-D3 into its output Dout based on a combination of its second set of four inputs A0-A1.

Referring to FIG. 4, the multiplexer 211 may include multiple stages of switch buffers, e.g., two stages of switch buffers 217 and 218, coupling to each other or one another stage by stage. For more elaboration, the multiplexer 211 may include four switch buffers 217 in two pairs in the first stage, i.e., input stage, arranged in parallel, each having a first input coupling to one of the four inputs D0-D3 in the first set and a second input associated with the input A1 in the second set. Each of the four switch buffers 217 in the first stage may be switched on or off to pass or not to pass its first input into its output in accordance with its second input. The multiplexer 211 may include an inverter 207 configured to invert its input coupling to the input A1 in the second set into its output. One of the switch buffers 217 in each pair in the first stage may be switched on in accordance with its second input coupling to one of the input and output of the inverter 207 to pass its first input into its output; the other one of the switch buffers 217 in said each pair in the first stage may be switched off in accordance with its second input coupling to the other one of the input and output of the inverter 207 not to pass its first input into its output. The outputs of the switch buffers 217 in said each pair in the first stage may couple to each other. For example, a top one of the switch buffers 217 in a top pair in the first stage may have its first input coupling to the input D0 in the first set and its second input coupling to the output of the inverter 207; a bottom one of the switch buffers 217 in the top pair in the first stage may have its first input coupling to the input D1 in the first set and its second input coupling to the input of the inverter 207. The top one of the switch buffers 217 in the top pair in the first stage may be switched on in accordance with its second input to pass its first input into its output; the bottom one of the switch buffers 217 in the top pair in the first stage may be switched off in accordance with its second input not to pass its first input into its output. Thereby, each of the two pairs of switch buffers 217 in the first stage may be switched in accordance with its two second inputs coupling to the input and output of the inverter 207 respectively to pass one of its two first inputs into its output coupling to a first input of one of the switch buffers 218 in the second stage, i.e., output stage.

Referring to FIG. 2, the multiplexer 211 may include a pair of two switch buffers 218 in the second stage, i.e., output stage, arranged in parallel, each having a first input coupling to the output of one of the two pairs of switch buffers 217 in the first stage and a second input associated with the input A0 in the second set. Each of the two switch buffers 218 in the pair in the second stage, i.e., output stage, may be switched on or off to pass or not to pass its first input into its output in accordance with its second input. The multiplexer 211 may include an inverter 208 configured to invert its input coupling to the input A0 in the second set into its output. One of the two switch buffers 218 in the pair in the second stage, i.e., output stage, may be switched on in accordance with its second input coupling to one of the input and output of the inverter 208 to pass its first input into its output; the other one of the two switch buffers 218 in the pair in the fourth stage, i.e., output stage, may be switched off in accordance with its second input coupling to the other one of the input and output of the inverter 208 not to pass its first input into its output. The outputs of the two switch buffers 218 in the pair in the second stage, i.e., output stage, may couple to each other. For example, a top one of the two switch buffers 218 in the pair in the second stage, i.e., output stage, may have its first input coupling to the output of the top one of the two pairs of switch buffers 217 in the first stage and its second input coupling to the output of the inverter 208; a bottom one of the two switch buffers 218 in the pair in the second stage, i.e., output stage, may have its first input coupling to the output of the bottom one of the two pairs of switch buffers 217 in the first stage and its second input coupling to the input of the inverter 208. The top one of the two switch buffers 218 in the pair in the second stage, i.e., output stage, may be switched on in accordance with its second input to pass its first input into its output; the bottom one of the two switch buffers 218 in the pair in the second stage, i.e., output stage, may be switched off in accordance with its second input not to pass its first input into its output.

Referring to FIG. 4, the multiplexer 211 may further include the second type of pass/no-pass switch or switch buffer 292 as seen in FIG. 2B having its input at the node N21 coupling to the output of the pair of switch buffers 218 in the last stage, e.g., in the second stage or output stage in this case. For an element indicated by the same reference number shown in FIGS. 2B and 4, the specification of the element as seen in FIG. 4 may be referred to that of the element as illustrated in FIG. 2B. Accordingly, referring to FIG. 4, the second type of pass/no-pass switch 292 may amplify its input at the node N21 into its output at the node N22 acting as an output Dout of the multiplexer 211. The multiplexer (MUXER) 211 may select one from its first set of four inputs D0-D3 into its output Dout based on a combination of its second set of two inputs A0 and A1.

Specification for Large I/O Circuits

Figure 5A:
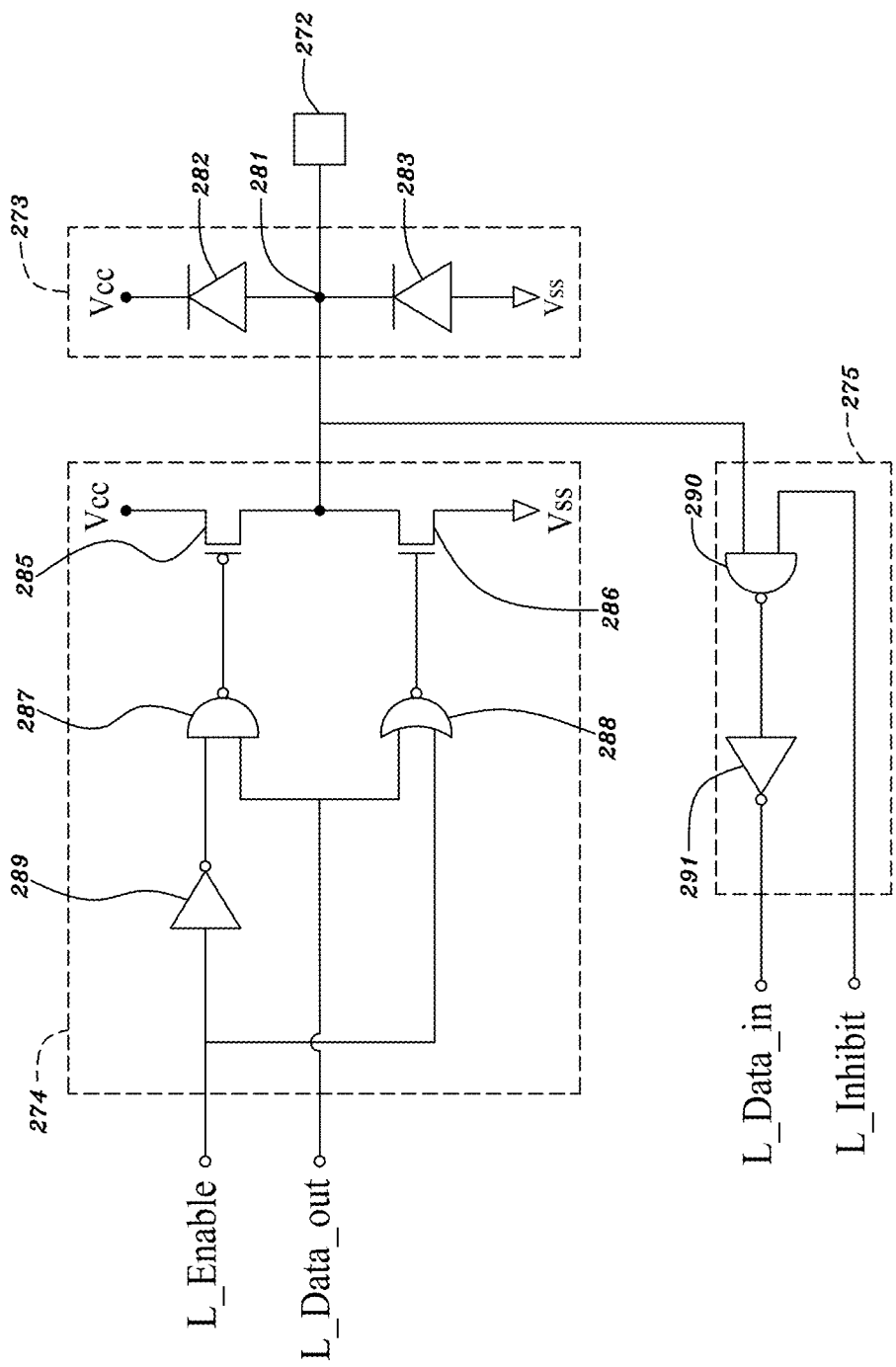
FIG. 5A is a circuit diagram of a large I/O circuit in accordance with an embodiment of the present application.

FIG. 5A is a circuit diagram of a large I/O circuit in accordance with an embodiment of the present application. Referring to FIG. 5A, a semiconductor chip may include multiple I/O pads 272 each coupling to its large ESD protection circuit or device 273, its large driver 274 and its large receiver 275. The large driver 274, large receiver 275 and large ESD protection circuit or device 273 may compose a large I/O circuit 341. The large ESD protection circuit or device 273 may include a diode 282 having a cathode coupling to the voltage Vcc of power supply and an anode coupling to a node 281 and a diode 283 having a cathode coupling to the node 281 and an anode coupling to the voltage Vss of ground reference. The node 281 couples to one of the I/O pads 272.

Referring to FIG. 5A, the large driver 274 may have a first input coupling to an L_Enable signal for enabling the large driver 274 and a second input coupling to data of L_Data_out for amplifying or driving the data of L_Data_out into its output at the node 281 to be transmitted to circuits outside the semiconductor chip through said one of the I/O pads 272. The large driver 274 may include a P-type MOS transistor 285 and N-type MOS transistor 286 both having respective drain terminals coupling to each other as its output at the node 281 and respective source terminals coupling to the voltage Vcc of power supply and to the voltage Vss of ground reference. The large driver 274 may have a NAND gate 287 having an output coupling to a gate terminal of the P-type MOS transistor 285 and a NOR gate 288 having an output coupling to a gate terminal of the N-type MOS transistor 286. The large driver 274 may include the NAND gate 287 having a first input coupling to an output of its inverter 289 and a second input coupling to the data of L_Data_out to perform a NAND operation on its first and second inputs into its output coupling to a gate terminal of its P-type MOS transistor 285. The large driver 274 may include the NOR gate 288 having a first input coupling to the data of L_Data_out and a second input coupling to the L_Enable signal to perform a NOR operation on its first and second inputs into its output coupling to a gate terminal of the N-type MOS transistor 286. The inverter 289 may be configured to invert its input coupling to the L_Enable signal into its output coupling to the first input of the NAND gate 287.

Referring to FIG. 5A, when the L_Enable signal is at a logic level of "1", the output of the NAND gate 287 is always at a logic level of "1" to turn off the P-type MOS transistor 285 and the output of the NOR gate 288 is always at a logic level of "0" to turn off the N-type MOS transistor 286. Thereby, the large driver 274 may be disabled by the L_Enable signal and the data of L_Data_out may not be passed to the output of the large driver 274 at the node 281.

Referring to FIG. 5A, the large driver 274 may be enabled when the L_Enable signal is at a logic level of "0". Meanwhile, if the data of L_Data_out is at a logic level of "0", the outputs of the NAND and NOR gates 287 and 288 are at logic level of "1" to turn off the P-type MOS transistor 285 and on the N-type MOS transistor 286, and thereby the output of the large driver 274 at the node 281 is at a logic level of "0" to be passed to said one of the I/O pads 272. If the data of L_Data_out is at a logic level of "1", the outputs of the NAND and NOR gates 287 and 288 are at logic level of "0" to turn on the P-type MOS transistor 285 and off the N-type MOS transistor 286, and thereby the output of the large driver 274 at the node 281 is at a logic level of "1" to be passed to said one of the I/O pads 272. Accordingly, the large driver 274 may be enabled by the L_Enable signal to amplify or drive the data of L_Data_out into its output at the node 281 coupling to one of the I/O pads 272.

Referring to FIG. 5A, the large receiver 275 may have a first input coupling to said one of the I/O pads 272 to be amplified or driven by the large receiver 275 into its output of L_Data_in and a second input coupling to an L_Inhibit signal to inhibit the large receiver 275 from generating its output of L_Data_in associated with data at its first input. The large receiver 275 may include a NAND gate 290 having a first input coupling to said one of the I/O pads 272 and a second input coupling to the L_Inhibit signal to perform a NAND operation on its first and second inputs into its output coupling to its inverter 291. The inverter 291 may be configured to invert its input coupling to the output of the NAND gate 290 into its output acting as the output of L_Data_in of the large receiver 275.

Referring to FIG. 5A, when the L_Inhibit signal is at a logic level of "0", the output of the NAND gate 290 is always at a logic level of "1" and the output L_Data_in of the large receiver 275 is always at a logic level of "0". Thereby, the large receiver 275 is inhibited from generating its output of L_Data_in associated with its first input at said one of the I/O pads 272.

Referring to FIG. 5A, the large receiver 275 may be activated when the L_Inhibit signal is at a logic level of "1". Meanwhile, if data from circuits outside the chip to said one of the I/O pads 272 is at a logic level of "1", the NAND gate 290 has its output at a logic level of "0", and thereby the large receiver 275 may have its output of L_Data_in at a logic level of "1". If data from circuits outside the chip to said one of the I/O pads 272 is at a logic level of "0", the NAND gate 290 has its output at a logic level of "1", and thereby the large receiver 275 may have its output of L_Data_in at a logic level of "0". Accordingly, the large receiver 275 may be activated by the L_Inhibit signal to amplify or drive data from circuits outside the chip to said one of the I/O pads 272 into its output of L_Data_in.

Referring to FIG. 5A, the large driver 274 may have an output capacitance or driving capability or loading, for example, between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF. The output capacitance of the large driver 274 can be used as driving capability of the large driver 274, which is the maximum loading at the output of the large driver 274, measured from said one of the I/O pads 272 to loading circuits external of said one of the I/O pads 272. The size of the large ESD protection circuit or device 273 may be between 0.1 pF and 3 pF or between 0.1 pF and 1 pF, or larger than 0.1 pF. Said one of the I/O pads 272 may have an input capacitance, provided by the large ESD protection circuit or device 273 and large receiver 275 for example, between 0.15 pF and 4 pF or between 0.15 pF and 2 pF, or greater than 0.15 pF. The input capacitance is measured from said one of the I/O pads 272 to circuits internal of said one of the I/O pads 272.

Specification for Small I/O Circuits

Figure 5B:
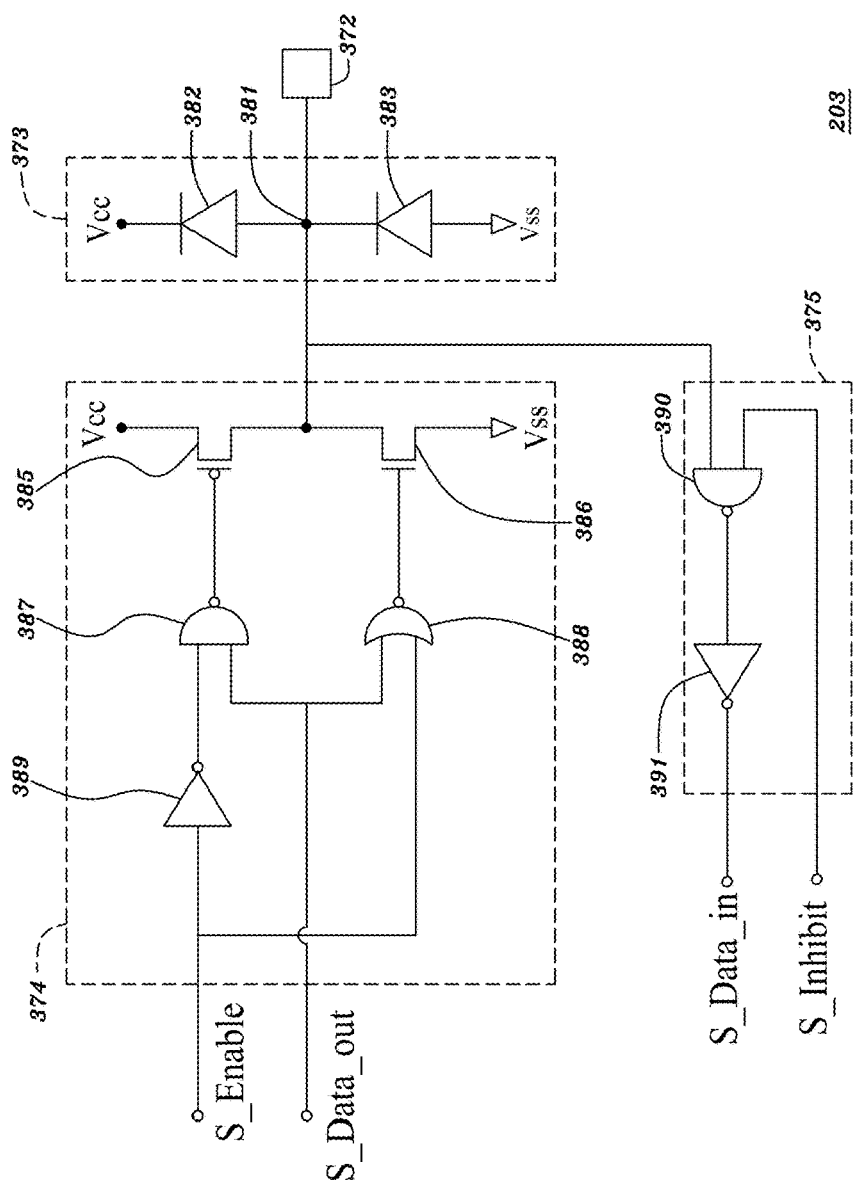
FIG. 5B is a circuit diagram of a small I/O circuit in accordance with an embodiment of the present application.

FIG. 5B is a circuit diagram of a small I/O circuit in accordance with an embodiment of the present application. Referring to FIG. 5B, a semiconductor chip may include multiple I/O pads 372 each coupling to its small ESD protection circuit or device 373, its small driver 374 and its small receiver 375. The small driver 374, small receiver 375 and small ESD protection circuit or device 373 may compose a small I/O circuit 203. The small ESD protection circuit or device 373 may include a diode 382 having a cathode coupling to the voltage Vcc of power supply and an anode coupling to a node 381 and a diode 383 having a cathode coupling to the node 381 and an anode coupling to the voltage Vss of ground reference. The node 381 couples to one of the I/O pads 372.

Referring to FIG. 5B, the small driver 374 may have a first input coupling to an S_Enable signal for enabling the small driver 374 and a second input coupling to data of S_Data_out for amplifying or driving the data of S_Data_out into its output at the node 381 to be transmitted to circuits outside the semiconductor chip through said one of the I/O pads 372. The small driver 374 may include a P-type MOS transistor 385 and N-type MOS transistor 386 both having respective drain terminals coupling to each other as its output at the node 381 and respective source terminals coupling to the voltage Vcc of power supply and to the voltage Vss of ground reference. The small driver 374 may have a NAND gate 387 having an output coupling to a gate terminal of the P-type MOS transistor 385 and a NOR gate 388 having an output coupling to a gate terminal of the N-type MOS transistor 386. The small driver 374 may include the NAND gate 387 having a first input coupling to an output of its inverter 389 and a second input coupling to the data of S_Data_out to perform a NAND operation on its first and second inputs into its output coupling to a gate terminal of its P-type MOS transistor 385. The small driver 374 may include the NOR gate 388 having a first input coupling to the data of S_Data_out and a second input coupling to the S_Enable signal to perform a NOR operation on its first and second inputs into its output coupling to a gate terminal of the N-type MOS transistor 386. The inverter 389 may be configured to invert its input coupling to the S_Enable signal into its output coupling to the first input of the NAND gate 387.

Referring to FIG. 5B, when the S_Enable signal is at a logic level of "1", the output of the NAND gate 387 is always at a logic level of "1" to turn off the P-type MOS transistor 385 and the output of the NOR gate 388 is always at a logic level of "0" to turn off the N-type MOS transistor 386. Thereby, the small driver 374 may be disabled by the S_Enable signal and the data of S_Data_out may not be passed to the output of the small driver 374 at the node 381.

Referring to FIG. 5B, the small driver 374 may be enabled when the S_Enable signal is at a logic level of "0". Meanwhile, if the data of S_Data_out is at a logic level of "0", the outputs of the NAND and NOR gates 387 and 388 are at logic level of "1" to turn off the P-type MOS transistor 385 and on the N-type MOS transistor 386, and thereby the output of the small driver 374 at the node 381 is at a logic level of "0" to be passed to said one of the I/O pads 372. If the data of S_Data_out is at a logic level of "1", the outputs of the NAND and NOR gates 387 and 388 are at logic level of "0" to turn on the P-type MOS transistor 385 and off the N-type MOS transistor 386, and thereby the output of the small driver 374 at the node 381 is at a logic level of "1" to be passed to said one of the I/O pads 372. Accordingly, the small driver 374 may be enabled by the S_Enable signal to amplify or drive the data of S_Data_out into its output at the node 381 coupling to one of the I/O pads 372.

Referring to FIG. 5B, the small receiver 375 may have a first input coupling to said one of the I/O pads 372 to be amplified or driven by the small receiver 375 into its output of S_Data_in and a second input coupling to an S_Inhibit signal to inhibit the small receiver 375 from generating its output of S_Data_in associated with its first input. The small receiver 375 may include a NAND gate 390 having a first input coupling to said one of the I/O pads 372 and a second input coupling to the S_Inhibit signal to perform a NAND operation on its first and second inputs into its output coupling to its inverter 391. The inverter 391 may be configured to invert its input coupling to the output of the NAND gate 390 into its output acting as the output of S_Data_in of the small receiver 375.

Referring to FIG. 5B, when the S_Inhibit signal is at a logic level of "0", the output of the NAND gate 390 is always at a logic level of "1" and the output S_Data_in of the small receiver 375 is always at a logic level of "0". Thereby, the small receiver 375 is inhibited from generating its output of S_Data_in associated with its first input at said one of the I/O pads 372.

Referring to FIG. 5B, the small receiver 375 may be activated when the S_Inhibit signal is at a logic level of "1". Meanwhile, if data from circuits outside the semiconductor chip to said one of the I/O pads 372 is at a logic level of "1", the NAND gate 390 has its output at a logic level of "0", and thereby the small receiver 375 may have its output of S_Data_in at a logic level of "1". If data from circuits outside the chip to said one of the I/O pads 372 is at a logic level of "0", the NAND gate 390 has its output at a logic level of "1", and thereby the small receiver 375 may have its output of S_Data_in at a logic level of "0". Accordingly, the small receiver 375 may be activated by the S_Inhibit signal to amplify or drive data from circuits outside the chip to said one of the I/O pads 372 into its output of S_Data_in.

Referring to FIG. 5B, the small driver 374 may have an output capacitance or driving capability or loading, for example, between 0.05 pF and 2 pF or between 0.05 pF and 1 pF, or smaller than 2 pF or 1 pF. The output capacitance of the small driver 374 can be used as driving capability of the small driver 374, which is the maximum loading at the output of the small driver 374, measured from said one of the I/O pads 372 to loading circuits external of said one of the I/O pads 372. The size of the small ESD protection circuit or device 373 may be between 0.01 pF and 0.1 pF or smaller than 0.1 pF. In some cases, no small ESD protection circuit or device 373 is provided in the small I/O circuit 203. In some cases, the small driver 374 or receiver 375 of the small I/O circuit 203 in FIG. 5B may be designed just like an internal driver or receiver, having no small ESD protection circuit or device 373 and having the same input and output capacitances as the internal driver or receiver. Said one of the I/O pads 372 may have an input capacitance, provided by the small ESD protection circuit or device 373 and small receiver 375 for example, between 0.15 pF and 4 pF or between 0.15 pF and 2 pF, or greater than 0.15 pF. The input capacitance is measured from said one of the I/O pads 372 to loading circuits internal of said one of the I/O pads 372.

Specification for Programmable Logic Blocks

Figure 6:
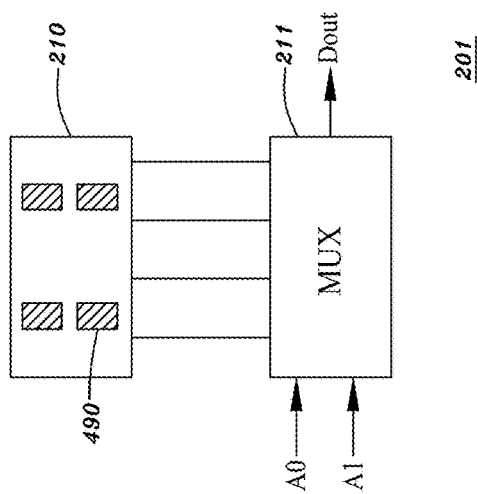
FIG. 6 is a schematic view showing a block diagram of a programmable logic block in accordance with an embodiment of the present application.

FIG. 6 is a schematic view showing a block diagram of a programmable logic block in accordance with an embodiment of the present application. Referring to FIG. 6, a programmable logic block (LB) 201 may include a look-up table (LUT) 210 and a multiplexer 211 having its first set of inputs, e.g., D0-D3 as illustrated in FIG. 4, each coupling to one of resulting values or programming codes stored in the look-up table (LUT) 210 and its second set of inputs, e.g., two-digit inputs of A0-A1 as illustrated in FIG. 4, configured to determine one of the inputs in its first set into its output, e.g., Dout as illustrated in FIG. 4, acting as an output of the programmable logic block (LB) 201. The inputs, e.g., A0-A1 as illustrated in FIG. 4, of the second set of the multiplexer 211 may act as inputs of the programmable logic block (LB) 201.

Referring to FIG. 6, the look-up table (LUT) 210 of the programmable logic block (LB) 201 may be composed of multiple memory cells 490, i.e., configuration-programming-memory (CPM) cells, each configured to save or store one of the resulting values, i.e., programming codes, i.e., CPM data. Each of the memory cells 490 may be referred to one 398 as illustrated in FIG. 1A or 1B. Its multiplexer 211 may have its first set of inputs, e.g., D0-D3 as illustrated in FIG. 4, each coupling to one of the outputs of one of the memory cells 490, i.e., one of the outputs Out1 and Out2 of the memory cell 398, for the look-up table (LUT) 210. Thus, each of the resulting values or programming codes stored in the respective memory cells 490 may couple to one of the inputs of the first set of the multiplexer 211 of the programmable logic block (LB) 201.

Furthermore, the programmable logic block (LB) 201 may be composed of another memory cell 490 configured to save or store a programming code, wherein the another memory cell 490 may have an output coupling to the input SC-4 of the multi-stage tri-state buffer 292 as seen in FIG. 4 for the programmable logic block (LB) 201. Each of the another memory cells 490 may be referred to one 398 as illustrated in FIG. 1A or 1B. For the multiplexer 211 as seen in FIG. 4 for the programmable logic block (LB) 201, its multi-stage tri-state buffer 292 may have the input SC-4 coupling to one of the outputs Out1 and Out2 of one of the another memory cells 398 as illustrated in FIG. 1A or 1B configured to save or store a programming code to switch on or off the programmable logic block (LB) 201.

Figures 7A, 7B:
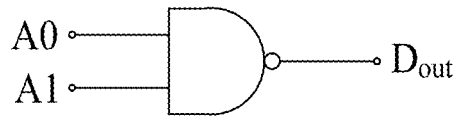
FIG. 7A shows a NAND gate in accordance with the present application.
FIG. 7B shows a truth table for a NAND gate in accordance with the present application.

The programmable logic block 201 may include the look-up table 210 that may be programed to store or save the resulting values or programing codes for logic operation or Boolean operation, such as AND, NAND, OR, NOR or EXOR operation or an operation combining the two or more of the above operations. For example, the look-up table 210 may be programed to lead the programmable logic block 201 to achieve the same logic operation as a logic operator, i.e., NAND gate or operator, as shown in FIG. 7A performs. For this case, the programmable logic block 201 may have two inputs, e.g., A0 and A1, and an output, e.g., Dout. FIG. 7B shows a truth table for a NAND operator. Referring to FIG. 7B, the look-up table 210 records or stores each of four resulting values or programming codes of the NAND operator as illustrated in FIG. 7A that are generated respectively in accordance with four combinations of its inputs A0 and A1. The look-up table 210 may be programmed with the four resulting values or programming codes respectively stored in the four memory cells 490, each of which may be referred to one 398 as illustrated in FIG. 1A or 1B having its output Out1 or Out2 coupling to one of the four inputs D0-D3 of the first set of the multiplexer 211 for the programmable logic block (LB) 201. The multiplexer 211 may be configured to determine one of its four inputs, e.g., D0-D3, of the first set into its output, e.g., Dout, in accordance with one of the combinations of its inputs A0 and A1 of the second set. The output Dout of the multiplexer 211 as seen in FIG. 6 may act as the output of the programmable logic block (LB) 201.

Specification for Programmable Interconnect

Figure 8:
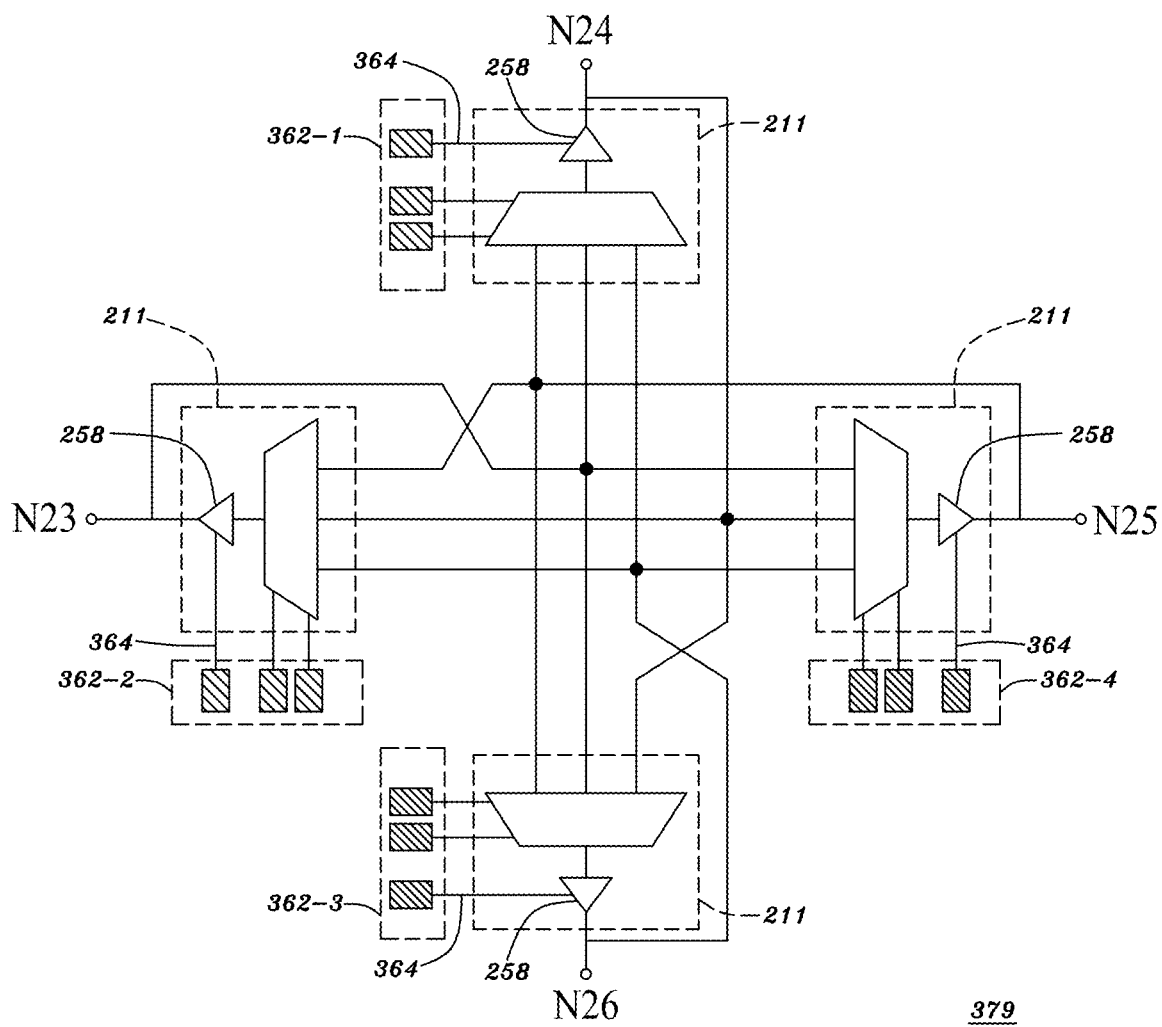
FIG. 8 is a block diagram illustrating programmable interconnects programmed by a cross-point switch in accordance with an embodiment of the present application.

FIG. 8 is a circuit diagram illustrating programmable interconnects programmed by a cross-point switch in accordance with an embodiment of the present application. Referring to FIG. 8, a cross-point switch 379 may include four multiplexers 211 as seen in FIG. 4 each having three inputs, e.g., D0-D2, in the first set and two inputs, e.g., A0-A1, in the second set and being configured to pass one of its three inputs in the first set into its output in accordance with a combination of its two inputs in the second set. Each of the three inputs D0-D2 of the first set of one of the four multiplexers 211 may couple to one of the three inputs D0-D2 of the first set of another two of the four multiplexers 211 and to an output Dout of the other one of the four multiplexers 211. Thereby, each of the four multiplexers 211 may pass one of its three inputs D0-D2 in the first set coupling to three respective metal lines extending in three different directions to the three outputs Dout of the other three of the four multiplexers 211 into its output Dout in accordance with a combination of its two inputs A0 and A1 in the second set. Each of the four multiplexers 211 as seen in FIG. 4 may include the pass/no-pass switch or switch buffer 258 configured to be switched on or off in accordance with its input SC-4 to pass or not to pass one of its three inputs D0-D2 in the first set, passed in accordance with the second set of its inputs A0 and A1, into its output Dout. For example, the top one of the four multiplexers 211 may pass one of its three inputs in the first set coupling to the three outputs Dout at nodes N23, N26 and N25 of the left, bottom and right ones of the four multiplexers 211 into its output Dout at a node N24 in accordance with a combination of its two inputs A0 and A1 in the second set. The top one of the four multiplexers 211 may include the pass/no-pass switch or switch buffer 258 configured to be switched on or off in accordance with the second set of its input SC-4 to pass or not to pass one of its three inputs in the first set, passed in accordance with the second set of its inputs A0 and A1, into its output Dout at the node N24.

Figure 19A:
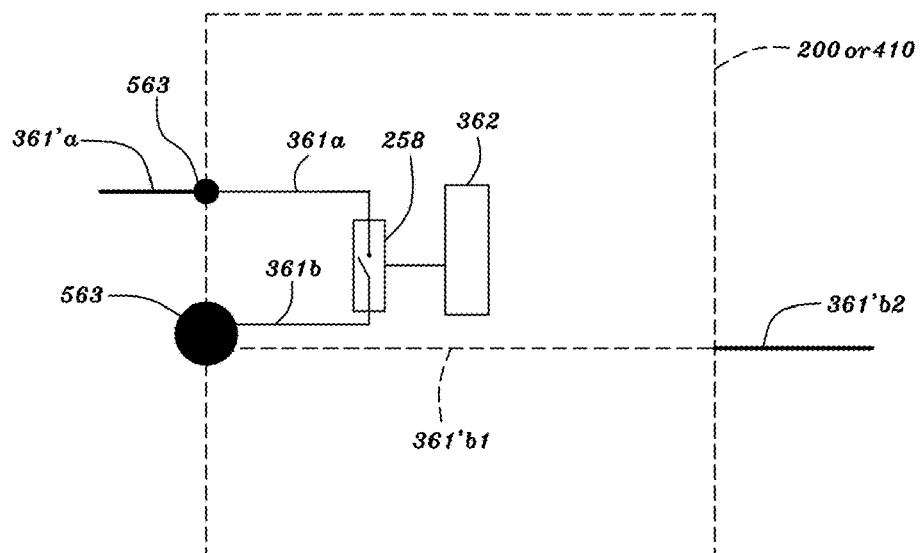
FIG. 19A is a circuit diagram showing multiple programmable interconnects formed from multiple inter-chip interconnects, coupling to a pass/no-pass switch of a FPGA IC chip or DPIIC chip in accordance with an embodiment of the present application.
Figure 19B:
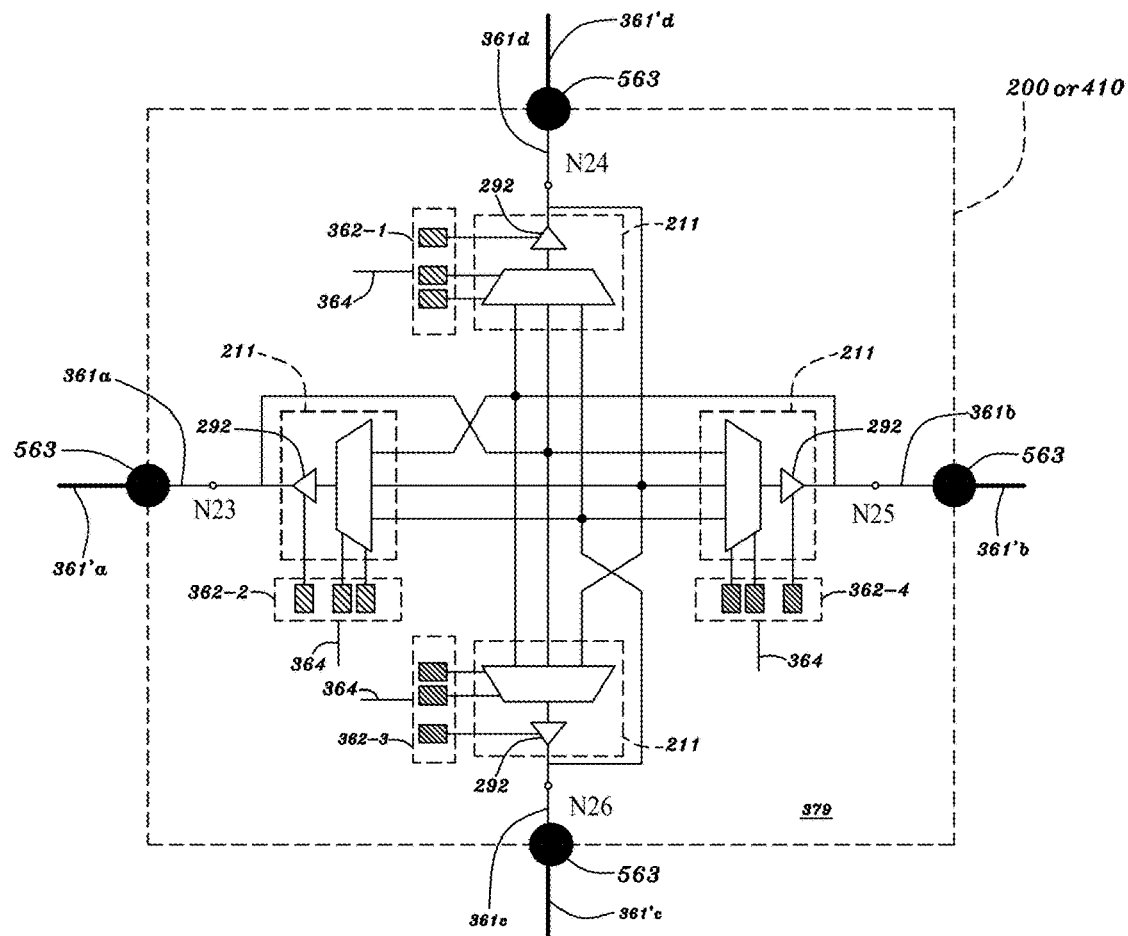
FIG. 19B is a circuit diagram showing multiple programmable interconnects formed from multiple inter-chip interconnects, coupling to a cross-point switch of a FPGA IC chip or DPIIC chip in accordance with an embodiment of the present application.

Referring to FIG. 8, four programmable interconnects 361 as seen in FIG. 19B may couple to the respective four nodes N23-N26 of the cross-point switch 379. Thereby, one of the four programmable interconnects 361 may be switched by the cross-point switch 379 to couple to another one, two or three of the four programmable interconnects 361. Each of the multiplexers 211 may have its second set of two inputs A0 and A1 coupling respectively to the outputs of two of the memory cells 362, i.e., configuration-programming-memory (CPM) cells, each of which may be referred to the output Out1 or Out2 of the memory cell 398, and its node SC-4 may couple to the output of another of the memory cells 362, which may be referred to the output Out1 or Out2 of the memory cell 398. Accordingly, each of the multiplexers 211 may pass its first set of three inputs coupling to three of the four programmable interconnects 361 into its output coupling to the other one of the four programmable interconnects 361 in accordance with its second set of two inputs A0 and A1 and alternatively further in accordance with a logic level at the node SC-4.

For example, referring to FIG. 8, for programming the programmable interconnects 361 as seen in FIG. 19B, the top one of the multiplexers 211 may have its second set of inputs A0, A1 and SC-4 coupling respectively to the outputs of the three memory cells 362-1, each of which may be referred to the output Out1 or Out2 of the memory cell 398, the left one of the multiplexers 211 may have its second set of inputs A0, A1 and SC-4 coupling respectively to the outputs of the three memory cells 362-2, each of which may be referred to the output Out1 or Out2 of the memory cell 398, the bottom one of the multiplexers 211 may have its second set of inputs A0, A1 and SC-4 coupling respectively to the outputs of the three memory cells 362-3, each of which may be referred to the output Out1 or Out2 of the memory cell 398, and the right one of the multiplexers 211 may have its second set of inputs A0, A1 and SC-4 coupling respectively to the outputs of the three memory cells 362-4, each of which may be referred to the output Out1 or Out2 of the memory cell 398. Before the memory cells 362-1, 362-2, 362-3 and 362-4 are programmed or when the memory cells 362-1, 362-2, 362-3 and 362-4 are being programmed, the four programmable interconnects 361 may not be used for signal transmission. The memory cells 362-1, 362-2, 362-3 and 362-4 may be programmed to have each of the multiplexers 211 pass one of its three inputs of the first set into its output such that one of the four programmable interconnects 361 may couple to another, another two or another three of the four programmable interconnects 361 for signal transmission in operation.

Alternatively, referring to FIGS. 2A-2C, two programmable interconnects 361 may be controlled, by the pass/no-pass switch 258 of either of the first through third types as seen in FIGS. 2A-2C, to couple to each other. One of the programmable interconnects 361 may couple to the node N21 of the pass/no-pass switch 258, and another of the programmable interconnects 361 may couple to the node N22 of the pass/no-pass switch 258. Accordingly, the pass/no-pass switch 258 may be switched on to connect said one of the programmable interconnects 361 to said another of the programmable interconnects 361; the pass/no-pass switch 258 may be switched off to disconnect said one of the programmable interconnects 361 from said another of the programmable interconnects 361.

For the first type of pass/no-pass switch 258 as illustrated in FIG. 2A used to program the programmable interconnects 361, the first type of pass/no-pass switch 258 may have its node SC-3 coupling to an output of the memory cell 362, which may be referred to the output Out1 or Out2 of the memory cell 398 and associated with the programming code, i.e., CPM data, stored or saved in the memory cell 398, to switch on or off the first type of pass/no-pass switch 258 to couple or decouple two of the programmable interconnects 361 coupling to the two nodes N21 and N22 of the pass/no-pass switch 258 of the first type respectively.

For the second type of pass/no-pass switch 258 as illustrated in FIG. 2B used to program the programmable interconnects 361, the second type of pass/no-pass switch 258 may have its node SC-4 coupling to an output of the memory cell 362, which may be referred to the output Out1 or Out2 of the memory cell 398 and associated with the programming code, i.e., CPM data, stored or saved in the memory cell 398, to switch on or off the second type of pass/no-pass switch 258 to couple or decouple two of the programmable interconnects 361 coupling to the two nodes N21 and N22 of the pass/no-pass switch 258 of the second type respectively.

For the third type of pass/no-pass switch 258 as illustrated in FIG. 2C used to program the programmable interconnects 361, the third type of pass/no-pass switch 258 may have its nodes SC-5 and SC-6 coupling to two outputs of the two respective memory cells 362, each of which may be referred to the output Out1 or Out2 of the memory cell 398 and associated with two programming codes, i.e., CPM data, stored or saved in the two memory cells 398 respectively, to switch on or off the third type of pass/no-pass switch 258 to couple or decouple two of the programmable interconnects 361 coupling to the two nodes N21 and N22 of the pass/no-pass switch 258 of the third type respectively.

Before the memory cell(s) 362 are programmed or when the memory cell(s) 362 are being programmed, the programmable interconnects 361 may not be used for signal transmission. The memory cell(s) 362 may be programmed to have the pass/no-pass switch 258 switched on to couple the programmable interconnects 361 for signal transmission or to have the pass/no-pass switch 258 switched off not to couple the programmable interconnects 361. Similarly, each of the first and second types of cross-point switches 379 as seen in FIGS. 3A and 3B may be composed of a plurality of the pass/no-pass switch 258 of the first, second or third type, wherein each of the pass/no-pass switches 258 may have the node(s) SC-3, SC-4 or (SC-5 and SC-6) coupling to the output(s) of the memory cell(s) 362 as mentioned above, which are associated with the programming code(s), i.e., CPM data, stored or saved in the memory cell(s) 362, to switch on or off said each of the pass/no-pass switches 258 to couple or decouple two of the programmable interconnects 361 coupling to the two nodes N21 and N22 of said each of the pass/no-pass switches 258 respectively.

Figure 9A:
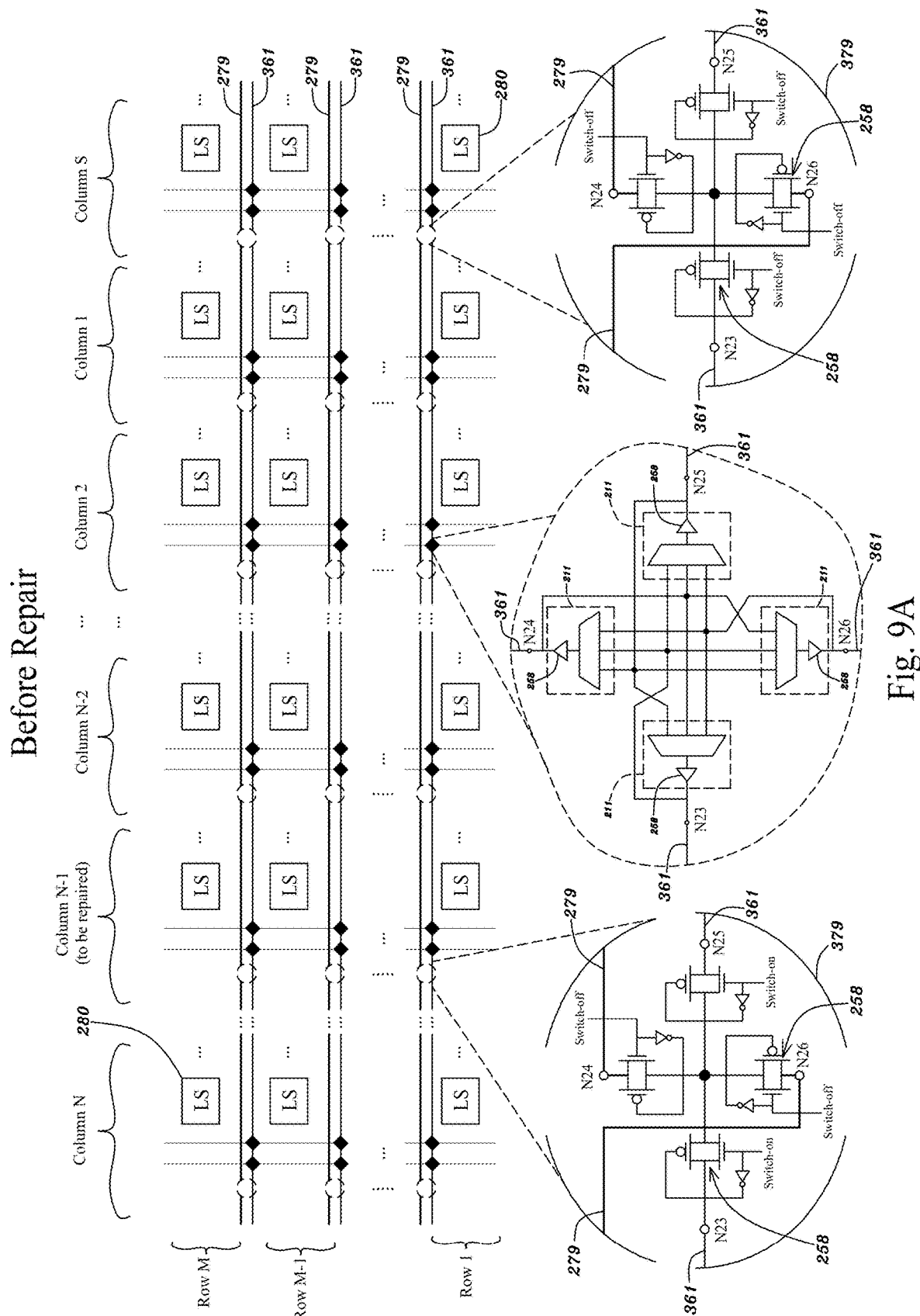
FIGS. 9A and 9B are schematic views showing a method for repairing a standard commodity FPGA IC chip in accordance with an embodiment of the present application.
Figure 9B:
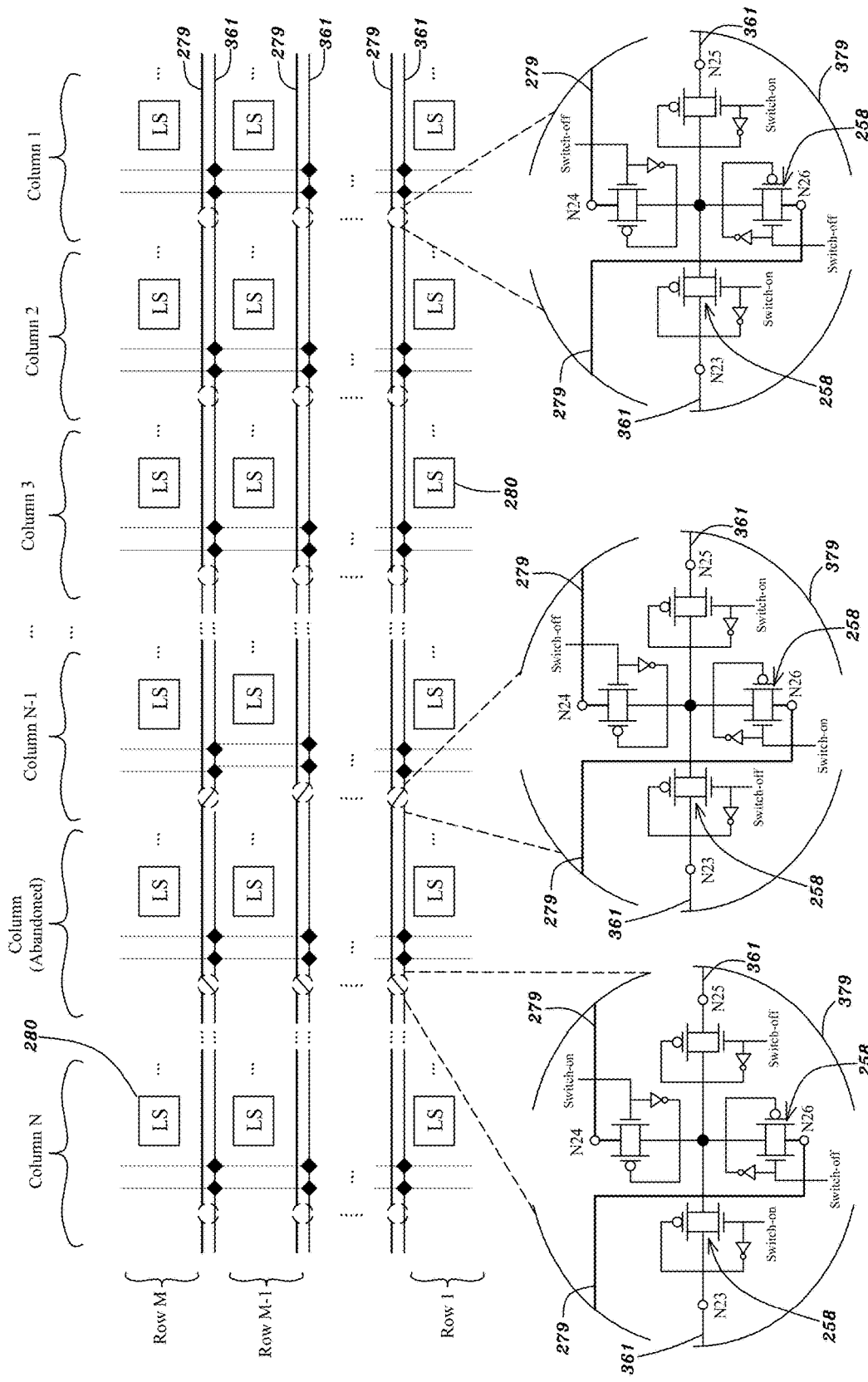

Method for Repairing Standard Commodity Field-Programmable-Gate-Array (FPGA) Integrated-Circuit (IC) Chip FIGS. 9A and 9B are schematic views showing a method for repairing a standard commodity FPGA IC chip in accordance with an embodiment of the present application. Referring to FIGS. 9A and 9B, the standard commodity FPGA IC chip 200 may include (1) multiple logic sections (LS) 280 arranged in an array with (N+1) columns and M rows, (2) multiple cross-point switches 379 as illustrated in FIGS. 8, 3A and 3B arranged around each of the programmable logic blocks (LB) 201, and (3) multiple intra-chip interconnects each extending over spaces between neighboring two of the programmable logic blocks 201. Each of the logic sections 280 may include a programmable logic block (LB) 201 as illustrated in FIG. 6 or multiple programmable logic blocks (LB) 201, each of which may be referred to that as illustrated in FIG. 6, arranged in an array. The logic sections (LS) 280 may have a first group for spare in the rightmost column configured to be backed up for a second group thereof in another column. In this case, the second group of logic sections (LS) 280 may be ones in the column N−1, one, some or all of the programmable logic blocks (LB) 201 of which may be detected or determined in a broken state.

Referring to FIGS. 9A and 9B, the cross-point switches 379 may include (1) a first group of cross-point switches 379, shown with solid diamonds, as illustrated in FIG. 8 and (2) a second group of cross-point switches 379, shown with hollow cycles with dotted-line profiles, as illustrated in FIG. 3A or 3B. In this case, the cross-point switches 379 in the second group are ones as illustrated in FIG. 3A. The intra-chip interconnects may include (1) a first group of programmable interconnects 361 to serve as by-pass interconnects 279 each coupling the node N24 of one of the cross-point switches 379 in the second group to the node N26 of another far one of the cross-point switches 379 in the second group to by-pass one or more of the cross-point switches 379 in the first group, (2) a second group of programmable interconnects 361 each coupling the node N25 of one of the cross-point switches 379 in the first group to the node N23 of the right neighboring one of the cross-point switches 379 in the first group, (3) a third group of programmable interconnects 361 each coupling the node N24 of one of the cross-point switches 379 in the first group to the node N25 of the upper neighboring one of the cross-point switches 379 in the first group, (4) a fourth group of programmable interconnects 361 each coupling the node N25 of one of the cross-point switches 379 in the first group to the node N23 of the right neighboring one of the cross-point switches 379 in the second group, and (5) a fifth group of programmable interconnects 361 each coupling the node N23 of one of the cross-point switches 379 in the first group to the node N25 of the left neighboring one of the cross-point switches 379 in the second group. Each of the by-pass interconnects 279 in a specific column may extend in a horizontal direction and between neighboring two of the logic sections 280 in the specific column to by-pass the cross-point switches 379 in the first group in the specific column.

Referring to FIG. 9A, before repairing the logic sections 280, the cross-point switches 379 in the second group in the columns 1−N may be programmed to couple its node N23 to its node N25, but the cross-point switches 379 in the second group in the column S may be programmed not to couple its node N23 to any of its nodes N24-N26.

Referring to FIG. 9B, after repairing the logic sections 280, i.e., the ones 280 in the column N−1 are skipped, the cross-point switches 379 in the second group in the column N−1 may be programmed to couple its node N23 to its node N24 and the cross-point switches 379 in the second group in the column N−2 may be programmed to couple its node N25 to its node N26 such that each of the by-pass interconnects in the column N−1 may couple one of the cross-point switches 379 in the second group in the column N−1 to one of the cross-point switches 379 in the second group in the column N−2. Further, the cross-point switches 379 in the second group in the column S may be programmed to couple its node N23 to its node N25. Next, the columns for the logic sections (LS) 280 may be renumbered such that the column S before repairing the logic sections (LS) 280 may be renumbered to column 1, and the column n before repairing the logic sections (LS) 280 may be renumbered to column (n+1), where n may be equal to an integer ranging from 1 to (N−2). Each of the logic sections (LS) 280 after repaired in a specific renumbered column and in a specific row may perform the same operation as one of the logic sections (LS) 280 before repaired in the specific column and in the specific row. For example, each of the logic sections (LS) 280 after repaired in the first renumbered column and in the first row may perform the same operations as one of the logic sections (LS) 280 before repaired in the first column and in the first row. For the FPGA IC chip 200, one of its cross-point switches 379 of the second group at a cross of each of the rows 1−M and each of the columns 1−N may couple to one of the inputs of the second set of one of the programmable logic blocks 201, as illustrated in FIG. 6, of one of its logic sections (LS) 280 at the cross through one or more of its cross-point switches 379 of the first group at the cross. For the FPGA IC chip 200, one of its cross-point switches 379 of the second group at a cross of each of the rows 1−M and each of the columns 1−N may couple to the output of one of the programmable logic blocks 201, as illustrated in FIG. 6, of one of its logic sections (LS) 280 at the cross through one or more of its cross-point switches 379 of the first group at the cross.

Figure 10A:
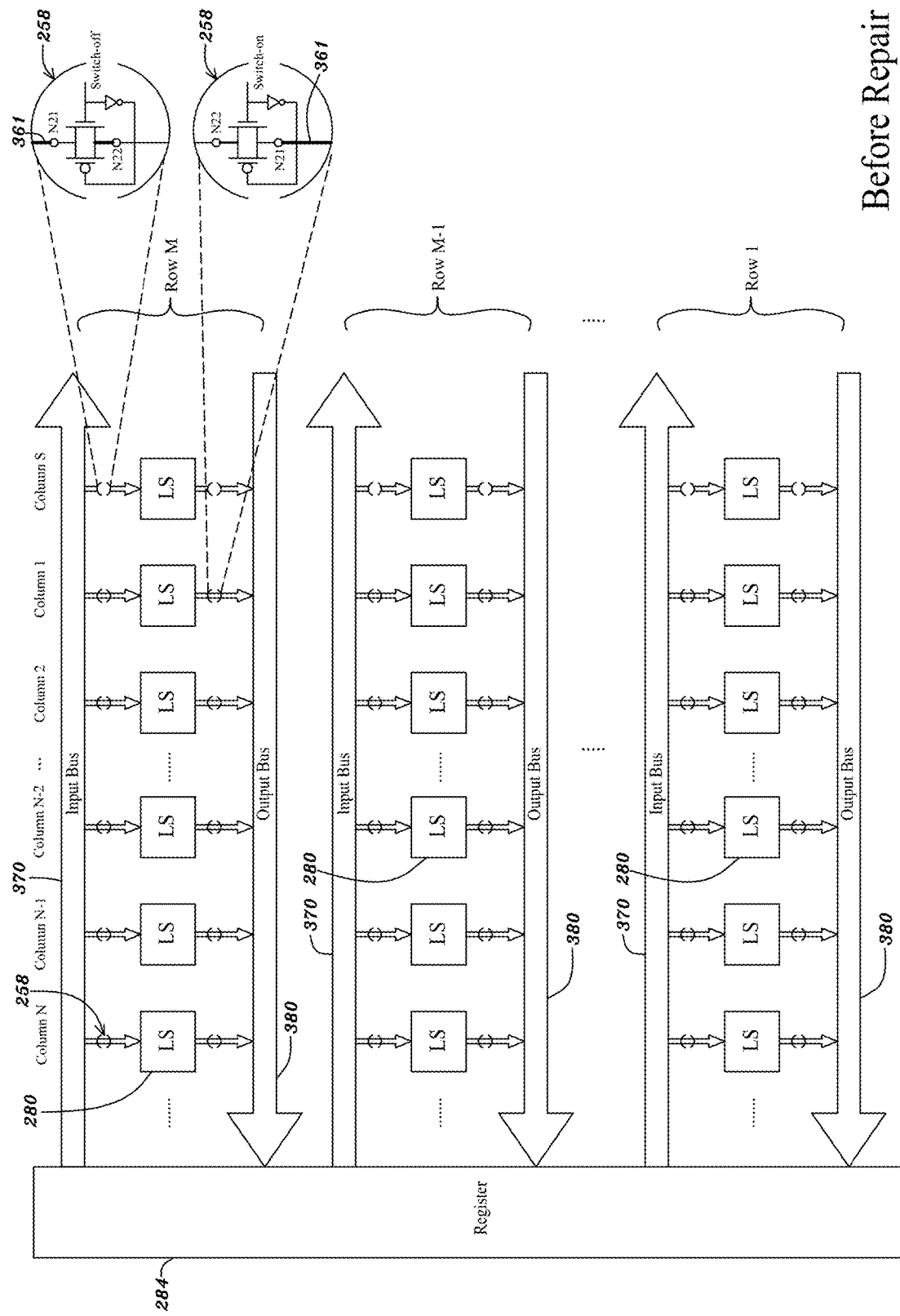
FIGS. 10A and 10B are schematic views showing a method for repairing a standard commodity FPGA IC chip in accordance with another embodiment of the present application.
Figure 10B:
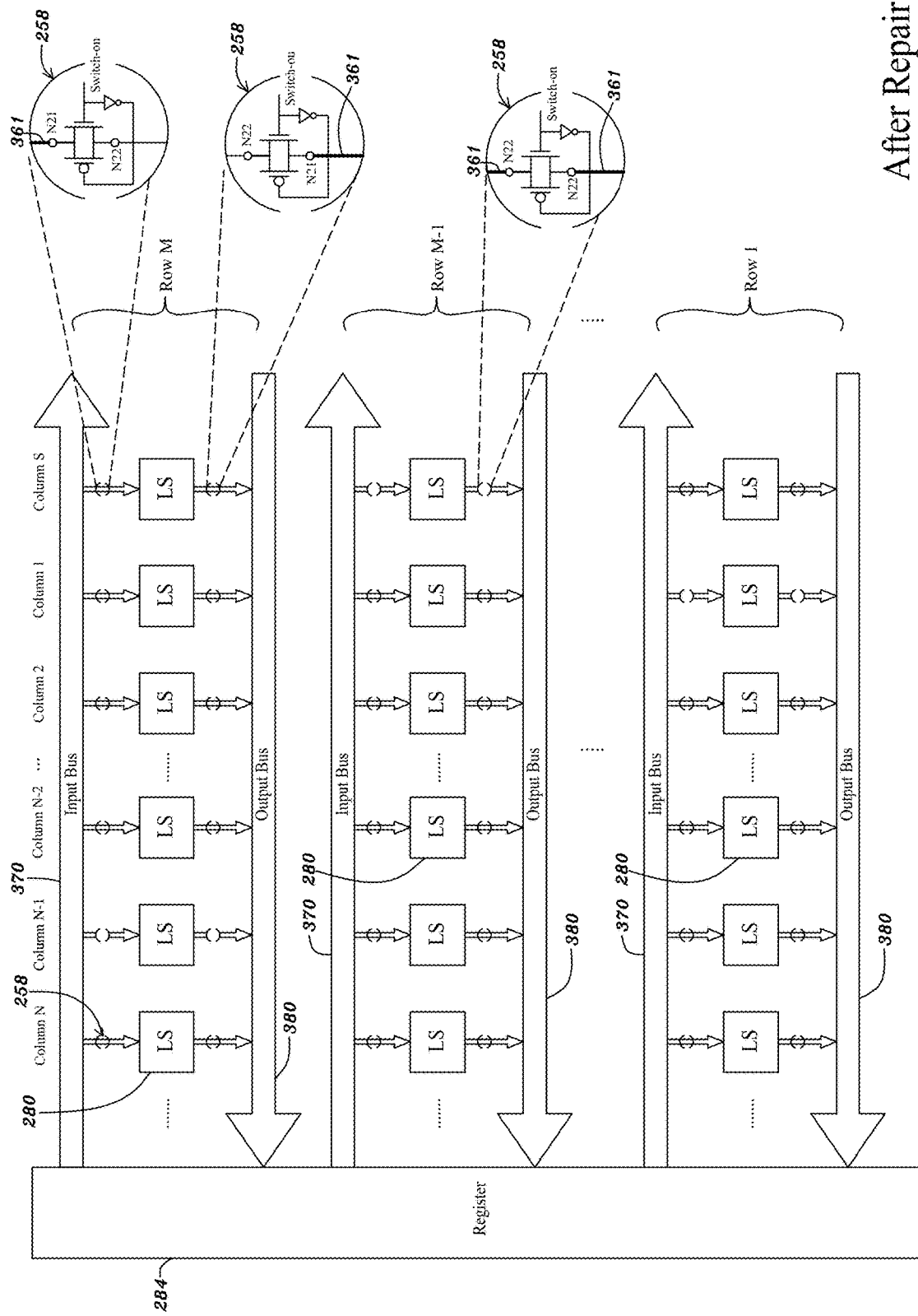

Alternatively, FIGS. 10A and 10B are schematic views showing a method for repairing a standard commodity FPGA IC chip in accordance with another embodiment of the present application. Referring to FIGS. 10A and 10B, the standard commodity FPGA IC chip 200 may include (1) multiple logic sections (LS) 280 arranged in an array with (N+1) columns and M rows, (2) multiple programmable interconnects 361 for an input bus 370 in each of multiple sets arranged in M rows, configured to pass data to the logic sections (LS) 280 arranged in one of the M rows, (3) multiple programmable interconnects 361 for an output bus 380 in each of multiple sets arranged in M rows, configured to pass data from the logic sections (LS) 280 arranged in one of the M rows, (4) a register 284 configured to register or save data therein to be passed to each of the logic sections (LS) 280 through the programmable interconnects 361 for the input bus 370 of one of the multiple sets and to register or save data therein passed from each of the logic sections (LS) 280 through the programmable interconnects 361 for the output bus 380 of one of the multiple sets, (5) multiple pass/no-pass switches 258, as illustrated in FIGS. 2A-2C, for multiple inputs of each of the logic sections (LS) 280, each having its node N21 coupling to one of the programmable interconnects 361 for the input bus 370 of one of the multiple sets and its node N22 coupling to one of the inputs of the second set of one of the programmable logic blocks 201, as illustrated in FIG. 6, of said each of the logic sections (LS) 280 and configured to switch on or off the connection between said one of the programmable interconnects 361 for the input bus 370 and said one of the inputs of the second set of said one of the programmable logic blocks 201 of said each of the logic sections (LS) 280, and (6) multiple pass/no-pass switches 258, as illustrated in FIGS. 2A-2C, for multiple outputs of each of the logic sections (LS) 280, each having its node N21 coupling to one of the programmable interconnects 361 for the output bus 380 of one of the multiple sets and its node N22 coupling to the output of one of the programmable logic blocks 201, as illustrated in FIG. 6, of said each of the logic sections (LS) 280 and configured to switch on or off the connection between said one of the programmable interconnects 361 for the output bus 380 and the output of said one of the programmable logic blocks 201 of said each of the logic sections (LS) 280.

Referring to FIGS. 10A and 10B, each of the logic sections 280 may include a programmable logic block (LB) 201 as illustrated in FIG. 6 or multiple programmable logic blocks (LB) 201, each of which may be referred to that as illustrated in FIG. 6, arranged in an array. In each of the rows 1-M, the logic sections (LS) 280 may have one for spare in the rightmost column configured to be backed up for another one thereof in another column. In this case, the logic sections (LS) 280 in the row M and the column N-1 and in the first row and the first column may have one, some or all of its programmable logic blocks (LB) 201, detected or determined in a broken state.

Referring to FIG. 10A, before repairing the logic sections 280, each of the pass/no-pass switches 258 for the inputs and outputs of the logic sections (LS) 280 arranged in the columns 1-N may be programmed to be switched on to couple its node N21 to its node N22, and each of the pass/no-pass switches 258 for the inputs and outputs of the logic sections (LS) 280 arranged in the column S may be programmed to be switched off not to couple its node N21 to its node N22.

Referring to FIG. 10B, after repairing the logic sections 280, each of the pass/no-pass switches 258 for the inputs and outputs of a broken one of the logic sections (LS) 280 in each of the rows 1-M, which is detected or determined in a broken state in a case, may be programmed to be switched off not to couple each of the programmable interconnects 361 for the input and output buses 370 and 380 in said each of the rows 1-M to the broken one of the logic sections (LS) 280, and each of the pass/no-pass switches 258 for the inputs and outputs of a spare one of the logic sections (LS) 280 in the column S and said each of the rows 1-M may be programmed to be switched on to couple each of the programmable interconnects 361 for the input and output buses 370 and 380 in said each of the rows 1-M to the spare one of the logic sections (LS) 280. For example, in the row M, the logic section (LS) 280 in the column N-1 is detected or determined in a broken state and thus each of the pass/no-pass switches 258 for the inputs and outputs of the logic sections (LS) 280 in the column N-1 may be programmed to be switched off not to couple each of the programmable interconnects 361 for the input and output buses 370 and 380 in the row M to the logic section (LS) 280 in the column N-1, and each of the pass/no-pass switches 258 for the inputs and outputs of the logic sections (LS) 280 in the column S may be programmed to be switched on to couple each of the programmable interconnects 361 for the input and output buses 370 and 380 in the row M to the logic section (LS) 280 in the column S. In the row M-1, all of the logic section (LS) 280 is not detected or determined in a broken state, and thus the pass/no-pass switches 258 in the row M-1 are kept in the state before repairing the logic sections (LS) 280. In the row 1, the logic section (LS) 280 in the column 1 is detected or determined in a broken state and thus each of the pass/no-pass switches 258 for the inputs and outputs of the logic sections (LS) 280 in the column 1 may be programmed to be switched off not to couple each of the programmable interconnects 361 for the input and output buses 370 and 380 in the row 1 to the logic section (LS) 280 in the column 1, and each of the pass/no-pass switches 258 for the inputs and outputs of the logic sections (LS) 280 in the column S may be programmed to be switched on to couple each of the programmable interconnects 361 for the input and output buses 370 and 380 in the row 1 to the logic section (LS) 280 in the column S.

In operation, referring to FIG. 10B, in a cycle, the logic sections (LS) 280 in each of the rows 1-M may process in parallel input data from the input bus 370 in said each of the rows 1-M into output data to be passed to the register 284 through the output bus 380 in said each of the rows 1-M. In a following cycle, the register 284 may send the output data from the logic sections (LS) 280 in said each of the rows 1-M to the logic sections (LS) 280 in said each of the rows 1-M again through the input bus 370 in said each of the rows 1-M or to the logic sections (LS) 280 in another of the rows 1-M through the input bus 370 in said another of the rows 1-M. In other words, the architecture of logic sections (LS) 280 provides in-parallel processing in a cycle and sequentially in-series processing in different cycles.

Figure 11A:
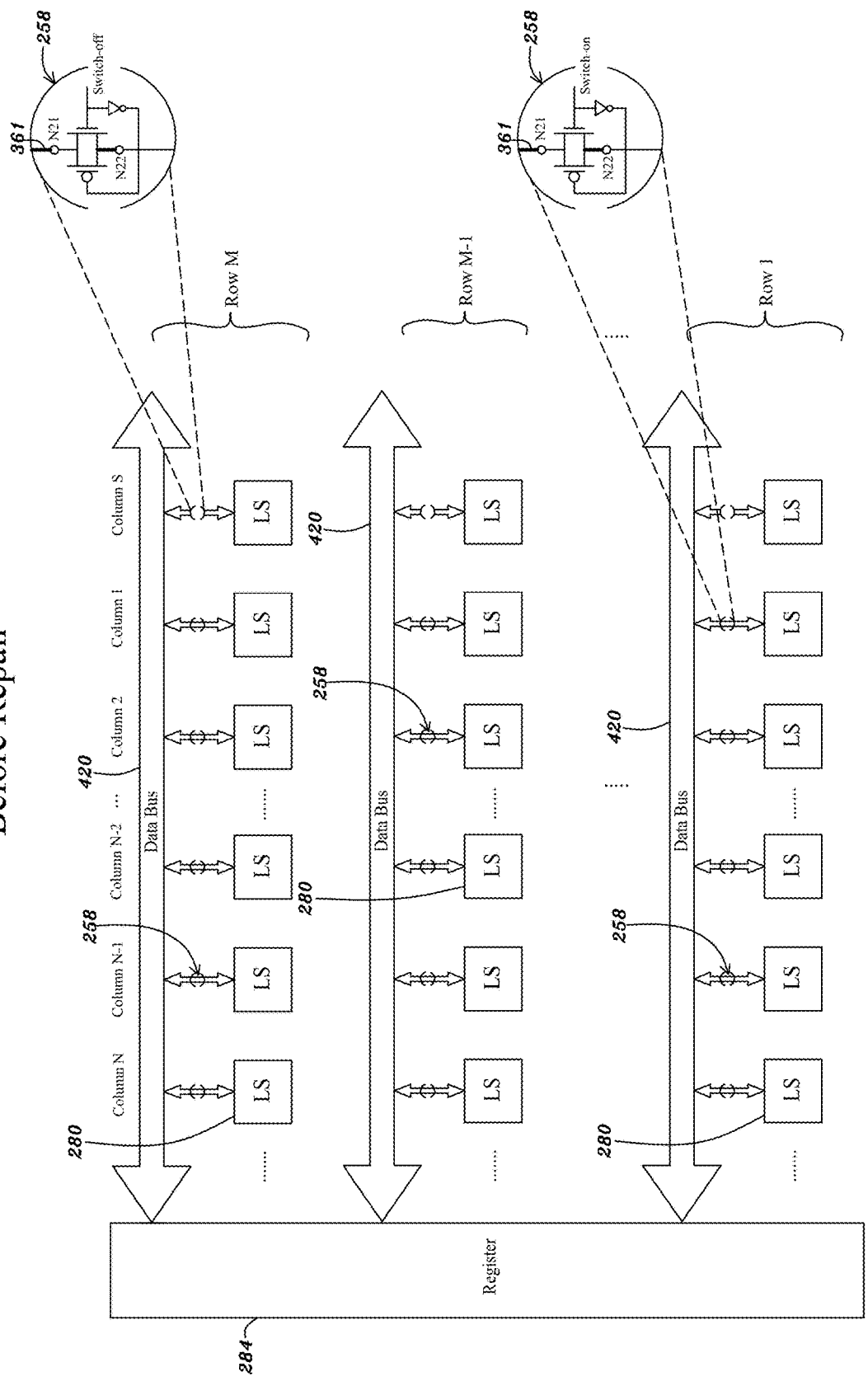
FIGS. 11A and 11B are schematic views showing a method for repairing a standard commodity FPGA IC chip in accordance with another embodiment of the present application.
Figure 11B:
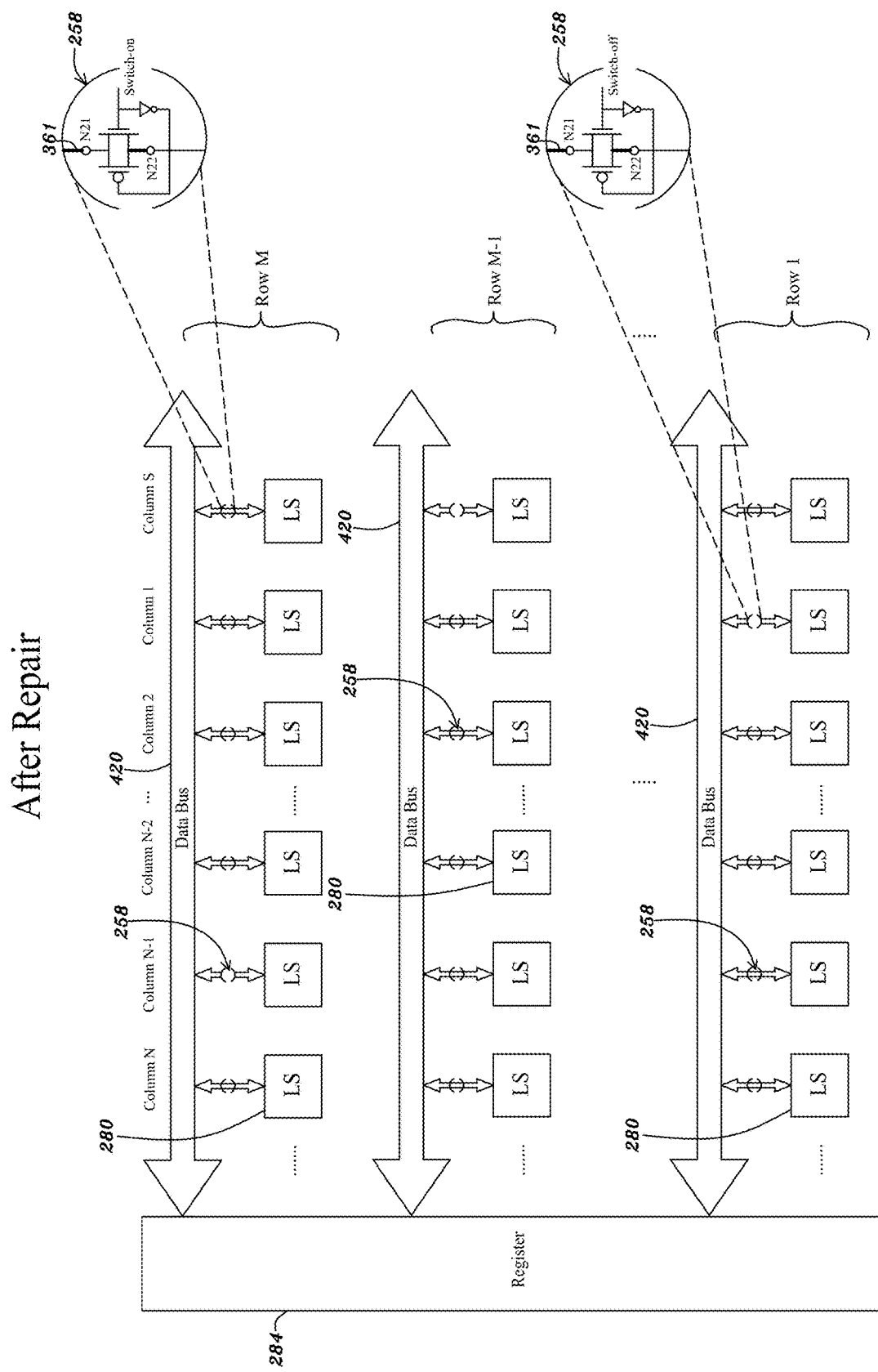

Alternatively, bi-directional programmable interconnects 361 for a data bus 420 as seen in FIGS. 11A and 11B may be provided to replace the unidirectional programmable interconnects 361 for the input and output buses 370 and 380 as seen in FIGS. 10A and 10B. FIGS. 11A and 11B are schematic views showing a method for repairing a standard commodity FPGA IC chip in accordance with another embodiment of the present application. Referring to FIGS. 11A and 11B, the standard commodity FPGA IC chip 200 may include (1) multiple logic sections (LS) 280 arranged in an array with (N+1) columns and M rows, (2) multiple programmable interconnects 361 for a data bus 420 in each of multiple sets arranged in M rows, configured to pass data to or from the logic sections (LS) 280 arranged in one of the M rows, (3) a register 284 configured to register or save data therein to be passed to each of the logic sections (LS) 280 through the programmable interconnects 361 for the data bus 420 of one of the multiple sets and to register or save data therein passed from each of the logic sections (LS) 280 through the programmable interconnects 361 for the data bus 420 of one of the multiple sets, and (4) multiple pass/no-pass switches 258, as illustrated in FIG. 2A or 2C, for multiple inputs/outputs of each of the logic sections (LS) 280, each having its node N21 coupling to one of the programmable interconnects 361 for the data bus 420 of one of the multiple sets and its node N22 configured to (1) in a first clock, couple to one of the inputs of the second set of one of the programmable logic blocks 201, as illustrated in FIG. 6, of said each of the logic sections (LS) 280 and switch on or off the connection between said one of the programmable interconnects 361 for the data bus 420 and said one of the inputs of the second set of said one of the programmable logic blocks 201 of said each of the logic sections (LS) 280, and (2) in a second clock, couple to the output of said one or another of the programmable logic blocks 201 of said each of the logic sections (LS) 280 and switch on or off the connection between said one of the programmable interconnects 361 for the data bus 420 and the output of said one or another of the programmable logic blocks 201 of said each of the logic sections (LS) 280.

Referring to FIGS. 11A and 11B, each of the logic sections 280 may include a programmable logic block (LB) 201 as illustrated in FIG. 6 or multiple programmable logic blocks (LB) 201, each of which may be referred to that as illustrated in FIG. 6, arranged in an array. In each of the rows 1–M, the logic sections (LS) 280 may have one for spare in the rightmost column configured to be backed up for another one thereof in another column. In this case, the logic sections (LS) 280 in the row M and the column N–1 and in the first row and the first column may have one, some or all of its programmable logic blocks (LB) 201, detected or determined in a broken state.

Referring to FIG. 11, before repairing the logic sections 280, each of the pass/no-pass switches 258 for the inputs/outputs of the logic sections (LS) 280 arranged in the columns 1–N may be programmed to be switched on to couple its node N21 to its node N22, and each of the pass/no-pass switches 258 for the inputs/outputs of the logic sections (LS) 280 arranged in the column S may be programmed to be switched off not to couple its node N21 to its node N22.

Referring to FIG. 11B, after repairing the logic sections 280, each of the pass/no-pass switches 258 for the inputs/outputs of a broken one of the logic sections (LS) 280 in each of the rows 1–M, which is detected or determined in a broken state in a case, may be programmed to be switched off not to couple each of the programmable interconnects 361 for the data bus 420 in said each of the rows 1–M to the broken one of the logic sections (LS) 280, and each of the pass/no-pass switches 258 for the inputs/outputs of a spare one of the logic sections (LS) 280 in the column S and said each of the rows 1–M may be programmed to be switched on to couple each of the programmable interconnects 361 for the data bus 420 in said each of the rows 1–M to the spare one of the logic sections (LS) 280. For example, in the row M, the logic section (LS) 280 in the column N–1 is detected or determined in a broken state and thus each of the pass/no-pass switches 258 for the inputs/outputs of the logic sections (LS) 280 in the column N–1 may be programmed to be switched off not to couple each of the programmable interconnects 361 for the data buses 420 in the row M to the logic section (LS) 280 in the column N–1, and each of the pass/no-pass switches 258 for the inputs/outputs of the logic sections (LS) 280 in the column S may be programmed to be switched on to couple each of the programmable interconnects 361 for the data bus 420 in the row M to the logic section (LS) 280 in the column S. In the row M–1, all of the logic section (LS) 280 is not detected or determined in a broken state, and thus the pass/no-pass switches 258 in the row M–1 are kept in the state before repairing the logic sections (LS) 280. In the row 1, the logic section (LS) 280 in the column 1 is detected or determined in a broken state and thus each of the pass/no-pass switches 258 for the inputs/outputs of the logic sections (LS) 280 in the column 1 may be programmed to be switched off not to couple each of the programmable interconnects 361 for the data bus 420 in the row 1 to the logic section (LS) 280 in the column 1, and each of the pass/no-pass switches 258 for the inputs/outputs of the logic sections (LS) 280 in the column S may be programmed to be switched on to couple each of the programmable interconnects 361 for the data bus 420 in the row 1 to the logic section (LS) 280 in the column S.

In operation, referring to FIG. 11B, in a cycle, the logic sections (LS) 280 in each of the rows 1–M may process in parallel input data from the data bus 420 in said each of the rows 1–M into output data to be passed in a following cycle to the register 284 through the data bus 420 in said each of the rows 1–M. Next, in another cycle, the register 284 may send the output data from the logic sections (LS) 280 in said each of the rows 1–M to the logic sections (LS) 280 in said each of the rows 1–M again through the data bus 420 in said each of the rows 1–M or to the logic sections (LS) 280 in another of the rows 1–M through the data bus 420 in said another of the rows 1–M. In other words, the architecture of logic sections (LS) 280 provides in-parallel processing in a cycle and sequentially in-series processing in different cycles.

Figure 12:
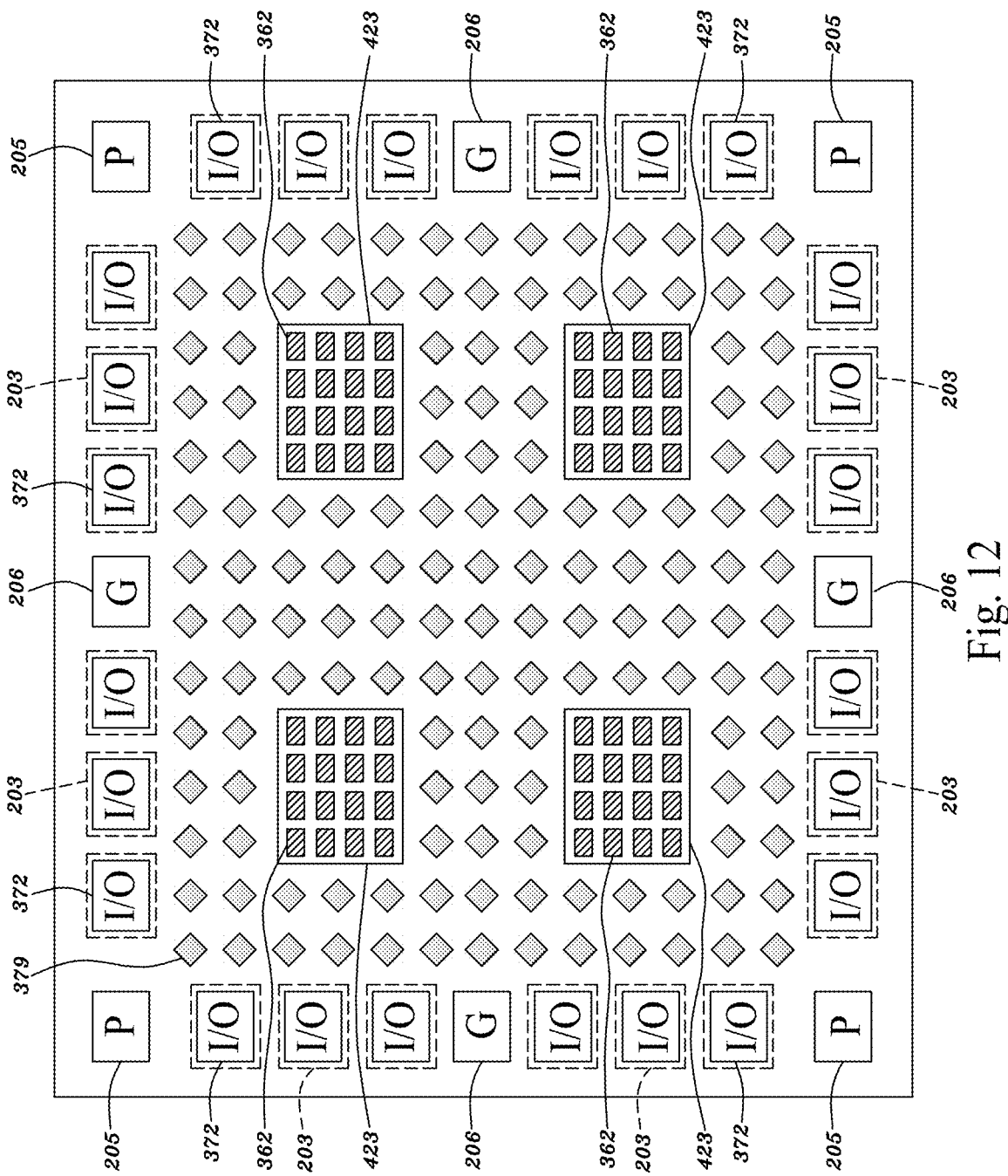
FIG. 12 is a schematically top view showing a block diagram of a dedicated programmable interconnection (DPI) integrated-circuit (IC) chip in accordance with an embodiment of the present application.

Specification for Dedicated Programmable Interconnection (DPI) Integrated-Circuit (IC) Chip FIG. 12 is a schematically top view showing a block diagram of a dedicated programmable interconnection (DPI) integrated-circuit (IC) chip in accordance with an embodiment of the present application.

Referring to FIG. 12, the DPIIC chip 410 may include (1) multiple memory-array blocks 423 arranged in an array in a central region thereof, (2) multiple groups of cross-point switches 379 as illustrated in FIGS. 3A, 3B and 8, each group of which is arranged in one or more rings around one of the memory-array blocks 423, and (3) multiple small input/output (I/O) circuits 203, as illustrated in FIG. 5B, each having the output S_Data_in coupling to one of the nodes N23-N26 of one of its cross-point switches 379 as illustrated in FIGS. 3A, 3B and 8 through one of the programmable interconnects and the input S_Data_out coupling to one of the nodes N23-N26 of another of its cross-point switches 379 as illustrated in FIGS. 3A, 3B and 8 through another of the programmable interconnects. In each of the memory-array blocks 423 are multiple of memory cells 362, each of which may be referred to one 398 as illustrated in FIG. 1A or 1B, each having an output Out1 and/or Out2 coupling to the node SC-3 of one of the pass/no-pass switches 258 as illustrated in FIG. 2A for one of the cross-point switches 379 as illustrated in FIGS. 3A and 3B close to said each of the memory-array blocks 423 to switch on or off said one of the pass/no-pass switches 258. Alternatively, in each of the memory-array blocks 423 are multiple of memory cells 362, each of which may be referred to one 398 as illustrated in FIG. 1A or 1B, each having an output Out1 and/or Out2 coupling to the nodes SC-5 and SC6 of one of the pass/no-pass switches 258 as illustrated in FIG. 2C for one of the cross-point switches 379 as illustrated in FIGS. 3A and 3B close to said each of the memory-array blocks 423 to switch on or off said one of the pass/no-pass switches 258. Alternatively, in each of the memory-array blocks 423 are multiple of memory cells 362, each of which may be referred to one as illustrated in FIG. 1A or 1B, each having an output Out1 or Out2 coupling to one of the inputs A0 and A1 of the second set and input SC-4 of one of the multiplexers 211 of one of the cross-point switches 379 as illustrated in FIG. 8 close to said each of the memory-array blocks 423.

Referring to FIG. 12, the DPIIC chip 410 may include multiple intra-chip interconnects (not shown) each extending over spaces between neighboring two of the memory-array blocks 423, wherein said each of the intra-chip interconnects may be the programmable interconnect, coupling to one of the nodes N23-N26 of one of its cross-point switches 379 as illustrated in FIG. 8. For the DPIIC chip 410, each of its small input/output (I/O) circuits 203, as illustrated in FIG. 5B, may have the output S_Data_in coupling to one or more of its programmable interconnects and the input S_Data_out, S_Enable or S_Inhibit coupling to another one or more of its programmable interconnects.

Referring to FIG. 12, the DPIIC chip 410 may include multiple of the I/O pads 372 as seen in FIG. 5B, each vertically over one of its small input/output (I/O) circuits 203, coupling to the node 381 of said one of its small input/output (I/O) circuits 203. For the DPIIC chip 410, in a first clock, a signal from one of the nodes N23-N26 of one of the cross-point switches 379 as illustrated in FIG. 3A, 3B or 8 may be transmitted to the input S_Data_out of the small driver 374 of one of the small input/output (I/O) circuits 203 through one or more of the programmable interconnects 361, and then the small driver 374 of said one of the small input/output (I/O) circuits 203 may amplify its input S_Data_out to be transmitted to one of the I/O pads 372 vertically over said one of the small input/output (I/O) circuits 203 for external connection to circuits outside the DPIIC chip 410. In a second clock, a signal from circuits outside the DPIIC chip 410 may be transmitted to the small receiver 375 of said one of the small input/output (I/O) circuits 203 through said one of the I/O pads 372, and then the small receiver 375 of said one of the small input/output (I/O) circuits 203 may amplify the signal into its output S_Data_in to be transmitted to one of the nodes N23-N26 of another of the cross-point switches 379 as illustrated in FIG. 3A, 3B or 8 through another one or more of the programmable interconnects 361.

Referring to FIG. 12, the DPIIC chip 410 may further include (1) multiple power pads 205 for applying the voltage Vcc of power supply to the memory cells 362 for the cross-point switches 379 as illustrated in FIG. 3A, 3B or 8, wherein the voltage Vcc of power supply may be between 0.2V and 2.5V, between 0.2V and 2V, between 0.2V and 1.5V, between 0.1V and 1V, or between 0.2V and 1V, or, smaller or lower than or equal to 2.5V, 2V, 1.8V, 1.5V or 1V, and (2) multiple ground pads 206 for providing the voltage Vss of ground reference to the memory cells 362 for the cross-point switches 379 as illustrated in FIG. 3A, 3B or 8.

Referring to FIG. 12, the DPIIC chip 410 may further include multiple 6T SRAM cells 398 as illustrated in FIG. 1A used as cache memory for data latch or storage. Each of the 6T SRAM cells 398 may include two switches 449, such as N-type or P-type MOS transistors, for bit and bit-bar data transfer, and two pairs of P-type and N-type MOS transistors 447 and 448 for data latch or storage nodes. Each of the 6T SRAM cells 398 acting as the cache memory provides the two switches 449 for writing data into it and reading data stored in it. The DPIIC chip 410 may further include a sense amplifier for reading (amplifying or detecting) data from the 6T SRAM cells 398 acting as the cache memory.

Specification for Logic Drive

Figure 13:
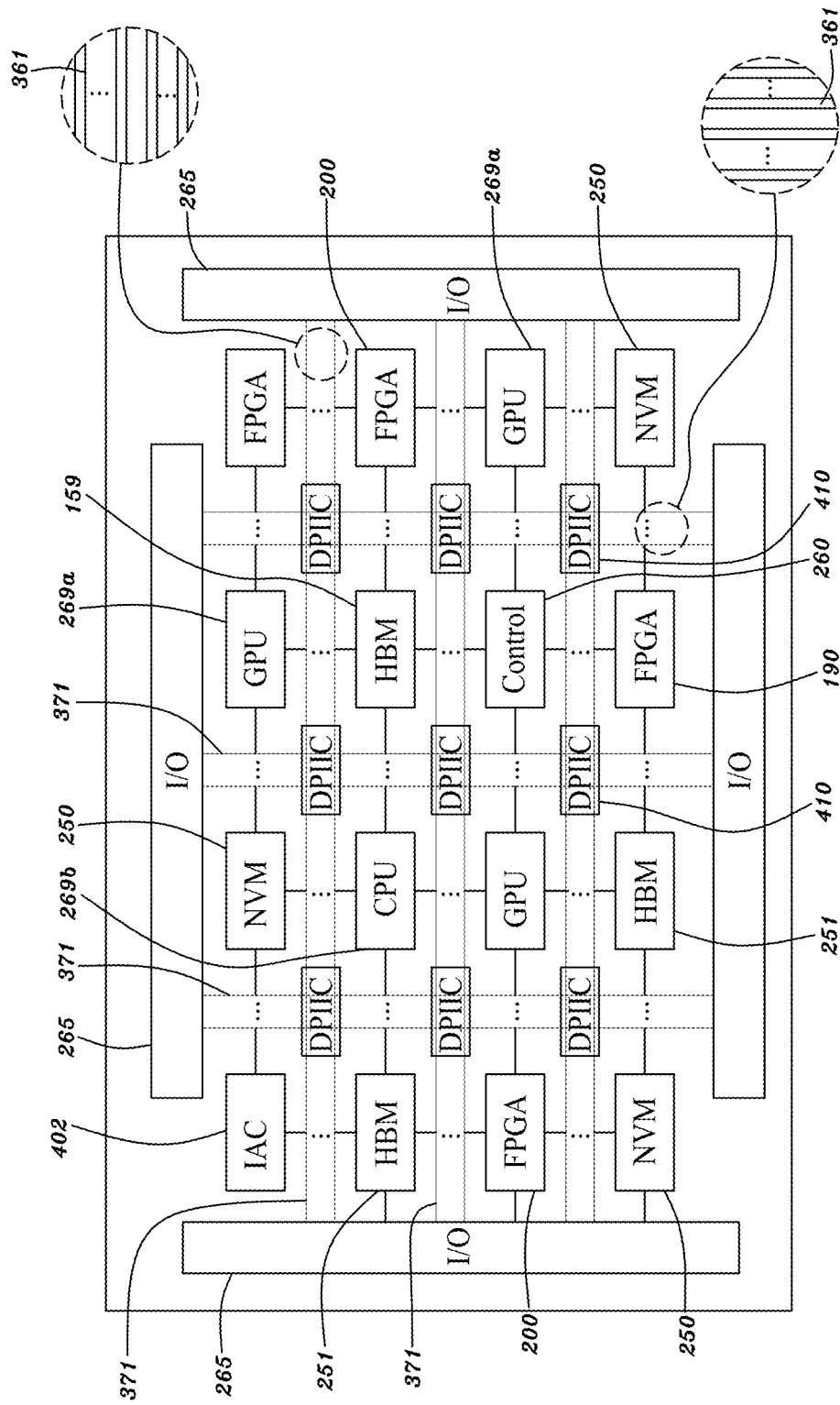
FIG. 13 is a schematically top view showing an arrangement for a logic drive in accordance with an embodiment of the present application.

FIG. 13 is a schematically top view showing arrangement for various chips packaged in a tenth type of standard commodity logic drive in accordance with an embodiment of the present application. Referring to FIG. 13, the logic drive 300 may be packaged with multiple graphic-processing unit (GPU) chips 269a and a central-processing-unit (CPU) chip 269b. Further, the logic drive 300 may be packaged with multiple high-bandwidth-memory (HBM) integrated-circuit (IC) chips 251 each arranged next to one of the GPU chips 269a for communication with said one of the GPU chips 269a in a high speed, high bandwidth and wide bitwidth. Each of the HBM IC chips 251 in the logic drive 300 may be a high speed, high bandwidth, wide bitwidth dynamic-random-access-memory (DRAM) IC chip, high speed, high bandwidth, wide bitwidth cache static-random-access-memory (SRAM) chip, high speed, high bandwidth, wide bitwidth magnetoresistive random-access-memory (MRAM) chip or high speed, high bandwidth, wide bitwidth resistive random-access-memory (RRAM) chip. The logic drive 300 may be further packaged with a plurality of the standard commodity FPGA IC chip 200 and one or more of the non-volatile memory (NVM) IC chips 250 configured to store data from data information memory (DIM) cells of the HBM IC chips 251. The logic drive 300 may be further packaged with an innovated application-specific-IC (ASIC) or customer-owned-tooling (COT) (abbreviated as IAC below) chip 402 for intellectual-property (IP) circuits, application-specific (AS) circuits, analog circuits, mixed-mode signal circuits, radio-frequency (RF) circuits, and/or transmitter, receiver or transceiver circuits, etc. The CPU chip 269b, dedicated control chip 260, standard commodity FPGA IC chips 200, GPU chips 269a, NVM IC chips 250, IAC chip 402 and HBMIC chips 251 may be arranged in an array, wherein the CPU chip 269b and dedicated control chip 260 may be arranged in a center region surrounded by a periphery region having the standard commodity FPGA IC chips 200, GPU chips 269a, NVM IC chips 250, IAC chip 402 and HBMIC chips 251 mounted thereto.

Referring to FIG. 13, the logic drive 300 may include the inter-chip interconnects 371 each extending under spaces between neighboring two of the standard commodity FPGA IC chips 200, NVM IC chips 250, dedicated control chip 260, GPU chips 269a, CPU chip 269b, IAC chip 402 and HBMIC chips 251. The logic drive 300 may include a plurality of the DPIIC chip 410 aligned with a cross of a vertical bundle of inter-chip interconnects 371 and a horizontal bundle of inter-chip interconnects 371. Each of the DPIIC chips 410 is at corners of four of the standard commodity FPGA IC chips 200, NVM IC chips 250, dedicated control chip 260, GPU chips 269a, CPU chip 269b, IAC chip 402 and HBMIC chips 251 around said each of the DPIIC chips 410. The inter-chip interconnects 371 may be formed for the programmable interconnect 361. Signal transmission may be built (1) between one of the programmable interconnects 361 of the inter-chip interconnects 371 and one of the programmable interconnects 361 of one of the standard commodity FPGA IC chips 200 via one of the small input/output (I/O) circuits 203 of said one of the standard commodity FPGA IC chips 200, and (2) between one of the programmable interconnects 361 of the inter-chip interconnects 371 and one of the programmable interconnects 361 one of the DPIIC chips 410 via one of the small input/output (I/O) circuits 203 of said one of the DPIIC chips 410.

Referring to FIG. 13, one or more of the programmable interconnects 361 of the inter-chip interconnects 371 may couple from each of the standard commodity FPGA IC chips 200 to all of the DPIIC chips 410. One or more of the programmable interconnects 361 of the inter-chip interconnects 371 may couple from each of the standard commodity FPGA IC chips 200 to the dedicated control chip 260. One or more of the programmable interconnects 361 of the inter-chip interconnects 371 may couple from each of the standard commodity FPGA IC chips 200 to both of the NVM IC chips 250. One or more of the programmable interconnects 361 of the inter-chip interconnects 371 may couple from each of the standard commodity FPGA IC chips 200 to all of the GPU chips 269a. One or more of the programmable interconnects 361 of the inter-chip interconnects 371 may couple from each of the standard commodity FPGA IC chips 200 to the CPU chip 269b. One or more of the programmable interconnects 361 of the inter-chip interconnects 371 may couple from one of the standard commodity FPGA IC chips 200 to one of the HBMIC chips 251 next to said one of the standard commodity FPGA IC chips 200 and the communication between said one of the standard commodity FPGA IC chips 200 and said one of the HBMIC chips 251 may have a data bit width of equal to or greater than 64, 128, 256, 512, 1024, 2048, 4096, 8K, or 16K. One or more of the programmable interconnects 361 of the inter-chip interconnects 371 may couple from each of the standard commodity FPGA IC chips 200 to the other of the standard commodity FPGA IC chips 200. One or more of the programmable interconnects 361 of the inter-chip interconnects 371 may couple from each of the standard commodity FPGA IC chips 200 to the IAC chip 402. One or more of the programmable interconnects 361 of the inter-chip interconnects 371 may couple from each of the DPIIC chips 410 to the dedicated control chip 260. One or more of the programmable interconnects 361 of the inter-chip interconnects 371 may couple from each of the DPIIC chips 410 to both of the NVM IC chips 250. One or more of the programmable interconnects 361 of the inter-chip interconnects 371 may couple from each of the DPIIC chips 410 to all of the GPU chips 269a. One or more of the programmable interconnects 361 of the inter-chip interconnects 371 may couple from each of the DPIIC chips 410 to the CPU chip 269b. One or more of the programmable interconnects 361 of the inter-chip interconnects 371 may couple from each of the DPIIC chips 410 to all of the HBM IC chips 251. One or more of the programmable interconnects 361 of the inter-chip interconnects 371 may couple from each of the DPIIC chips 410 to the others of the DPIIC chips 410. One or more of the programmable interconnects 361 of the inter-chip interconnects 371 may couple from each of the DPIIC chips 410 to the IAC chip 402. One or more of the programmable interconnects 361 of the inter-chip interconnects 371 may couple from the CPU chip 269b to all of the GPU chips 269a. One or more of the programmable interconnects 361 of the inter-chip interconnects 371 may couple from the CPU chip 269b to both of the NVM IC chips 250. One or more of the programmable interconnects 361 of the inter-chip interconnects 371 may couple from the CPU chip 269b to one of the HBM IC chips 251 next to the CPU chip 269b and the communication between the CPU chip 269b and said one of the HBM IC chips 251 may have a data bit width of equal to or greater than 64, 128, 256, 512, 1024, 2048, 4096, 8K, or 16K. One or more of the programmable interconnects 361 of the inter-chip interconnects 371 may couple from the CPU chip 269b to the IAC chip 402. One or more of the programmable interconnects 361 of the inter-chip interconnects 371 may couple from one of the GPU chips 269a to one of the HBM IC chips 251 next to said one of the GPU chips 269a and the communication between said one of the GPU chips 269a and said one of the HBM IC chips 251 may have a data bit width of equal to or greater than 64, 128, 256, 512, 1024, 2048, 4096, 8K, or 16K. One or more of the programmable interconnects 361 of the inter-chip interconnects 371 may couple from each of the GPU chips 269a to both of the NVM IC chips 250. One or more of the programmable interconnects 361 of the inter-chip interconnects 371 may couple from each of the GPU chips 269a to the others of the GPU chips 269a. One or more of the programmable interconnects 361 of the inter-chip interconnects 371 may couple from each of the GPU chips 269a to the IAC chip 402. One or more of the programmable interconnects 361 of the inter-chip interconnects 371 may couple from each of the NVM IC chips 250 to the dedicated control chip 260. One or more of the programmable interconnects 361 of the inter-chip interconnects 371 may couple from each of the HBM IC chips 251 to the dedicated control chip 260. One or more of the programmable interconnects 361 of the inter-chip interconnects 371 may couple from each of the GPU chips 269a to the dedicated control chip 260. One or more of the programmable interconnects 361 of the inter-chip interconnects 371 may couple from the CPU chip 269b to the dedicated control chip 260. One or more of the programmable interconnects 361 of the inter-chip interconnects 371 may couple from each of the NVM IC chips 250 to all of the HBM IC chips 251. One or more of the programmable interconnects 361 of the inter-chip interconnects 371 may couple from each of the NVM IC chips 250 to the IAC chip 402. One or more of the programmable interconnects 361 of the inter-chip interconnects 371 may couple from each of the HBM IC chips 251 to the IAC chip 402. One or more of the programmable interconnects 361 of the inter-chip interconnects 371 may couple from each of the IAC chip 402 to the dedicated control chip 260. One or more of the programmable interconnects 361 of the inter-chip interconnects 371 may couple from each of the NVM IC chips 250 to the other of the NVM IC chips 250. One or more of the programmable interconnects 361 of the inter-chip interconnects 371 may couple from each of the HBM IC chips 251 to the others of the HBM IC chips 251.

Referring to FIG. 13, the logic drive 300 may include multiple dedicated input/output (I/O) chips 265 in a peripheral region thereof surrounding a central region thereof having the standard commodity FPGA IC chips 200, NVM IC chips 250, dedicated control chip 260, GPU chips 269a, CPU chip 269b, HBM IC chips 251, IAC chip 402 and DPIIC chips 410 located therein. One or more of the programmable interconnects 361 of the inter-chip interconnects 371 may couple from each of the standard commodity FPGA IC chips 200 to all of the dedicated input/output (I/O) chips 265. One or more of the programmable interconnects 361 of the inter-chip interconnects 371 may couple from each of the DPIIC chips 410 to all of the dedicated input/output (I/O) chips 265. One or more of the programmable interconnects 361 of the inter-chip interconnects 371 may couple from each of the NVM IC chips 250 to all of the dedicated input/output (I/O) chips 265. One or more of the programmable interconnects 361 of the inter-chip interconnects 371 may couple from the dedicated control chip 260 to all of the dedicated input/output (I/O) chips 265. One or more of the programmable interconnects 361 of the inter-chip interconnects 371 may couple from each of the GPU chips 269a to all of the dedicated input/output (I/O) chips 265. One or more of the programmable interconnects 361 of the inter-chip interconnects 371 may couple from the CPU chip 269b to all of the dedicated input/output (I/O) chips 265. One or more of the programmable interconnects 361 of the inter-chip interconnects 371 may couple from each of the HBM IC chips 251 to all of the dedicated input/output (I/O) chips 265. One or more of the programmable interconnects 361 of the inter-chip interconnects 371 may couple from the IAC chip 402 to all of the dedicated input/output (I/O) chips 265.

Referring to FIG. 13, for the standard commodity logic drive 300 being in operation, each of its DPIIC chip 410 may be arranged with the 6T SRAM cells 398, as seen in FIG. 1A, acting as cache memory to store data from any of the CPU chip 269b, dedicated control chip 260, standard commodity FPGA IC chips 200, GPU chips 269a, NVM IC chips 250, IAC chip 402 and HBMIC chips 251.

Interconnection for Logic Drive

Referring to FIG. 13, one or more of the programmable interconnects 361 of the inter-chip interconnects 371 may couple one or more of the small I/O circuits 203 of each of the dedicated I/O chips 265 to one or more of the small I/O circuits 203 of all of the standard commodity FPGA IC chips 200. One or more of the programmable interconnects 361 of the inter-chip interconnects 371 may couple one or more of the small I/O circuits 203 of each of the dedicated I/O chips 265 to one or more of the small I/O circuits 203 of all of the DPIIC chips 410. One or more of the programmable interconnects 361 of the inter-chip interconnects 371 may couple one or more of the small I/O circuits 203 of each of the dedicated I/O chips 265 to one or more of the small I/O circuits 203 of all the others of the dedicated I/O chips 265.

Referring to FIG. 13, one or more of the programmable interconnects 361 of the inter-chip interconnects 371 may couple one or more of the small I/O circuits 203 of each of the DPIIC chips 410 to one or more of the small I/O circuits 203 of all of the standard commodity FPGA IC chips 200. One or more of the programmable interconnects 361 of the inter-chip interconnects 371 may couple one or more of the small I/O circuits 203 of each of the DPIIC chips 410 to one or more of the small I/O circuits 203 of all the others of the DPIIC chips 410.

Referring to FIG. 13, one or more of the programmable interconnects 361 of the inter-chip interconnects 371 may couple one or more of the small I/O circuits 203 of each of the standard commodity FPGA IC chips 200 to one or more of the small I/O circuits 203 of all the others of the standard commodity FPGA IC chips 200.

Referring to FIG. 13, one or more of the programmable interconnects 361 of the inter-chip interconnects 371 may couple one or more of the small I/O circuits 203 of the dedicated control chip 260 to one or more of the small I/O circuits 203 of all of the standard commodity FPGA IC chips 200. One or more of the programmable interconnects 361 of the inter-chip interconnects 371 may couple one or more of the small I/O circuits 203 of the dedicated control chip 260 to one or more of the small I/O circuits 203 of all of the DPIIC chips 410. One or more of the large I/O circuits 341 of the dedicated control chip 260 may couple to an external circuitry outside the logic drive 300.

Referring to FIG. 13, one or more of the large I/O circuits 341 of each of the dedicated I/O chips 265 may couple to an external circuitry outside the logic drive 300.

(1) Data Transmission for Logic Drive

Referring to FIG. 13, each of the NVM IC chips 250 may reload resulting values or first programming codes, i.e., configuration-programming-memory (CPM) data, to its CPM cells from an external circuitry outside the logic drive 300, and then each of the resulting values or first programming codes may be passed from the CPM cells of said each of the NVM IC chips 250 to one of the memory cells 490 of the standard commodity FPGA IC chips 200 for programming one of the programmable logic blocks 201 of the standard commodity FPGA IC chips 200 as illustrated in FIG. 6. Each of the NVM IC chips 250 may reload second programming codes, i.e., CPM data, to its CPM cells from an external circuitry outside the logic drive 300 and then each of the second programming codes may be passed from the CPM cells of said each of the NVM IC chips 250 to one of the memory cells 362 of the standard commodity FPGA IC chips 200 for programming one of the pass/no-pass switches 258 or cross-point switches 379 of the standard commodity FPGA IC chips 200 as illustrated in FIGS. 2A-2C, 3A, 3B, 8, 9A, 9B, 10A, 10B, 11A and 11B. Each of the NVM IC chips 250 may reload third programming codes, i.e., CPM data, to its CPM cells from an external circuitry outside the logic drive 300 and then each of the third programming codes may be passed from the CPM cells of said each of the NVM IC chips 250 to one of the memory cells 362 of the DPIIC chips 410 for programming one of the pass/no-pass switches 258 or cross-point switches 379 of the DPIIC chips 410 as illustrated in FIGS. 2A-2C, 3A, 3B and 8. No external circuitry outside the logic drive 300 may be allowed to reload the resulting values and first, second and third programming codes from any of the NVM IC chips 250 in the logic drive 300. Alternatively, an external circuitry outside the logic drive 300 may be allowed to reload the resulting values and first, second and third programming codes from one or all of the NVM IC chips 250 in the logic drive 300.

Referring to FIG. 13, the dedicated control chip 260 may generate a control command to one of its large I/O circuits 341 to drive the control command to a first one of the large I/O circuits 341 of one of the NVM IC chips 250. For said one of the NVM IC chips 250, the control command is driven by the first one of its large I/O circuits 341 to its internal circuits to command its internal circuits to pass the third programming code to a second one of its large I/O circuits 341; the second one of its large I/O circuits 341 may drive the third programming code to one of the large I/O circuits 341 of one of the dedicated I/O chips 265. For said one of the dedicated I/O chips 265, said one of its large I/O circuits may drive the third programming code to one of its small I/O circuits 203; said one of its small I/O circuits 203 may drive the third programming code to one of the small I/O circuits 203 of one of the DPIIC chips 410. For said one of the DPIIC chips 410, said one of its small I/O circuits 203 may drive the third programming code to one of its memory cells 362 in one of its memory-array blocks 423 as seen in FIG. 12; the third programming code may be stored in said one of its memory cells 362 for programming one of its pass/no-pass switches 258 and/or cross-point switches 379 as illustrated in FIGS. 2A-2C, 3A, 3B, 8, 9A, 9B, 10A, 10B, 11A and 11B.

Alternatively, referring to FIG. 13, the dedicated control chip 260 may generate a control command to one of its large I/O circuits 341 to drive the control command to a first one of the large I/O circuits 341 of one of the NVM IC chips 250. For said one of the NVM IC chips 250, the control command is driven by the first one of its large I/O circuits 341 to its internal circuits to command its internal circuits to pass the second programming code to a second one of its large I/O circuits 341; the second one of its large I/O circuits 341 may drive the second programming code to one of the large I/O circuits 341 of one of the dedicated I/O chips 265. For said one of the dedicated I/O chips 265, said one of its large I/O circuits may drive the second programming code to one of its small I/O circuits 203; said one of its small I/O circuits 203 may drive the second programming code to one of the small I/O circuits 203 of one of the standard commodity FPGA IC chips 200. For said one of the standard commodity FPGA IC chips 200, said one of its small I/O circuits 203 may drive the second programming code to one of its memory cells 362; the second programming code may be stored in said one of its memory cells 362 for programming one of its pass/no-pass switches 258 and/or cross-point switches 379 as illustrated in FIGS. 2A-2F, 3A-3D and 7A-7C.

Alternatively, referring to FIG. 13, the dedicated control chip 260 may generate a control command to one of its large I/O circuits 341 to drive the control command to a first one of the large I/O circuits 341 of one of the NVM IC chips 250. For said one of the NVM IC chips 250, the control command is driven by the first one of its large I/O circuits 341 to its internal circuits to command its internal circuits to pass the resulting value or first programming code to a second one of its large I/O circuits 341; the second one of its large I/O circuits 341 may drive the resulting value or first programming code to one of the large I/O circuits 341 of one of the dedicated I/O chips 265. For said one of the dedicated I/O chips 265, said one of its large I/O circuits may drive the resulting value or first programming code to one of its small I/O circuits 203; said one of its small I/O circuits 203 may drive the resulting value or first programming code to one of the small I/O circuits 203 of one of the standard commodity FPGA IC chips 200. For said one of the standard commodity FPGA IC chips 200, said one of its small I/O circuits 203 may drive the resulting value or first programming code to one of its memory cells 490; the resulting value or first programming code may be stored in said one of its memory cells 490 for programming one of its programmable logic blocks 201 as illustrated in FIG. 6.

(2) Data Transmission in Operation

Referring to FIG. 13, one of the dedicated I/O chips 265 may have one of its large I/O circuits 341 to drive a signal from an external circuitry outside the logic drive 300 to one of its small I/O circuits 203. For said one of the dedicated I/O chips 265, said one of its small I/O circuits 203 may drive the signal to a first one of the small I/O circuits 203 of one of the DPIIC chips 410 via one or more of the programmable interconnects 361 of the inter-chip interconnects 371. For said one of the dedicated DPIIC chips 410, the first one of its small I/O circuits 203 may drive the signal to one of its cross-point switches 379 via a first one of the programmable interconnects 361 of its intra-chip interconnects; said one of its cross-point switches 379 may switch the signal from the first one of the programmable interconnects 361 of its intra-chip interconnects to a second one of the programmable interconnects 361 of its intra-chip interconnects to be passed to a second one of its small I/O circuits 203; the second one of its small I/O circuits 203 may drive the signal to one of the small I/O circuits 203 of one of the standard commodity FPGA IC chips 200 via one or more of the programmable interconnects 361 of the inter-chip interconnects 371. For said one of the standard commodity FPGA IC chips 200, said one of its small I/O circuits 203 may drive the signal to one of its cross-point switches 379 through a first portion of the programmable interconnects 361; said one of its cross-point switches 379 may switch the signal to pass from the first portion of the programmable interconnects 361 to a second portion of the programmable interconnects 361 to be passed to one of the inputs A0 and A1 of one of its programmable logic blocks (LB) 201 as seen in FIG. 6.

Referring to FIG. 13, in another aspect, for a first one of the standard commodity FPGA IC chips 200, one of its programmable logic blocks (LB) 201 as seen in FIG. 6 may generate an output Dout to be passed to one of its cross-point switches 379 via a first portion of the programmable interconnects 361 of its intra-chip interconnects; said one of its cross-point switches 379 may switch the output Dout to pass from the first portion of the programmable interconnects 361 of its intra-chip interconnects to a second portion of the programmable interconnects 361 of its intra-chip interconnects to be passed to one of its small I/O circuits 203; said one of its small I/O circuits 203 may drive the output Dout to a first one of the small I/O circuits 203 of one of the DPIIC chips 410 via one or more of the programmable interconnects 361 of the inter-chip interconnects 371. For said one of the DPIIC chips 410, the first one of its small I/O circuits 203 may drive the output Dout to one of its cross-point switches 379 via a first portion of the programmable interconnects 361 of its intra-chip interconnects; said one of its cross-point switches 379 may switch the output Dout to pass from the first portion of the programmable interconnects 361 of its intra-chip interconnects to a second portion of the programmable interconnects 361 of its intra-chip interconnects to be passed to a second one of its small I/O circuits 203; the second one of its small I/O circuits 203 may drive the output Dout to one of the small I/O circuits 203 of a second one of the standard commodity FPGA IC chips 200 via one or more of the programmable interconnects 361 of the inter-chip interconnects 371. For the second one of the FPGA IC chips 200, said one of its small I/O circuits 203 may drive the output Dout to one of its cross-point switches 379 through a first portion of the programmable interconnects 361 of its intra-chip interconnects 502; said one of its cross-point switches 379 may switch the output Dout to pass from the first portion of the programmable interconnects 361 of its intra-chip interconnects to a second portion of the programmable interconnects 361 of its intra-chip interconnects to be passed to one of the inputs A0 and A1 of one of its programmable logic blocks (LB) 201 as seen in FIG. 6.

Referring to FIG. 13, in another aspect, for one of the standard commodity FPGA IC chips 200, one of its programmable logic blocks (LB) 201 as seen in FIG. 6 may generate an output Dout to be passed to one of its cross-point switches 379 via a first portion of the programmable interconnects 361 of its intra-chip interconnects; said one of its cross-point switches 379 may switch the output Dout to pass from the first portion of the programmable interconnects 361 of its intra-chip interconnects to a second portion of the programmable interconnects 361 of its intra-chip interconnects to be passed to one of its small I/O circuits 203; said one of its small I/O circuits 203 may drive the output Dout to a first one of the small I/O circuits 203 of one of the DPIIC chips 410 via one or more of the programmable interconnects 361 of the inter-chip interconnects 371. For said one of the DPIIC chips 410, the first one of its small I/O circuits 203 may drive the output Dout to one of its cross-point switches 379 via a first portion of the programmable interconnects 361 of its intra-chip interconnects; said one of its cross-point switches 379 may switch the output Dout to pass from the first portion of the programmable interconnects 361 of its intra-chip interconnects to a second portion of the programmable interconnects 361 of its intra-chip interconnects to be passed to a second one of its small I/O circuits 203; the second one of its small I/O circuits 203 may drive the output Dout to one of the small I/O circuits 203 of one of the dedicated I/O chips 265 via one or more of the programmable interconnects 361 of the inter-chip interconnects 371. For said one of the dedicated I/O chips 265, said one of its small I/O circuits 203 may drive the output Dout to one of its large I/O circuits 341 to be passed to an external circuitry outside the logic drive 300.

Specification for Processes for Fabricating Semiconductor Chip

Figure 14:
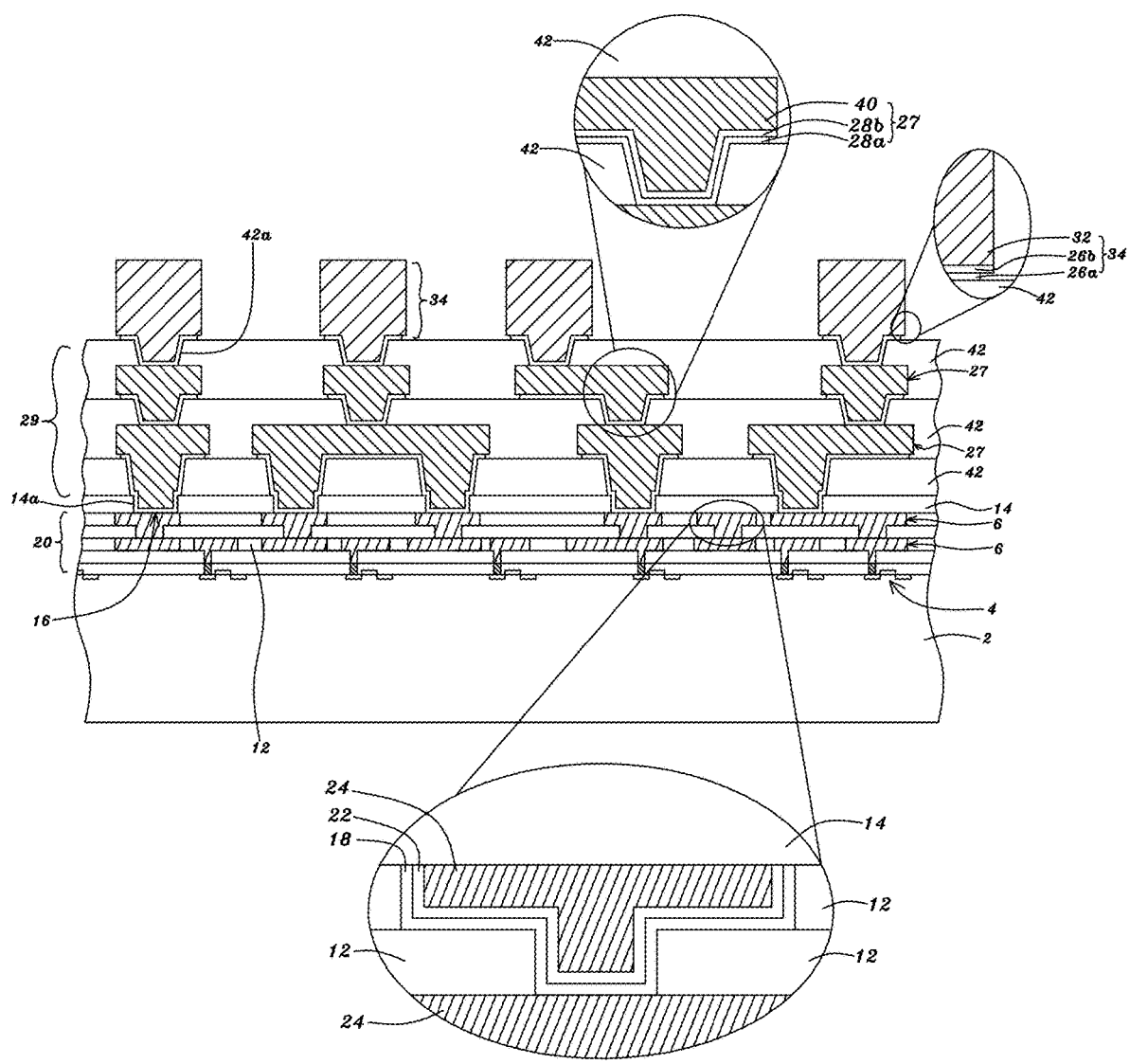
FIG. 14 is a schematically cross-sectional view showing a semiconductor chip in accordance with an embodiment of the present application.

FIG. 14 is a schematically cross-sectional view showing a semiconductor chip in accordance with an embodiment of the present application. Referring to FIG. 14, the standard commodity FPGA IC chips 200, DPIIC chips 410, dedicated I/O chips 265, dedicated control chip 260, NVM IC chips 250, DRAM IC chips 321, IAC chip 402, HBM IC chips 251, GPU chips 269a and CPU chip 269b as seen in FIG. 13 may have a structure for a semiconductor chip 100 mentioned as below. The semiconductor chip 100 may include (1) a semiconductor substrate 2, such as silicon substrate, GaAs substrate, SiGe substrate or Silicon-On-Insulator (SOI) substrate; (2) multiple semiconductor devices 4 in or over a semiconductor-device area of the semiconductor substrate 2; (3) a first interconnection scheme 20 for a chip (FISC) over the semiconductor substrate 2, provided with one or more interconnection metal layers 6 coupling to the semiconductor devices 4 and one or more insulating dielectric layers 12 each between neighboring two of the interconnection metal layers 6; (4) a passivation layer 14 over the first interconnection scheme (FISC) 20, wherein the first interconnection scheme 20 has multiple first metal pads at bottoms of multiple openings 14a in the passivation layer 14; (5) a second interconnection scheme 29 for a chip (SISC) optionally provided over the passivation layer 14, provided with one or more interconnection metal layers 27 coupling to the first metal pads of the first interconnection scheme (FISC) 20 through the openings 14a and one or more polymer layers 42 each between neighboring two of the interconnection metal layers 27, under a bottommost one of the interconnection metal layers 27 or over a topmost one of the interconnection metal layers 27, wherein the second interconnection scheme 29 has multiple second metal pads at bottoms of multiple openings 42a in the topmost one of its polymer layers 42; and (6) multiple micro-bumps or micro-pillars 34 on the second metal pads of the second interconnection scheme 29 (SISC) or, if the SISC 29 is not provided, on the first metal pads of the first interconnection scheme 20 (FISC).

Referring to FIG. 14, the semiconductor devices 4 may include a memory cell, a logic circuit, a passive device, such as resistor, capacitor, inductor or filter, or an active device, such as p-channel and/or n-channel MOS devices. The semiconductor devices 4 may compose the multiplexer 211 of the programmable logic blocks (LB) 201, memory cells 490 for the look-up table 210 of the programmable logic blocks (LB) 201, memory cells 362 for the cross-point switches 379 and small I/O circuits 203, as illustrated in FIGS. 1A-11B, for each of its standard commodity FPGA IC chips 200 as seen in FIG. 13. The semiconductor devices 4 may compose the memory cells 362 for the cross-point switches 379 and small I/O circuits 203, as illustrated in FIGS. 1A-5B and 8, for each of its DPIIC chips 410 as seen in FIGS. 12 and 13. The semiconductor devices 4 may compose the large and small I/O circuits 341 and 203, as illustrated in FIGS. 5A and 5B, for each of the dedicated I/O chips 265 as seen in FIG. 13.

Referring to FIG. 14, each of the interconnection metal layers 6 of the FISC 20 may include (1) a copper layer 24 having lower portions in openings in a lower one of the insulating dielectric layers 12, such as SiOC layers having a thickness between 3 nm and 500 nm, and upper portions having a thickness between 3 nm and 500 nm over the lower one of the insulating dielectric layers 12 and in openings in an upper one of the insulating dielectric layers 12, (2) an adhesion layer 18, such as titanium or titanium nitride having a thickness between 1 nm and 50 nm, at a bottom and sidewall of each of the lower portions of the copper layer 24 and at a bottom and sidewall of each of the upper portions of the copper layer 24, and (3) a seed layer 22, such as copper, between the copper layer 24 and the adhesion layer 18, wherein the copper layer 24 has a top surface substantially coplanar with a top surface of the upper one of the insulating dielectric layers 12.

Referring to FIG. 14, the passivation layer 14 containing a silicon-nitride, SiON or SiCN layer having a thickness greater than 0.3 µm for example may protect the semiconductor devices 4 and the interconnection metal layers 6 from being damaged by moisture foreign ion contamination, or from water moisture or contamination form external environment, for example sodium mobile ions. Each of the openings 14a in the passivation layer 14 may have a transverse dimension, from a top view, of between 0.5 and 20 µm.

Referring to FIG. 14, each of the interconnection metal layers 27 of the SISC 29 may include (1) a copper layer 40 having lower portions in openings in one of the polymer layers 42 having a thickness between 0.3 µm and 20 µm, and upper portions having a thickness 0.3 µm and 20 µm over said one of the polymer layers 42, (2) an adhesion layer 28a, such as titanium or titanium nitride having a thickness between 1 nm and 50 nm, at a bottom and sidewall of each of the lower portions of the copper layer 40 and at a bottom of each of the upper portions of the copper layer 40, and (3) a seed layer 28b, such as copper, between the copper layer 40 and the adhesion layer 28a, wherein said each of the upper portions of the copper layer 40 may have a sidewall not covered by the adhesion layer 28a.

Referring to FIG. 14, each of the micro-bumps or micro-pillars 34 may be of various types. A first type of micro-bumps or micro-pillars 34 may include (1) an adhesion layer 26a, such as titanium (Ti) or titanium nitride (TiN) layer having a thickness between 1 nm and 50 nm, on the second metal pads of the second interconnection scheme 29 (SISC) or, if the SISC 29 is not provided, on the first metal pads of the first interconnection scheme 20 (FISC), (2) a seed layer 26b, such as copper, on the adhesion layer 26a and (3) a copper layer 32 having a thickness between 1 µm and 60 µm on the seed layer 26b. Alternatively, a second type of micro-bumps or micro-pillars 34 may include the adhesion layer 26a, seed layer 26b and copper layer 32 as mentioned above, and may further include a tin-containing solder cap 33 shown in FIG. 16A such as tin or a tin-silver alloy having a thickness between 1 µm and 50 µm on the copper layer 32.

Embodiment for Interposer

One or more semiconductor chips 100 as seen in FIG. 14 may be packaged using an interposer. The interposer may be provided with high density interconnects for fan-out of the semiconductor chips 100 and interconnection between two of the semiconductor chips 100.

Figure 15:
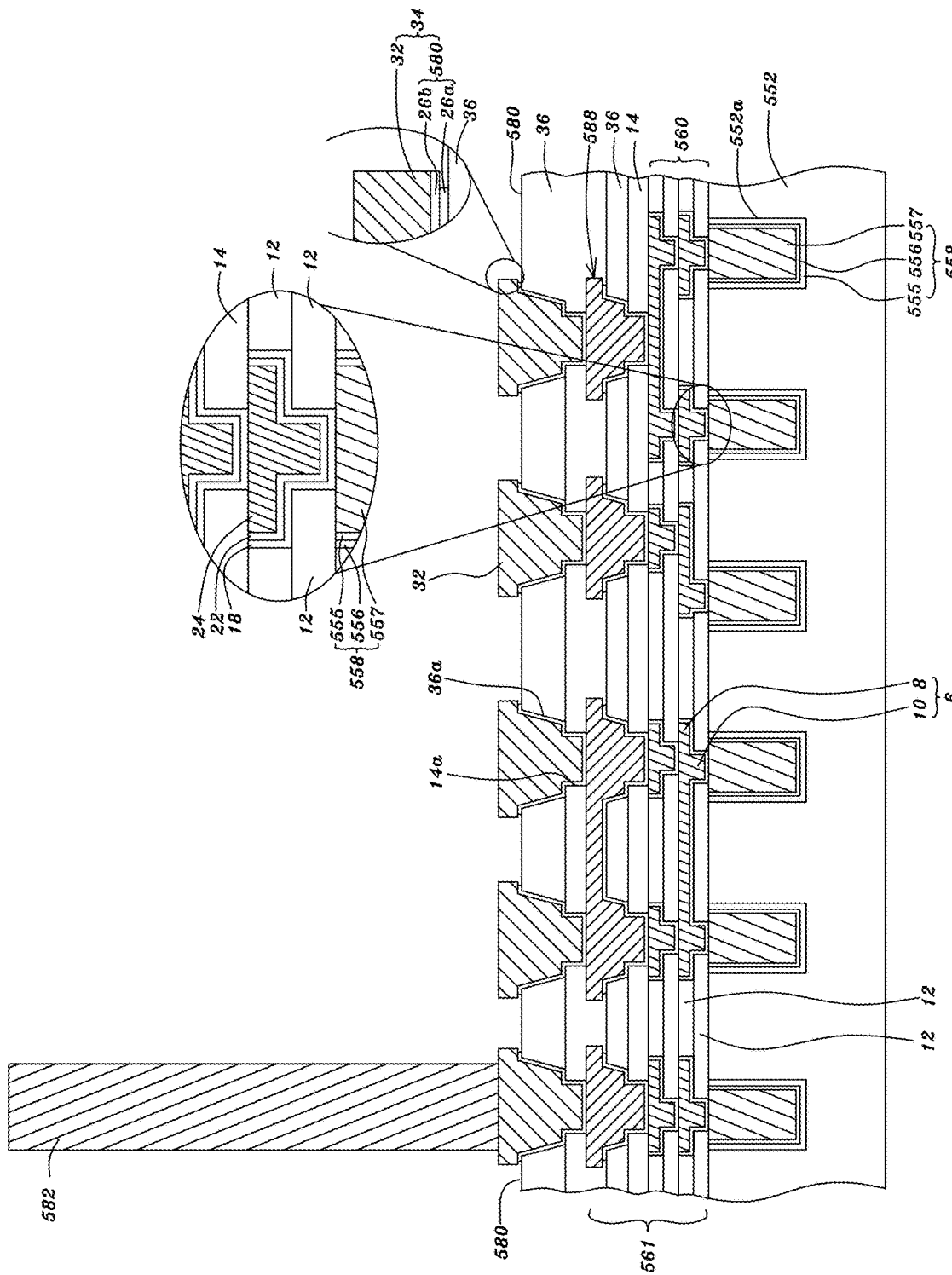
FIG. 15 is a schematically cross-sectional views showing an interposer in accordance with various embodiments of the present application.

FIG. 15 is a schematically cross-sectional view showing an interposer in accordance with various embodiments of the present application. Referring to FIG. 15, an interposer 551 may include (1) a semiconductor substrate 552, such as silicon wafer; (2) multiple vias 558 in the semiconductor substrate 552; (3) a first interconnection scheme 560 for an interposer (FISIP) over the semiconductor substrate 552, provided with one or more interconnection metal layers 6 coupling to the vias 558 and one or more insulating dielectric layers 12 each between neighboring two of the interconnection metal layers 6, wherein the specification and process for the interconnection metal layers 6 and insulating dielectric layers 12 for the FISIP 560 may be referred to those for the FISC 20 as illustrated in FIG. 14; (4) a passivation layer 14 over the first interconnection scheme (FISIP) 560, wherein the first interconnection scheme 20 has multiple third metal pads at bottoms of multiple openings 14a in the passivation layer 14, wherein the specification and process for the passivation layer 14 over the FISIP 560 may be referred to those for the passivation layer 14 over the FISC 20 as illustrated in FIG. 14; (5) a second interconnection scheme 588 for an interposer (SISIP) optionally provided over the passivation layer 14, provided with one or more interconnection metal layers 27 coupling to the third metal pads of the first interconnection scheme (FISIP) 560 through the openings 14a and one or more polymer layers 42 each between neighboring two of the interconnection metal layers 27, under a bottommost one of the interconnection metal layers 27 or over a topmost one of the interconnection metal layers 27, wherein the second interconnection scheme (SISIP) 588 has multiple fourth metal pads at bottoms of multiple openings 42a in the topmost one of its polymer layers 42, wherein the specification and process for the interconnection metal layers 27 and polymer layers 14 for the SISIP 588 may be referred to those for the SISC 29 as illustrated in FIG. 14; (6) multiple micro-bumps or micro-pillars 34 on the fourth metal pads of the second interconnection scheme (SISIP) 588 or, if the second interconnection scheme (SISIP) 588 is not provided, on the third metal pads of the first interconnection scheme (FISIP) 560, wherein the specification and process for the micro-bumps or micro-pillars 34 over the SISIP 588 may be referred to those for the micro-bumps or micro-pillars 34 of the first type over the SISC 29 as illustrated in FIG. 14; and (7) multiple through package vias (TPVs) 582 each having a copper layer with a thickness between 5 μm and 300 μm on the copper layer 32 of some of the micro-bumps or micro-pillars 34 of the interposer 551.

Referring to FIG. 15, each of the vias 558 may include (1) a copper layer 557 in the semiconductor substrate 552, (2) an insulating layer 555 at a sidewall and bottom of the copper layer 557 and in the semiconductor substrate 552 and (3) an adhesion/seed layer 556 at the sidewall and bottom of the copper layer 557 and between the copper layer 557 and the insulating layer 555. Each of the vias 588 or the copper layer 577 may have a depth between 30 μm and 150 μm, or 50 μm and 100 μm, and a diameter or largest transverse size between 5 μm and 50 μm, or 5 μm and 15 μm. The adhesion/seed layer 556 may include (1) a titanium (Ti) or titanium nitride (TiN) layer for adhesion with a thickness between 1 nm to 50 nm at the sidewall and bottom of the copper layer 557 and between the copper layer 557 and the insulating layer 555, and (2) a seed layer, such as copper, with a thickness between 3 nm and 200 nm at the sidewall and bottom of the copper layer 557 and between the copper layer 557 and the titanium (Ti) or titanium nitride (TiN) layer. The insulating layer 555 may include a thermally grown silicon oxide ($SiO_2$) and/or a CVD silicon nitride ($Si_3N_4$), for example.

Chip-to-Interposer Assembly

Figure 16A:
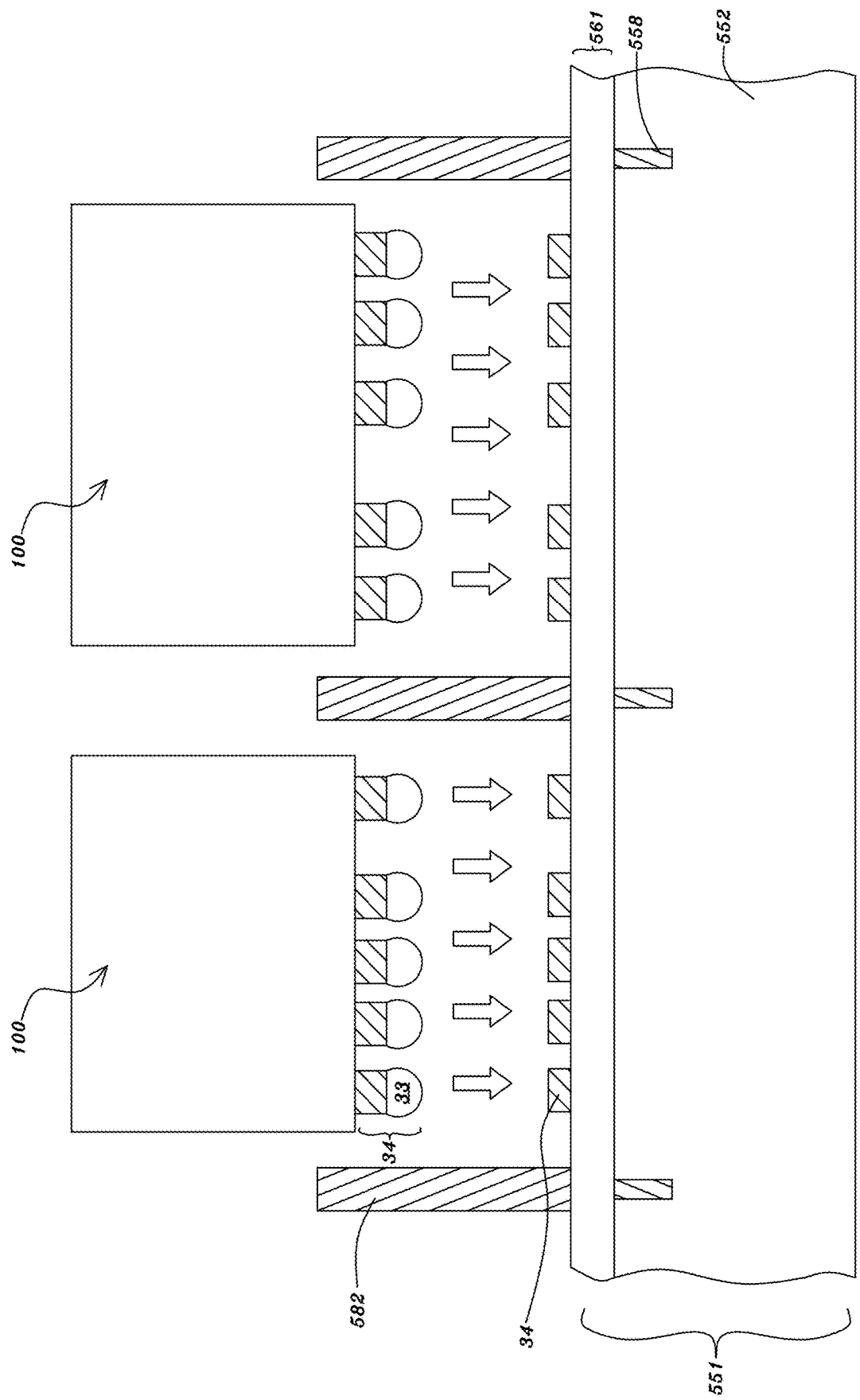
FIGS. 16A-16B are schematically cross-sectional views showing a process for fabricating a chip package for a logic drive in accordance with an embodiment of the present application.
Figure 16B:
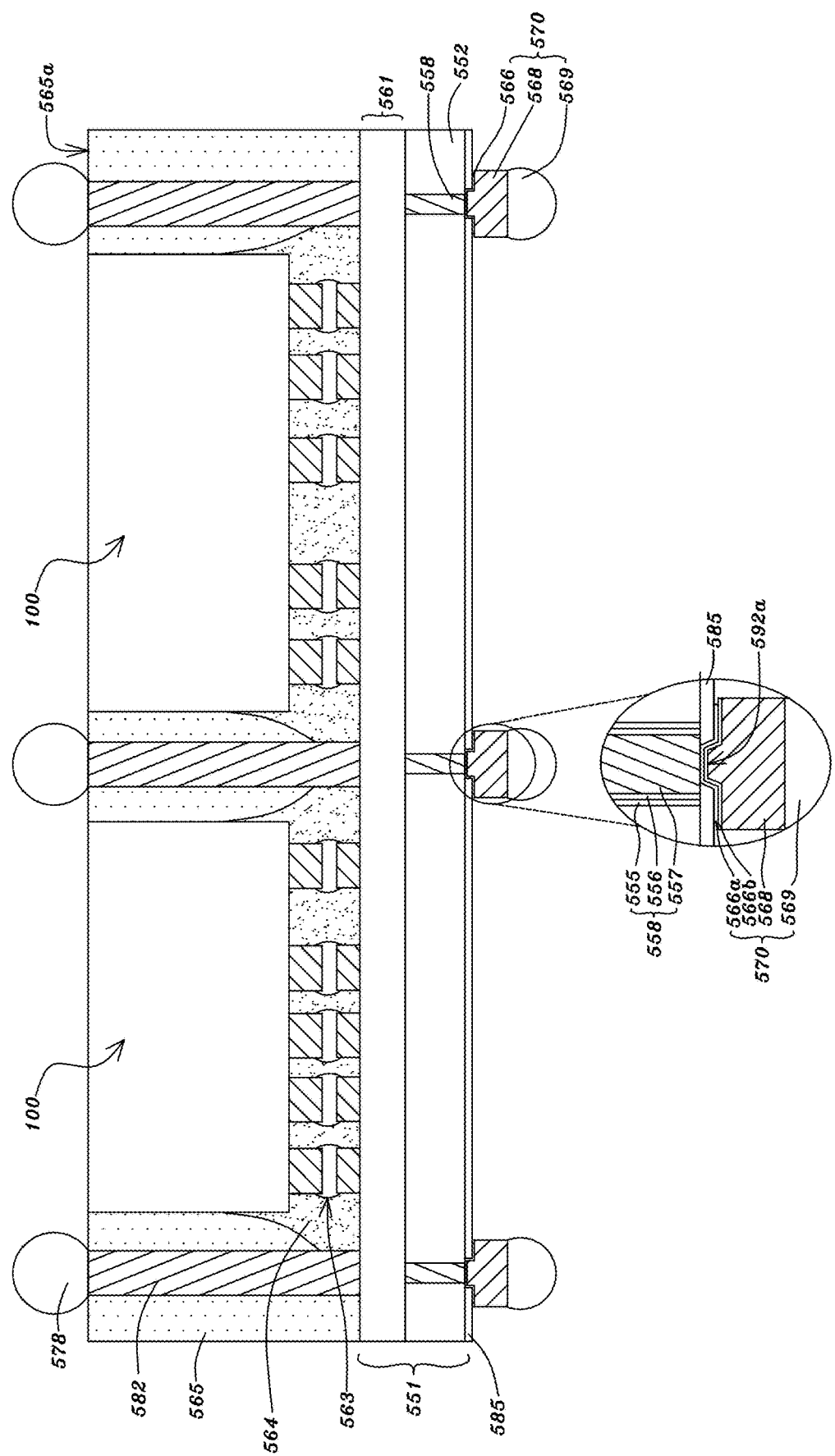

FIGS. 16A-16B are schematically cross-sectional views showing a process for fabricating a chip package for a logic drive in accordance with an embodiment of the present application. First, referring to FIG. 16A, each of the semiconductor chips 100 as seen in FIG. 14 may have its micro-pillars or micro-bumps 34 of the second type to be bonded to the first type of micro-pillars or micro-bumps 34 preformed on the interposer 551. An interconnection scheme 561 shown in FIGS. 16A-16B represents the first interconnection scheme (FISIP) 561 and second interconnection scheme (SISIP) 588 as seen in FIG. 15 or, if the second interconnection scheme (SISIP) 588 is not provided, represents the first interconnection scheme (FISIP) 561 as seen in FIG. 15.

Referring to FIG. 16A, each of the semiconductor chips 100 may have the micro-pillars or micro-bumps 34 of the second type to be bonded to the first type of micro-pillars or micro-bumps 34 of the interposer 551. For example, the second type of micro-pillars or micro-bumps 34 of said each of the semiconductor chips 100 may have the tin-containing solder cap 33 to be bonded onto the copper layer 32 of the micro-pillars or micro-bumps 34 of the first type preformed on the interposer 551 into multiple bonded contacts 563 as seen in FIG. 16B, wherein each of the micro-pillars or micro-bumps 34 of the second type of said each of the semiconductor chips 100 may have its copper layer 32 having a thickness greater than that of the copper layer 32 of the micro-pillars or micro-bumps 34 of the first type preformed on the interposer 551. Next, an underfill 564, such as epoxy resins or compounds, may be filled into a gap between each of the semiconductor chips 100 and the interposer 551, enclosing the bonded contacts 563. Next, a polymer layer 565, e.g., resin or compound, may be applied to fill a gap between each neighboring two of the semiconductor chips 100, to fill a gap between each neighboring two of the through package vias (TPVs) 582, and to cover a backside of said each of the semiconductor chips 100 and a top of each of the through package vias (TPVs) 582. Next, a polishing or grinding process may be applied to remove a top portion of the polymer layer 565 and a top portion of one or more of the semiconductor chips 100 until the top of said each of the through package vias (TPVs) 582 is exposed. Next, a chemically-and-mechanically-polishing (CMP) process or a wafer backside grinding process is applied to a backside of the interposer 551 until each of the vias 558 is exposed, that is, its insulating layer 555 at its backside is removed into an insulating lining surrounding its adhesion/seed layer 556 and copper layer 557, and a bottom end of its copper layer 557 is exposed. Next, a polymer layer 585 may be formed on a bottom surface of the interposer 551, and multiple openings 585a in the polymer layer 585 may expose the copper layer 557 of the vias 558 of the interposer 551. Next, multiple metal bumps 570 may be formed on and under the copper layer 557 of the vias 558. Each of the metal bumps 570 may be of various types. A first type of metal bumps 570 may include (1) an adhesion layer 566a, such as titanium (Ti) or titanium nitride (TiN) layer having a thickness between 1 nm and 200 nm, on and under the copper layer 557 of the vias 558, (2) a seed layer 566b, such as copper, on and under the adhesion layer 566a and (3) a copper layer 568 having a thickness between 1 μm and 50 μm on and under the seed layer 566b. Alternatively, a second type of metal bumps 570 may include the adhesion layer 566a, seed layer 566b and copper layer 568 as mentioned above, and may further include a tin-containing solder cap 569 such as tin or a tin-silver alloy having a thickness between 1 μm and 50 μm on and under the copper layer 568. Next, multiple metal bumps 578, such as tin-containing solder, may be optionally formed on the tops of the through package vias (TPVs) 582.

Figure 17:
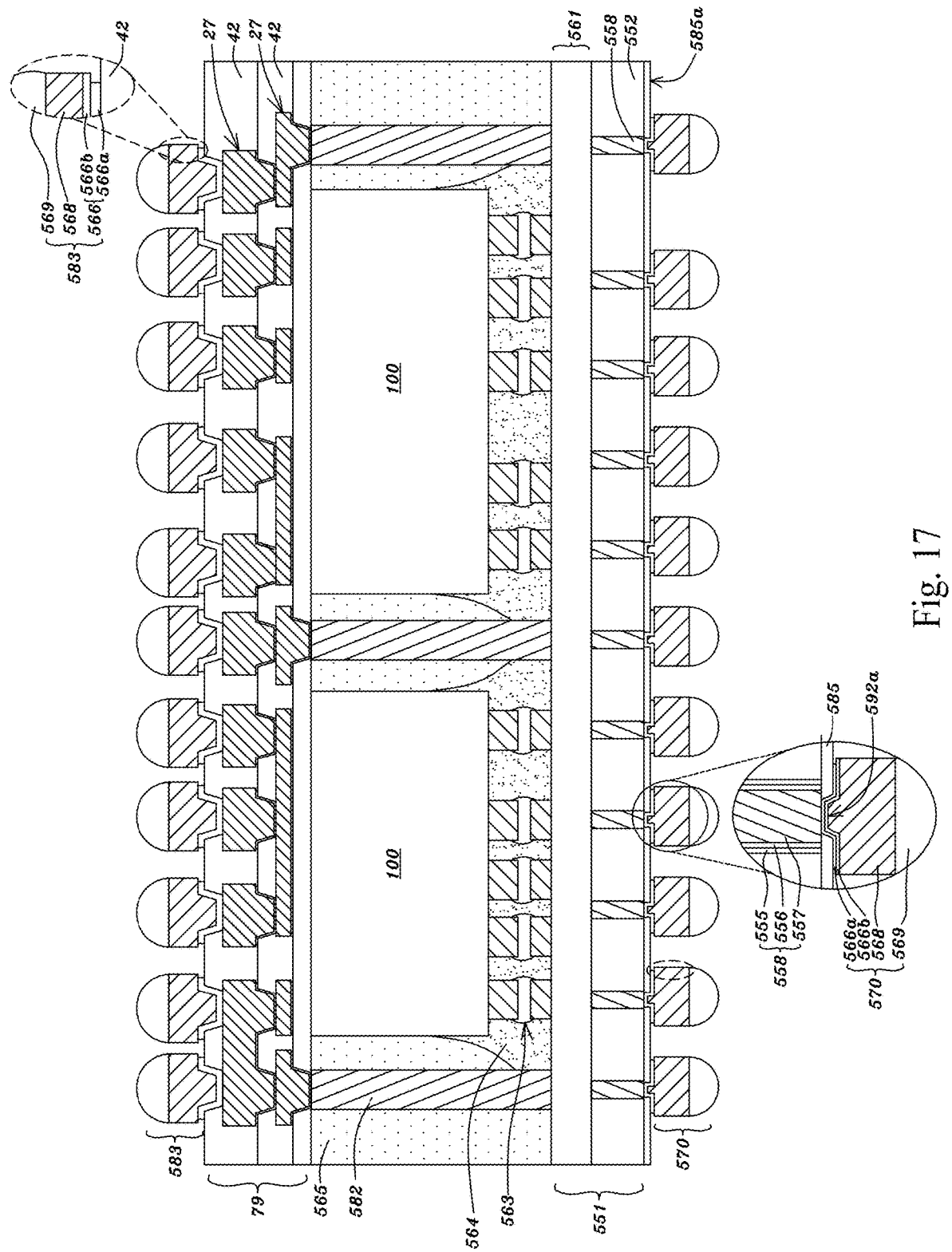
FIG. 17 is a schematically cross-sectional view showing a chip package for a logic drive in accordance with another embodiment of the present application.

Alternatively, FIG. 17 is a schematically cross-sectional view showing a chip package for a logic drive in accordance with another embodiment of the present application. Referring to FIGS. 16B and 17, after the polishing or grinding process applied to the polymer layer 565 is performed as illustrated in FIG. 16B and before the CMP process or wafer backside grinding process applied to the interposer 551 is performed as illustrated in FIG. 16B, a backside metal interconnection scheme 79 for the logic drive 300 (BISD) as seen in FIG. 17 may be formed on and above the semiconductor chips 100, polymer layer 565 and through package vias (TPVs) 582. The specification for the backside metal interconnection scheme (BISD) 79 may be referred to the specification for the SISC 29 as illustrated in FIG. 14. The backside metal interconnection scheme (BISD) 79 may include one or more interconnection metal layers 27 coupling to the through package vias (TPVs) 582 and one or more polymer layers 42 each between neighboring two of the interconnection metal layers 27, under a bottommost one of the interconnection metal layers 27 or over a topmost one of the interconnection metal layers 27, wherein the backside metal interconnection scheme (BISD) 79 has multiple fifth metal pads at bottoms of multiple openings 42a in the topmost one of its polymer layers 42.

Figure 18:
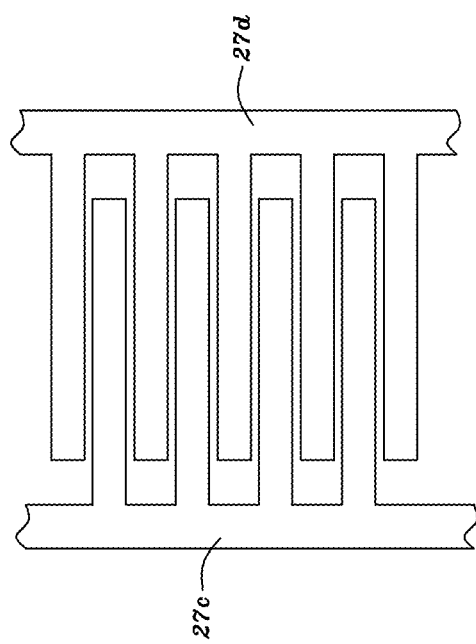
FIG. 18 is a top view showing a metal plane in accordance with an embodiment of the present application.

Next, referring to FIG. 17, multiple metal bumps 583 may be optionally formed on the fifth metal pads of the backside metal interconnection scheme (BISD) 79. The specification for the metal bumps 583 may be referred to the specification for the metal bumps 570 as illustrated in FIG. 16B. FIG. 18 is a top view showing a metal plane in accordance with an embodiment of the present application. Referring to FIG. 18, one of the interconnection metal layers 27 of the BISD 79 as seen in FIG. 17 may include two metal planes 27c and 27d used as a power plane and ground plane respectively, wherein the metal planes 27c and 27d may have a thickness, for example, between 5 µm and 50 µm. Each of the metal planes 27c and 27d may be layout as an interlaced or interleaved shaped structure or fork-shaped structure, that is, each of the metal planes 27c and 27d may have multiple parallel-extension sections and a transverse connection section coupling the parallel-extension sections. One of the metal planes 27c and 27d may have one of the parallel-extension sections arranged between neighboring two of the parallel-extension sections of the other of the metal planes 27c and 27d.

Next, referring to FIG. 17, the chemically-and-mechanically-polishing (CMP) process or a wafer backside grinding process is applied to the backside of the interposer 551 as illustrated in FIG. 16B. Next, the polymer layer 585 and metal bumps 570 as illustrated in FIG. 16B may be formed at a bottom side of the interposer 551.

Referring to FIG. 17, since the semiconductor chips 100 may include the FPGA IC chips 200 and DPIIC chips 410 as seen in FIG. 13, and the interconnection metal layers 27 of the BISD 79 as seen in FIG. 17 and the interconnection metal layers 6 and/or 27 of the FISIP 560 and/or SISIP 588 of the interposer 551 as seen in FIG. 15 are provided for the programmable interconnects 361 of the inter-chip interconnects 371 as seen in FIG. 13 coupling to the pass/no-pass switches 250 and/or cross-point switches 279 of the FPGA IC chips 200 and/or DPIIC chips 410 and/or to the programmable logic blocks 201 of the FPGA IC chips 200. Accordingly, the fifth metal pads and/or metal bumps 583, the metal bumps 570 and/or vias 558 and the through package via (TPV) 582 may couple to the pass/no-pass switches 250 and/or cross-point switches 279 of the FPGA IC chips 200 and/or DPIIC chips 410 and/or to the programmable logic blocks 201 of the FPGA IC chips 200 through the interconnection metal layers 27 of the BISD 79 and the interconnection metal layers 6 and/or 27 of the FISIP 560 and/or SISIP 588 of the interposer 551 to become programmable. For more elaboration, FIG. 19A is a circuit diagram showing multiple programmable interconnects formed from multiple inter-chip interconnects, coupling to a pass/no-pass switch of a FPGA IC chip or DPIIC chip in accordance with an embodiment of the present application. FIG. 19B is a circuit diagram showing multiple programmable interconnects formed from multiple inter-chip interconnects, coupling to a cross-point switch of a FPGA IC chip or DPIIC chip in accordance with an embodiment of the present application.

Referring to FIG. 19A, the programmable interconnects 361 may a first one divided into two sections 361a and 361'a coupling to each other and a second one divided into three sections 361b, 361'b1 and 361'b2 coupling to one another, wherein the FPGA IC chip 200 or DPIIC chip 410 may include the pass/no-pass switch 258 configured to switch on or off the connection between the first and second programmable interconnects. The section 361a of the first programmable interconnect may be provided by the interconnection metal layers 6 and/or 27 of FISC 20 and/or SISC 29, as seen in FIG. 14, of the FPGA IC chip 200 or DPIIC chip 410. The section 361'a of the first programmable interconnect may be provided by the interconnection metal layers 27 of the BISD 79 as seen in FIG. 17 and/or the interconnection metal layers 6 and/or 27 of the FISIP 560 and/or SISIP 588 of the interposer 551 as seen in FIG. 15. The section 361b of the second programmable interconnect may be provided by the interconnection metal layers 6 and/or 27 of FISC 20 and/or SISC 29, as seen in FIG. 14, of the FPGA IC chip 200 or DPIIC chip 410. The section 361'b1 of the second programmable interconnect may be provided by the interconnection metal layers 6 and/or 27 of the FISIP 560 and/or SISIP 588 of the interposer 551, as seen in FIG. 15, under the FPGA IC chip 200 or DPIIC chip 410. The section 361'b2 of the second programmable interconnect may be provided by the interconnection metal layers 6 and/or 27 of the FISIP 560 and/or SISIP 588 of the interposer 551, as seen in FIG. 15, not under the FPGA IC chip 200 or DPIIC chip 410.

Referring to FIG. 19B, the FPGA IC chip 200 or DPIIC chip 410 may include the cross-point switch 379 configured to pass data in four directions, and the programmable interconnects 361 may a first one divided into two sections 361a and 361'a coupling to each other and to the node N23, a second one divided into two sections 361b and 361'b coupling to each other and to the node N25, a third one divided into two sections 361c and 361'c coupling to each other and to the node N26 and a fourth one divided into two sections 361d and 361'd coupling to each other and to the node N24. The sections 361a, 361b, 361c and 361d of the first, second, third and fourth programmable interconnects may be provided by the interconnection metal layers 6 and/or 27 of FISC 20 and/or SISC 29, as seen in FIG. 14, of the FPGA IC chip 200 or DPIIC chip 410. The sections 361'a, 361'b, 361'c and 361'd of the first, second, third and fourth programmable interconnects may be provided by the interconnection metal layers 27 of the BISD 79 as seen in FIG. 17 and/or the interconnection metal layers 6 and/or 27 of the FISIP 560 and/or SISIP 588 of the interposer 551 as seen in FIG. 15.

Package-On-Package (POP) or Stack-Package Assembly for FOIT LOGIC Drives

Figure 20:
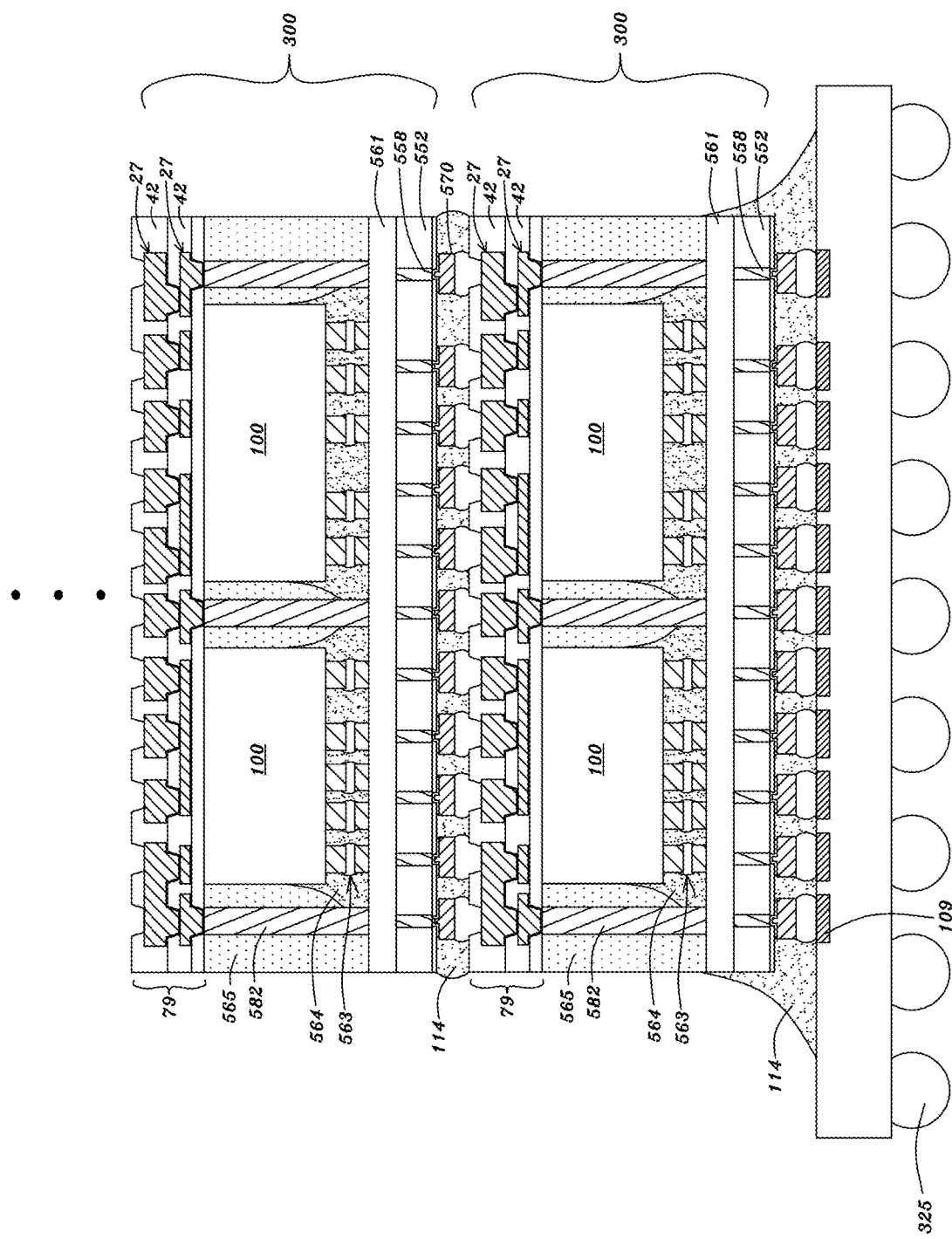
FIG. 20 is a schematically cross-sectional view showing a package-on-package assembly in accordance with an embodiment of the present application.

FIG. 20 is a schematically cross-sectional view showing a package-on-package assembly in accordance with an embodiment of the present application. Referring to FIG. 20, multiple logic drives 300 as seen in FIG. 17 may be stacked together. An upper one of the logic drives 300 may have its metal bumps 570 bonded to the fifth metal pads of the backside metal interconnection scheme (BISD) 79 of a lower one of the logic drives 300, and an underfill 114 may be filled between the upper and lower ones of the logic drives 300, enclosing the metal bumps 570 between the upper and lower ones of the logic drives 300. The bottommost one of the logic drives 300 may have its metal bumps 570 bonded to multiple metal pads 109 of a circuit board 113 at a top surface thereof, and an underfill 114 may be filled between the bottommost one of the logic drives 300 and the circuit board 113, enclosing the metal bumps 570 between the bottommost one of the logic drives 300 and the circuit board 113. Multiple solder balls 325 are formed on a bottom surface of the circuit board 113.

Immersive IC Interconnection Environment (IIIE)

Referring to FIGS. 14, 15, 17 and 20, the logic drives 300 may be stacked to form a super-rich interconnection scheme or environment, wherein their semiconductor chips 100 represented for the standard commodity FPGA IC chips 200 provided with the programmable logic blocks 201 as illustrated in Fig. and the cross-point switches 379 as illustrated in FIGS. 3A, 3B and 8v, immerses in the super-rich interconnection scheme or environment, i.e., programmable 3D Immersive IC Interconnection Environment (IIIE). For one of the standard commodity FPGA IC chips 200 in one of the logic drives 300, (1) the interconnection metal layers 6 and/or 27 of the FISC 20 and/or SISC 29 of said one of the standard commodity FPGA IC chips 200, the bonded contacts 563 between said one of the standard commodity FPGA IC chips 200 and the interposer 551 of said one of the logic drives 300, the interconnection metal layers 6 and/or 27, i.e., inter-chip interconnects 371, of the FISIP 560 and/or SISIP 588 of the interposer 551 of said one of the logic drives 300, and the metal pillars or bumps 570 between a lower one and said one of the logic drives 300 are provided under the programmable logic blocks 201 and cross-point switches 379 of said one of the standard commodity FPGA IC chips 200; (2) the interconnection metal layers 27 of the BISD 79 of said one of the logic drives 300 and the fifth metal pads of the BISD 79 of said one of the logic drives 300 are provided over the programmable logic blocks 201 and cross-point switches 379 of said one of the standard commodity FPGA IC chips 200; and (3) the TPVs 582 of said one of the logic drives 300 are provided surrounding the programmable logic blocks 201 and cross-point switches 379 of said one of the standard commodity FPGA IC chips 200. The programmable 3D IIIE provides the super-rich interconnection scheme or environment, comprising the FISC 20 and/or SISC 29 of each of the semiconductor chips 100 for the standard commodity FPGA IC chips 200 and DPIIC chips 410, the bonded contacts 563 between each of the semiconductor chips 100 and one of the interposers 551, the interposers 551, the BISD 79 of each of the logic drives, the TPVs 582 of each of the logic drives 300 and the metal pillars or bumps 570 between each two of the logic drives 300, for constructing an interconnection scheme or system in three dimensions (3D). The interconnection scheme or system in a horizontal direction may be programmed by the cross-point switches 379 of each of the standard commodity FPGA IC chips 200 and DPIIC chips 410 of each of the logic drives 300. Also, the interconnection scheme or system in a vertical direction may be programmed by the cross-point switches 379 of each of the standard commodity FPGA IC chips 200 and DPIIC chips 410 of each of the logic drives 300.

Figure 21A:
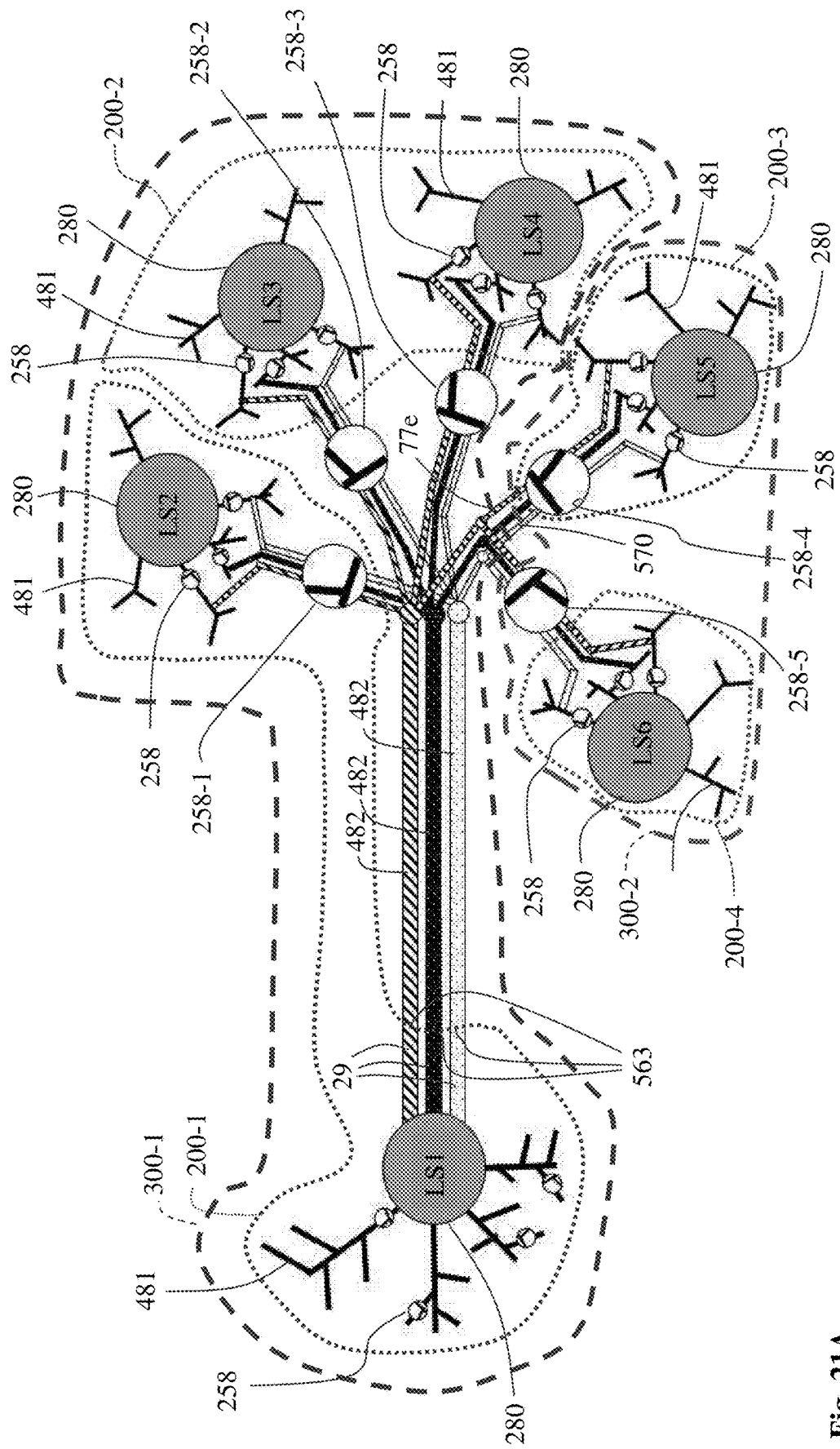
FIGS. 21A and 21B are conceptual views showing interconnection between multiple programmable logic blocks from an aspect of human's nerve system in accordance with an embodiment of the present application.
Figure 21B:
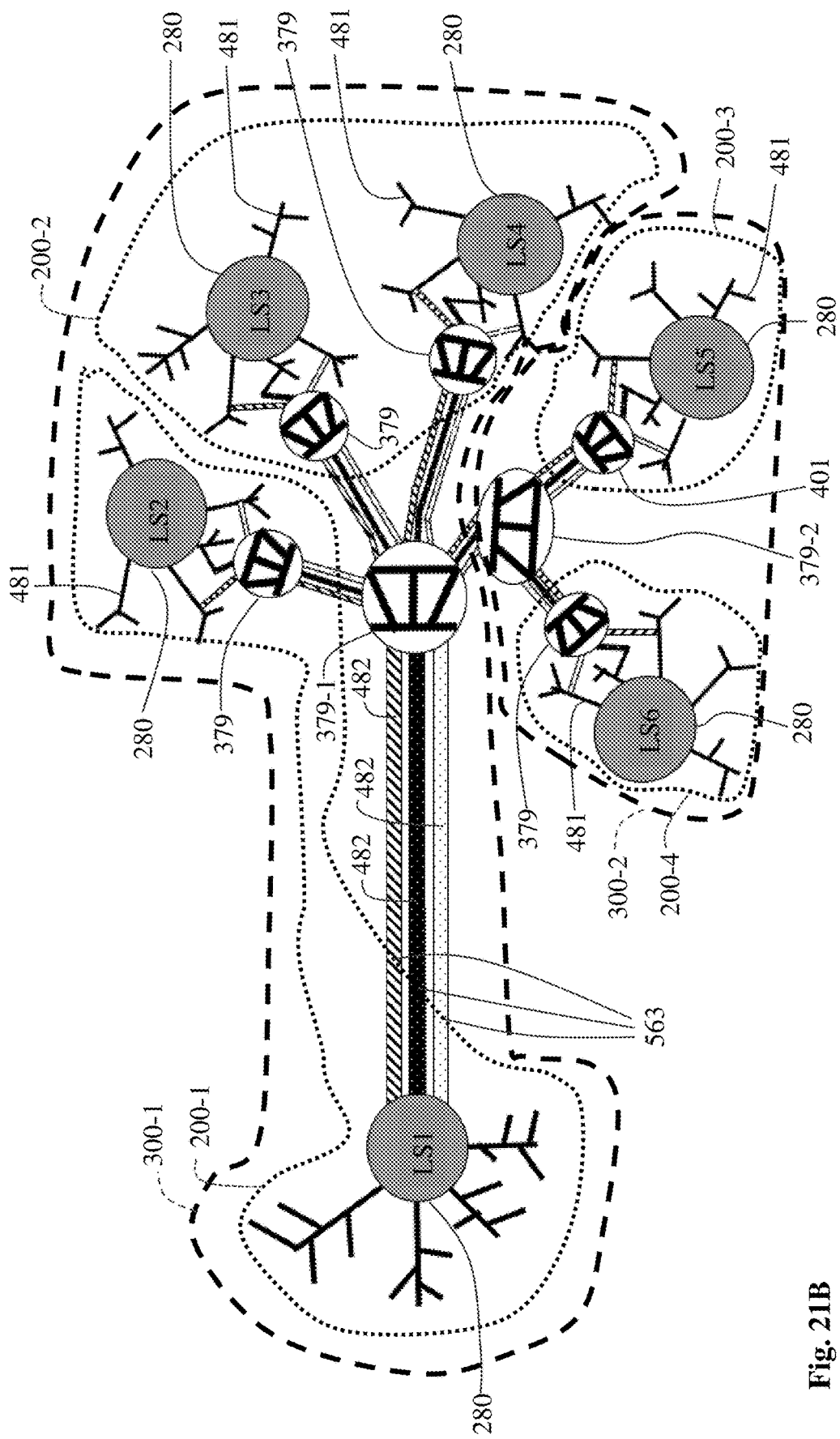

FIGS. 21A and 21B are conceptual views showing interconnection between multiple programmable logic blocks from an aspect of human's nerve system in accordance with an embodiment of the present application. For an element indicated by the same reference number shown in FIGS. 21A and 21B and in above-illustrated figures, the specification of the element as seen in FIGS. 21A and 21B may be referred to that of the element as above illustrated in the figures. Referring to FIG. 21A, the programmable 3D IIIE is similar or analogous to a human brain. The programmable logic blocks 201 as seen in FIG. 6 are similar or analogous to neurons or nerve cells; the interconnection metal layers 6 of the FISC 20 and/or the interconnection metal layers 27 of the SISC 29 are similar or analogous to the dendrites connecting to the neurons or nerve cells 201. The bonded contacts 563 connecting to the small receivers 375 of the small I/O circuits 203 of said one of the standard commodity FPGA IC chips 200 for the inputs of the programmable logic blocks 201 of said one of the standard commodity FPGA IC chips 200 are similar or analogous to post-synaptic cells at ends of the dendrites. For a short distance between two of the programmable logic blocks 201 in one of the standard commodity FPGA IC chips 200, the interconnection metal layers 6 of its FISC 20 and/or the interconnection metal layers 27 of its SISC 29 may construct an interconnect 482 like an axon connecting from one of the neurons or nerve cells 201 to another of the neurons or nerve cells 201. For a long distance between two of the standard commodity FPGA IC chips 200, the interconnection metal layers 6 and/or 27 of the FISIP 560 and/or SISIP 588 of the interposers 551 of the logic drives 300, the interconnection metal layers 27 of the BISDs 79 of the logic drives 300 and the TPVs 582 of the logic drives 300 may construct the axon-like interconnect 482 connecting from one of the neurons or nerve cells 201 to another of the neurons or nerve cells 201. One of the bonded contacts 563 physically between a first one of the standard commodity FPGA IC chips 200 and one of the interposers 551 for physically connecting to the axon-like interconnect 482 may be programmed to connect to the small drivers 374 of the small I/O circuits 203 of a second one of the standard commodity FPGA IC chips 200 and thus is similar or analogous to pre-synaptic cells at a terminal of the axon 482.

For more elaboration, referring to FIG. 21A, a first one 200-1 of the standard commodity FPGA IC chips 200 may include first and second ones LS1 and LS2 of the logic sections (LS) 280 as illustrated in FIGS. 10A, 10B, 11A and 11B like the neurons, its FISC 20 and/or SISC 29 like the dendrites 481 coupling to the first and second ones LS1 and LS2 of the logic sections (LS) 280 and the cross-point switches 379 programmed for connection of its FISC 20 and/or SISC 29 to the first and second ones LS1 and LS2 of the logic sections (LS) 280. A second one 200-2 of the standard commodity FPGA IC chips 200 may include third and fourth ones LS3 and LS4 of the logic sections (LS) 280 like the neurons, its FISC 20 and/or SISC 29 like the dendrites 481 coupling to the third and fourth ones LS3 and LS4 of the logic sections (LS) 280 and the cross-point switches 379 programmed for connection of its FISC 20 and/or SISC 29 to the third and fourth ones LS3 and LS4 of the logic sections (LS) 280. A first one 300-1 of the logic drives 300 may include the first and second ones 200-1 and 200-2 of the standard commodity FPGA IC chips 200. A third one 200-3 of the standard commodity FPGA IC chips 200 may include a fifth one LS5 of the logic sections (LS) 280 like the neurons, its FISC 20 and/or SISC 29 like the dendrites 481 coupling to the fifth one LS5 of the logic sections (LS) 280 and its cross-point switches 379 programmed for connection of its FISC 20 and/or SISC 29 to the fifth one LS5 of the logic sections (LS) 280. A fourth one 200-4 of the standard commodity FPGA IC chips 200 may include a sixth one LS6 of the logic sections (LS) 280 like the neurons, its FISC 20 and/or SISC 29 like the dendrites 481 coupling to the sixth one LS6 of the logic sections (LS) 280 and the cross-point switches 379 programmed for connection of its FISC 20 and/or SISC 29 to the sixth one LS6 of the logic sections (LS) 280. A second one 300-2 of the logic drives 300 may include the third and fourth ones 200-3 and 200-4 of the standard commodity FPGA IC chips 200. (1) A first portion, which is provided by the interconnection metal layers 6 and 27 of the FISC 20 and/or SISC 29 of the first one 200-1 of the standard commodity FPGA IC chips 200, extending from the logic section LS1, (2) one of the bonded contacts 563 extending from the first portion, (3) a second portion, which is provided by the interconnection metal layers 6 and/or 27 of the FISIP 560 and/or SISIP 588 of the interposer 551 and/or the TPVs 582 of the first one 300-1 of the logic drives 300 and/or the interconnection metal layers 27 of the BISD 79 of the first one 300-1 of the logic drives 300, extending from said one of the bonded contacts 563, (4) the other one of the bonded contacts 563 extending from the second portion, and (5) a third portion, which is provided by the interconnection metal layers 6 and 27 of the FISC 20 and/or SISC 29 of the first one 200-1 of the standard commodity FPGA IC chips 200, extending from the other one of the bonded contacts 563 to the logic section LS2 may compose the axon-like interconnect 482. The axon-like interconnect 482 may be programmed to connect the first one LS1 of the logic sections (LS) 280 to one or more of the second through sixth ones LS2, LS3, LS4, LS5 and LS6 of the logic sections (LS) 280 according to switching of first through fifth ones 258-1 through 258-5 of the pass/no-pass switches 258 of the cross-point switches 379 set on the axon-like interconnect 482. The first one 258-1 of the pass/no-pass switches 258 may be arranged in the first one 200-1 of the standard commodity FPGA IC chips 200. The second and third ones 258-2 and 258-3 of the pass/no-pass switches 258 may be arranged in one of the DPIIC chips 410 in the first one 300-1 of the logic drives 300. The fourth one 258-4 of the pass/no-pass switches 258 may be arranged in the third one 200-3 of the standard commodity FPGA IC chips 200. The fifth one 258-5 of the pass/no-pass switches 258 may be arranged in one of the DPIIC chips 410 in the second one 300-2 of the logic drives 300. The first one 300-1 of the logic drives 300 may have the fifth metal pads coupling to the second one 300-2 of the logic drives 300 through the metal bumps or pillars 570.

Furthermore, referring to FIG. 21B, the axon-like interconnect 482 may be considered as a scheme or structure of a tree including (i) a trunk or stem connecting to the first one LS1 of the logic sections (LS) 280, (ii) multiple branches branching from the trunk or stem for connecting its trunk or stem to one or more of the second and sixth ones LS2-LS6 of the logic sections (LS) 280, (iii) a first one 379-1 of the cross-point switches 379 set between its trunk or stem and each of its branches for switching the connection between its trunk or stem and one of its branches, (iv) multiple sub-branches branching from one of its branches for connecting said one of its branches to one or more of the fifth and sixth ones LS5 and LS6 of the logic sections (LS) 280, and (v) a second one 379-2 of the cross-point switches 379 set between said one of its branches and each of its sub-branches for switching the connection between said one of its branches and one or more of its sub-branches. The first one 379-1 of the cross-point switches 379 may be provided in one of the DPIIC chips 410 in the first one 300-1 of the logic drives 300, and the second one 379-2 of the cross-point switches 379 may be provided in one of the DPIIC chips 410 in the second one 300-2 of the logic drives 300. Each of the dendrite-like interconnects 481 may include (i) a stem connecting to one of the first through sixth ones LS1-LS6 of the logic sections (LS) 280, (ii) multiple branches branching from the stem, (iii) a cross-point switch 379 set between its stem and each of its branches for switching the connection between its stem and one or more of its branches. Each of the programmable logic blocks 201 of one of the standard commodity FPGA IC chips 200-1 through 200-4 may couple to multiple of the dendrite-like interconnects 481 composed of the interconnection metal layers 6 and/or 27 of the FISC 20 and/or SISC 29 of said one of the standard commodity FPGA IC chips 200-1 through 200-4. Each of the programmable logic blocks 201 may be coupled to a distal terminal of one or more of the axon-like interconnects 482 through the dendrite-like interconnects 481 extending from said each of the programmable logic blocks 201.

Referring to FIGS. 21A and 21B, each of the logic drives 300-1 and 300-2 may provide a reconfigurable plastic, elastic and/or integral (granular) architecture for system/machine computing or processing using integral (granular) and alterable memory units and logic units in each of the programmable logic blocks 201, in addition to the sequential, parallel, pipelined or Von Neumann computing or processing system architecture and/or algorithm. Each of the logic devices 300-1 and 300-2 with plasticity, elasticity and integrality (granularity) may include integral, granular and alterable memory units and logic units to alter or reconfigure logic functions and/or computing (or processing) architecture (or algorithm) and/or memories (data or information) in the memory units. The properties of the plasticity, elasticity and integrality (granularity) of the logic drive 300-1 or 300-2 is similar or analogous to that of a human brain. The brain or nerves have plasticity, elasticity and integrality (granularity). Many aspects of brain or nerves can be altered (or are "plastic" or "elastic") and reconfigured through adulthood. The logic drives 300-1 and 300-2, or standard commodity FPGA IC chips 200-1, 200-2, 200-3 and 200-4, described and specified above provide capabilities to alter or reconfigure the logic functions and/or computing (or processing) architecture (or algorithm) for a given fixed hardware using the programming memories (PM) (data or information) stored in the near-by programing memory cells in the FPGA IC chips 200 as seen in FIG. 13, e.g., programming codes stored in the memory cells 362 in the FPGA IC chips 200 as seen in FIG. 13 for the cross-point switches 379 or pass/no-pass switches 258 as seen in FIGS. 2A-2C, 3A, 3B and 8 and programming codes or resulting values stored in the memory cells 490 in the FPGA IC chips 200 as seen in FIG. 13 for the look-up tables 210 as seen in FIG. 6. In the logic drives 300-1 and 300-2, the data or information stored in the memory cells of PM are used for altering or reconfiguring the logic functions and/or computing/processing architecture (or algorithm). In the logic drives 300-1 and 300-2, the memory cells of the HBM IC chips 251 as illustrated in FIG. 13 are used for storing data or information (Data Memory cells, DM).

Figure 21C:
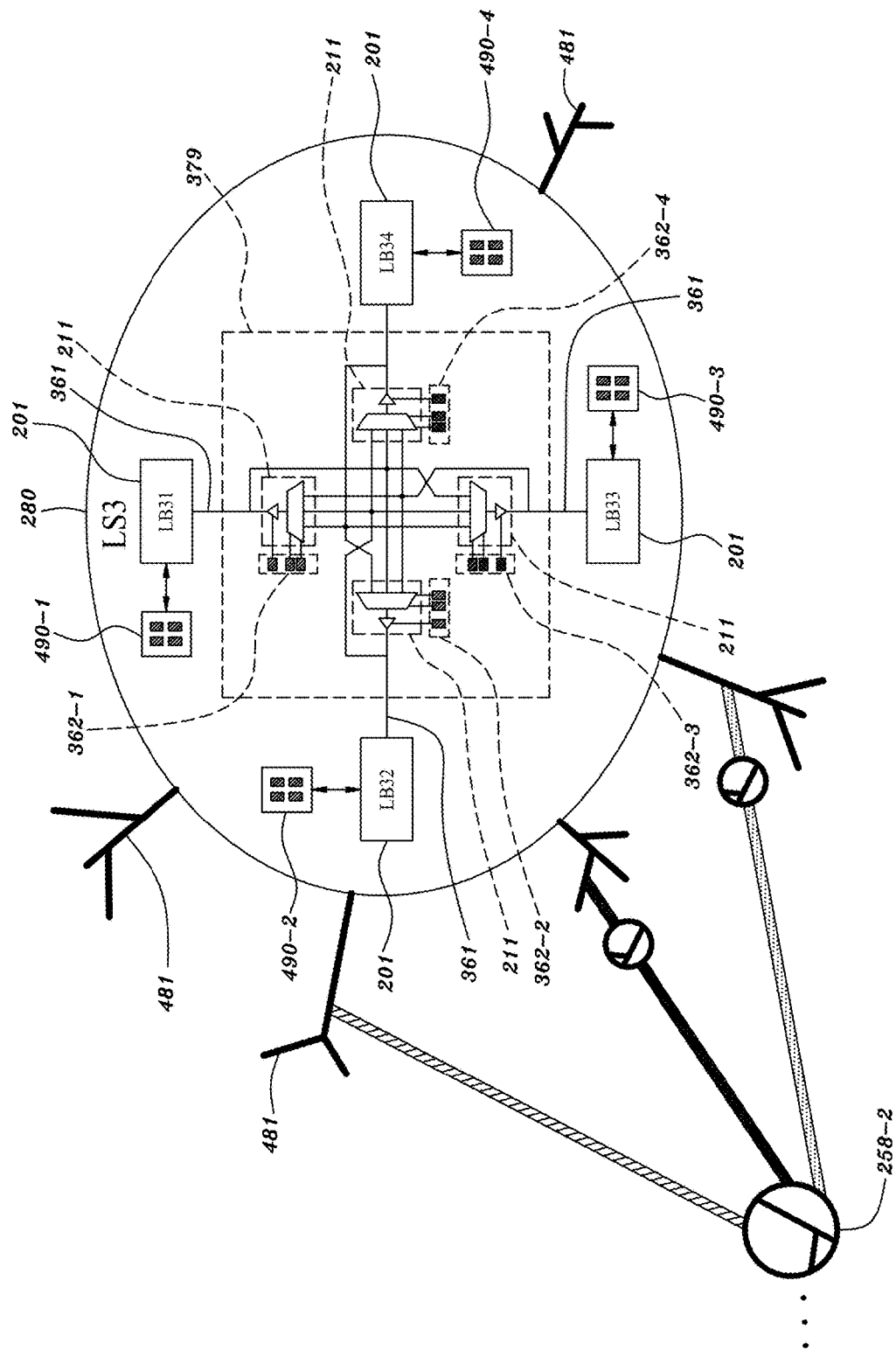
FIGS. 21C and 21D are schematic diagrams for a reconfigurable plastic, elastic and/or integral architecture in accordance with an embodiment of the present application.

For example, FIG. 21C is a schematic diagram for a reconfigurable plastic, elastic and/or integral architecture in accordance with an embodiment of the present application. Referring to FIG. 21C, the third one LS3 of the logic sections (LS) 280 may include four programmable logic blocks LB31, LB32, LB33 and LB34, a cross-point switch 379, eight sets of programing memory (PM) cells 362-1, 362-2, 362-3, 362-4, 490-1, 490-2, 490-3 and 490-4. The cross-point switch 379 may be referred to one as illustrated in FIG. 8. For an element indicated by the same reference number shown in FIGS. 21C and 8, the specification of the element as seen in FIG. 21C may be referred to that of the element as illustrated in FIG. 8. The four programmable interconnects 361 at four ends of the cross-point switch 379 may couple to the four programmable logic blocks LB31, LB32, LB33 and LB34. Each of the programmable logic blocks LB31, LB32, LB33 and LB34 may have the same architecture as the logic block 201 illustrated in FIG. 6 with its output Dout or one of its inputs A0 and A1 coupling to one of the four programmable interconnects 361 at the four ends of the cross-point switch 379. Each of the programmable logic blocks LB31, LB32, LB33 and LB34 may couple to one of the four sets of programming memory (PM) cells 490-1, 490-2, 490-3 and 490-4 for storing data for each event and/or storing resulting values or programming codes acting as its look-up table 210 for example. Thereby, the logic functions and/or computing/processing architecture or algorithm of the logic section LS3 may be altered or reconfigured when the data stored in any of the four sets of programming memory (PM) cells 490-1, 490-2, 490-3 and 490-4 are altered or reconfigured.

Evolution and Reconfiguration for Logic Drive

Figure 22:
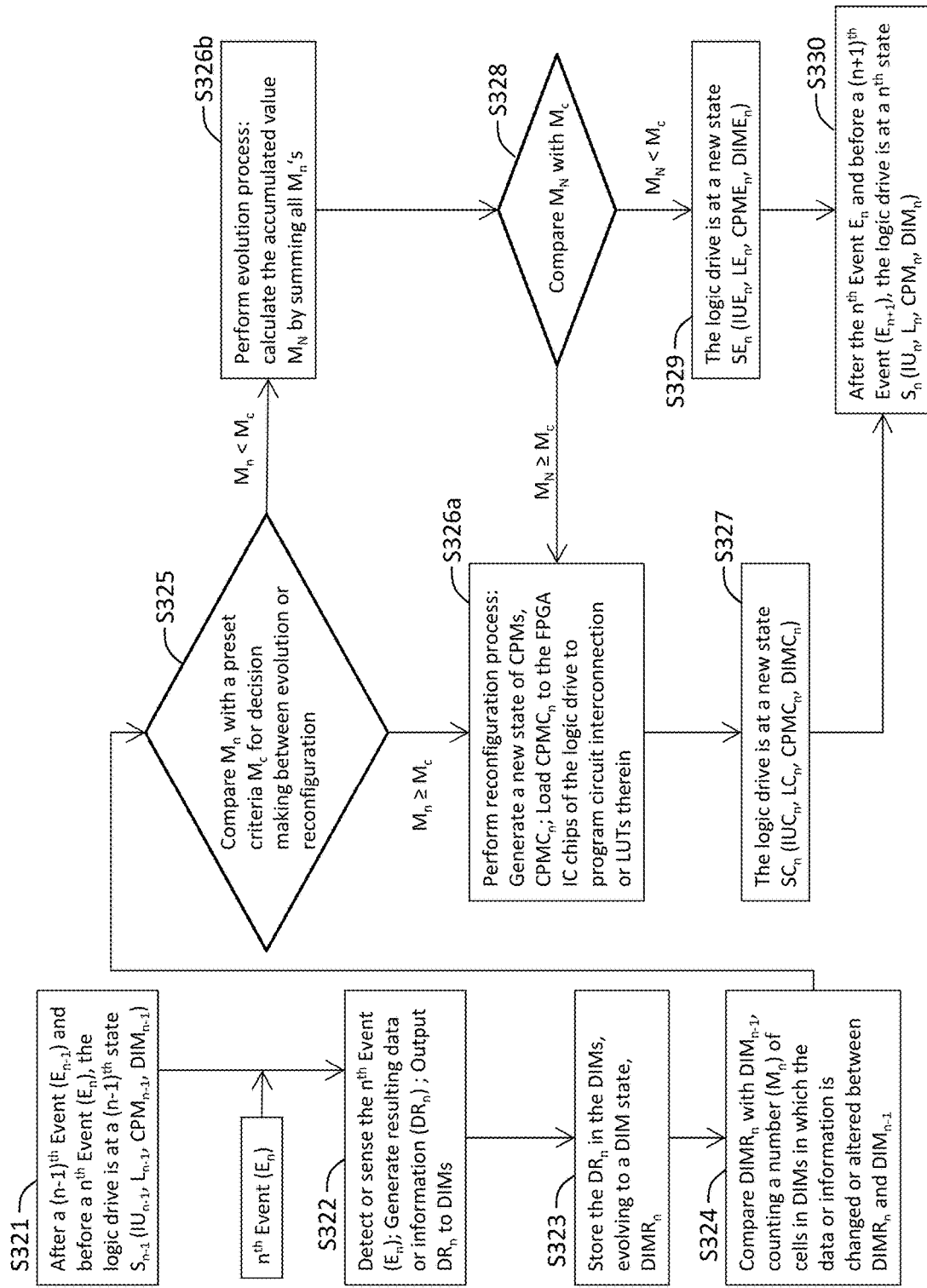
FIG. 22 is a block diagram illustrating an algorithm or flowchart for evolution and reconfiguration for a commodity standard logic drive in accordance with an embodiment of the present application.

FIG. 22 is a block diagram illustrating an algorithm or flowchart for evolution and reconfiguration for a commodity standard logic drive in accordance with an embodiment of the present application. Referring to FIG. 22, a state (S) of the standard commodity logic drive 300 comprises an integral unit (IU), a logic state (L), a CPM state and a DIM state, and can be described as S (IU, L, CPM, DIM). The evolution or reconfiguration of the state of the standard commodity logic drive 300 is performed as follows:

In a step S321, after a $(n-1)^{th}$ Event $(E_{n-1})$ and before a $n^{th}$ Event $(E_n)$, the standard commodity logic drive 300 is at a $(n-1)^{th}$ state $S_{n-1}$ ($IU_{n-1}$, $L_{n-1}$, $CPM_{n-1}$, $DIM_{n-1}$), wherein n is a positive integer, i.e., 1, 2, 3, . . . or N.

In a step S322, when the standard commodity logic drive 300, or a machine, system or device external of the standard commodity logic drive 300, is subject to the $n^{th}$ Event $(E_n)$, it detects or senses the $n^{th}$ Event $(E_n)$ and generate a $n^{th}$ signal $(F_n)$; the detected or sensed signal $(F_n)$ is input to the standard commodity logic drive 300. The standard commodity FPGA IC chips 200 of the standard commodity logic drive 300 perform processing and computing based on the $n^{th}$ signal $(F_n)$, generate a $n^{th}$ resulting data or information $(DR_n)$ and output the $n^{th}$ resulting data or information $(DR_n)$ to be stored in the data information memory (DIM) cells, such as in the HBM IC chips 251, of the standard commodity logic drive 300.

In a step S323, the data information memory (DIM) cells store the $n^{th}$ resulting data or information $(DR_n)$ and are evolved to a data infirmary memory (DIM) state for the $n^{th}$ resulting data or information $(DR_n)$, i.e., $DIMR_n$.

In a step S324, the standard commodity FPGA IC chips 200, or other control, processing or computing IC chips, such as dedicated control chip 260, GPU chips 269a and/or CPU chips 269b as seen in FIG. 13, of the standard commodity logic drive 300 may perform comparison between the $n^{th}$ resulting data or information $(DR_n)$ for $DIMR_n$ and the $(n-1)^{th}$ resulting data or information $(DR_{n-1})$ for data information memory cells, i.e., $DIM_{n-1}$, by detecting the changes between them, for example, and then may count a number $(M_n)$ of the data information memory (DIM) cells in which the data information memory (DIM) is changed or altered between $DIMR_n$ and $DIM_{n-1}$.

In a step S325, the standard commodity FPGA IC chips 200 or the other control, processing or computing IC chips of the standard commodity logic drive 300 compare the number $(M_n)$ to preset criteria $(M_c)$ for decision making between evolution or reconfiguration of the standard commodity logic drive 300.

Referring to FIG. 22, if the number $(M_n)$ is equal to or larger than the preset criteria $(M_c)$, the event $E_n$ is a grand event, and a step S326a continues for the reconfiguration route. If the bumber $(M_n)$ is smaller than the preset criteria $(M_c)$, the event $E_n$ is not a grand event, and a step S326b continues for the evolution route.

In the step 326a, the standard commodity logic drive 300 may perform the reconfiguration process to generate a new state of configuration programming memory (CPMs) (data or information), i.e., $CPMC_n$. For example, based on the $n^{th}$ resulting data or information $(DR_n)$ for $DIMR_n$, new truth tables may be generated and then may be transformed into the new state of configuration programming memory $(CPMC_n)$. The configuration programming memory $(CPMC_n)$ (data or information) is loaded to the standard commodity FPGA IC chips 200 of the standard commodity logic drive 300 to program the programmable interconnects 361 as illustrated in FIGS. 2A-2C, 3A, 3B and 8 and/or look-up tables 210 (LUTs) as illustrated in FIG. 6 therein. After the reconfiguration, in a step S327, the standard commodity logic drive 300 is at a new state SC. ($IUC_n$, $LC_n$, $CPMC_n$, $DIMC_n$), comprising the new states of $IUC_n$, $LC_n$, $CPMC_n$, and $DIMC_n$. The new state SC. ($IUC_n$, $LC_n$, $CPMC_n$, $DIMC_n$) will be defined, in a step S330, as a final state $S_n$ ($IU_n$, $L_n$, $CPM_n$, $DIM_n$) of the standard commodity logic drive 300 after the grand event $E_n$.

In the step S326b, the standard commodity logic drive 300 may perform the evolution process. The standard commodity FPGA IC chips 200, or the other control, processing or computing IC chips of the standard commodity logic drive 300, may calculate the accumulated value $(M_N)$ by summing all of the numbers $(M_n$'s), wherein n is: (A) from 1 to n if no grand event happened; or (B) from (R+1) to n if a last grand event happened at the $R^{th}$ event $E_R$, wherein R is a positive integer. In a step S328, the standard commodity FPGA IC chips 200, or the other control, processing or computing IC chips, of the standard commodity logic drive 300 may compare the number $M_N$ to M. If the number $M_N$ is equal to or larger than the preset criteria $M_c$, the reconfiguration process in the step S326a as described and specified above continues. If the number $M_N$ is smaller than the preset criteria $M_c$, a step S329 for evolution continues. In the step S329, the standard commodity logic drive 300 is at an evolution state $SE_n$ ($IUE_n$, $LE_n$, $CPME_n$, $DIME_n$), wherein the states of L, CPM do not change from that after the event $E_{n-1}$, that means, $LE_n$ is the same as $L_{n-1}$, $CPME_n$ is the same as $CPM_{n-1}$; while $DIME_n$ is $DIMR_n$. The evolution state $SE_n$ ($IUE_n$, $LE_n$, $CPME_n$, $DIME_n$) may be defined, in the step S330, as a final state $S_n$ ($IU_n$, $L_n$, $CPM_n$, $DIM_n$) of the logic drive after the evolution event $E_n$.

Referring to FIG. 22, the steps S321 through S330 may be repeated for the $(n+1)^{th}$ Event $E_{n+1}$.

The reconfiguration in the step S326a of generating the new states of $IUC_n$, $DIMC_n$ comprises (i) Reorganization of the integral unit (IU) and/or (ii) condense or concise processes as follows:

I. Reorganization of the Integral Unit (IU):

The FPGA IC chip 200 may perform the reconfiguration by reorganizing the integral units (IU) in an integral unit (IU) state. Each integral unit (IU) state may comprise several integral units (IU). Each integral unit (IU) is related to a certain logic function and may comprise several CPMs and DIMs. The reorganization may change (1) the number of integral units (IU) in the integral unit (IU) state, (2) the number and content (the data or information therein) in CPM and DIM in each of the integral units (IU). The reconfiguration may further comprise (1) relocating original CPM or DIM data in different locations or addresses, or (2) storing new CPM or DIM data in some locations or addresses originally storing original CPM or DIM data or in new locations or addresses. If data in CPM or DIM are identical or similar, they may be removed from CPM or DIM memory cells after reconfiguration and may be stored in remote storage memory cells in devices external of the logic drive 300 (and/or stored in NAND flash memory cells of the NVM IC chips 250 in the logic drive 300 as seen in FIG. 13).

Criteria are established for the identical or similar cells in CPM or DIM: (1) A machine/system external of the logic drive 300 (and/or the FPGA IC chips 200 or other control, processing or computing IC chips of the logic drive 300, such as dedicated control chip 260, GPU chips 269a and/or CPU chips 269b as seen in FIG. 13) checks the DIM$_n$ to find identical memories, and then keeping only one memory of all identical memories in the CPM or DIM of SRAM or DRAM cells in the HBM IC chips 251 in the logic drive 300 and NAND flash memory cells in the NVM IC chips 250 in the logic drive 300, removing all other identical memories from CPM or DIM memory cells after reconfiguration, wherein the identical memories may be stored in remote storage memory cells in devices external of the logic drive (and/or stored in NAND flash memory cells of the NVM IC chips 250 in the logic drive 300); and/or (2) A machine/system external of the logic drive 300 (and/or the FPGA IC chips 200 or other control, processing or computing IC chips of the logic drive 300, such as dedicated control chip 260, GPU chips 269a and/or CPU chips 269b as seen in FIG. 13) checks the DIM$_n$ to find similar memories (similarity within a given percentage x %, for example, is equal to or smaller than 2%, 3%, 5% or 10% in difference), and keeping only one or two memories of all similar memories in the CPM or DIM of SRAM or DRAM cells in the HBM IC chips 251 in the logic drive 300 and NAND flash memory cells in the NVM IC chips 250 in the logic drive 300, removing all other similar memories from CPM or DIM memory cells after reconfiguration, wherein the similar memories may be stored in remote storage memory cells in devices external of the logic drive 300 (and/or stored in NAND flash memory cells of the NVM IC chips 250 in the logic drive); alternatively, a representative memory (data or information) of all similar memories may be generated and kept in the CPM or DIM of SRAM or DRAM cells in the HBM IC chips 251 in the logic drive 300 and NAND flash memory cells in the NVM IC chips 250 in the logic drive 300, removing all other similar memories from CPM or DIM memory cells after reconfiguration, wherein the similar memories may be stored in remote storage memory cells in devices external of the logic drive 300 (and/or stored in NAND flash memory cells of the NVM IC chips 250 in the logic drive 300).

II. Learning Processes:

The logic drive 300 may further provide capability of a learning process. Based on S$_n$ (IU$_n$, L$_n$, CPM$_n$, DIM$_n$), performing an algorithm to select or screen (memorize) useful, significant and important integral units IUs, logics Ls, CPMs and DIMs, and forget non-useful, non-significant or non-important integral units IUs, logics Ls, CPMs or DIMs by storing the useful, significant and important integral units IUs, logics Ls, CPMs and DIMs in the CPM or DIM of SRAM or DRAM cells in the HBM IC chips 251 in the logic drive 300 and NAND flash memory cells in NVM IC chips 250 in the logic drive 300, removing all other identical memories from CPM or DIM memory cells after reconfiguration, wherein the identical memories may be stored in remote storage memory cells in devices external of the logic drive 300 (and/or stored in NAND flash memory cells of the NVM IC chips 250 in the logic drive 300). The selection or screening algorithm may be based on a given statistical method, for example, based on the frequency of use of integral units IUs, logics Ls, CPMs and or DIMs in the previous n events. For example, if a logic function of a logic gate is not used frequently, the logic gate may be used for another different function. Another example, the Bayesian inference may be used for generating a new state of the logic drive after learning SL$_n$ (IUL$_n$, LL$_n$, CPML$_n$, DIML$_n$).

FIG. 23 shows two tables illustrating reconfiguration for a commodity standard logic drive in accordance with an embodiment of the present application. For a configuration programming memory state CPM$_{(i,j,k)}$, the subscript of "i" means a set "i" of configuration programming memory, and the subscripts of "j" and "k" mean an address "j" for storing data "k" for configuration programming memory. For a data information memory state DIM$_{(a,b,c)}$, the subscript of "a" means a set "a" of data information memory, and the subscripts of "b" and "c" mean an address "b" for storing data "c" for data information memory. Referring to FIG. 23, before reconfiguration, the standard commodity logic drive 300 may include three integral units IU$_{(n-1)a}$, IU$_{(n-1)b}$ and IU$_{(n-1)c}$ in the event E$_{(n-1)}$, wherein the integral unit IU$_{(n-1)a}$ may perform a logic state L$_{(n-1)a}$ based on a configuration programming state CPM$_{(a,1,1)}$ and store data information memory states DIM$_{(a,1,1')}$ and DIM$_{(a,2,2')}$, DIM the integral unit IU$_{(n-1)b}$ may perform a logic state L$_{(n-1)b}$ based on configuration programming memory states CPM$_{(b,2,2)}$ and CPM$_{(b,3,3)}$ and store data information memory states DIM$_{(b,3,3')}$ and DIM$_{(b,4,4')}$ and the integral unit IU$_{(n-1)c}$ may perform a logic state L$_{(n-1)c}$ based on a configuration programming memory state CPM$_{(c,4,4)}$ and store data information memory states DIM$_{(c,5,5')}$, DIM$_{(c,6,6')}$ and DIM$_{(c,7,6')}$. During reconfiguration, the standard commodity logic drive 300 may include four integral units IUC$_{ne}$, IUC$_{nf}$, IUC$_{ng}$ and IUC$_{nh}$ in the event E$_n$, wherein the integral unit IUC$_{ne}$ may perform a logic state LC$_{ne}$ based on a configuration programming memory state CPMC$_{(e,1,1)}$ and store data information memory states DIMC$_{(e,1,1')}$ and DIMC$_{(e,2,2')}$, the integral unit IUC$_{nf}$ may perform a logic state LC$_{nf}$ based on configuration programming memory states CPMC$_{(f,2,4)}$ and CPMC$_{(f,3,5)}$ and store data information memory states DIMC$_{(f,3,8')}$, DIMC$_{(f,4,9')}$ and DIMC$_{(f,5,10')}$, the integral unit IUC$_{ng}$ may perform a logic state LC$_{ng}$ based on configuration programming memory states CPMC$_{(g,4,2)}$ and CPMC$_{(g,5,5)}$ and store data information memory states DIMC$_{(0,1,1')}$ and DIMC$_{(g,8,5')}$, and the integral unit IUC$_{nh}$ may perform a logic state LC$_{nh}$ based on a configuration programming memory state CPMC$_{(h,6,6)}$ and store data information memory states DIMC$_{(h,7,7)}$ and DIMC$_{(h,9,6')}$.

In comparison between the states before reconfiguration and during reconfiguration, the CPM data "4" originally stored in the CPM address "4" is kept to be stored in the CPM address "2" during reconfiguration; the CPM data "2" originally stored in the CPM address "2" is kept to be stored in the CPM address "4" during reconfiguration; the CPM data "3" is different from the CPM data "2" by less than 5% in difference and is removed from the CPM cells during reconfiguration and may be stored in remote storage memory cells in devices external of the logic drive 100 and/or stored in NAND flash memory cells of the NVM IC chips 250 in the logic drive 300 as seen in FIG. 13. The DIM data "5'" originally stored in the DIM address "5" is kept during reconfiguration to be stored in the DIM address "8"; the DIM data "6'" originally stored in both DIM addresses "6" and "7" is kept during reconfiguration with only one copy to be stored in the DIM address "9"; the DIM data "3'" and "4'" are removed from the DIM cells during reconfiguration and may be stored in remote storage memory cells in devices external of the logic drive 300 and/or stored in NAND flash memory cells of the NVM IC chips 250 in the logic drive 300; the DIM addresses "3", "4", "5", "6" and "7" store new DIM data "8'", "9'", "10'", "11'" and "7'" respectively, during reconfiguration; new DIM addresses "8" and "9" store original DIM data "5'" and "6'" respectively, during reconfiguration.

An example of plasticity, elasticity and integrality is taken using the logic section LS3, as illustrated in FIGS. 31A-31C, as GPS (Global Positioning System) functions, as below:

The logic section LS3 is, for example, functioning as GPS, remembering routes and enabling to drive to various locations. A driver and/or machine/system was planning to drive from San Francisco to San Jose, and the logic section LS3 may functions as:

(1) In a first event E1, the driver and/or machine/system looked up a map and found two Freeways 101 and 280 to get to San Jose from San Francisco. The machine/system used the programmable logic blocks LB31 and LB32 for computing and processing the first event E1 and memorized a first logic configuration L1 for the first event E1 and the related data, information or outcomes of the first event E1. That was: the machine/system (a) formulated the programmable logic blocks LB31 and LB32 at the first logic configuration L1 based on a first set of configuration-programming-memory data (CPM1) in the CPM cells 362-1, 362-2, 362-3, 362-4, 490-1 and 490-2 of the logic section LS3 and (b) stored a first set of data-information-memory data (DIM1) in the HBM IC chips 251 in the standard commodity logic drive 300-1. The integral state of GPS functions in the logic section LS3 after the first event E1 may be defined as S1LS3 relating to the first logic configuration L1 for E1, CPM1 and DIM1.

(2) In a second event E2, the driver and/or machine/system decided to take Freeway 101 to get to San Jose from San Francisco. The machine/system used the programmable logic blocks LB31 and LB33 for computing and processing the second event E2 and memorized a second logic configuration L2 for the second event E2 and the related data, information or outcomes of the second event E2. That was: the machine/system (a) formulated the programmable logic blocks LB31 and LB33 at the second logic configuration L2 based on a second set of configuration-programming-memory data (CPM2) in the programming memory cells 362-1, 362-2, 362-3, 362-4, 490-1 and 490-3 of the logic section LS3 and/or the first set of data memories DM1 and (b) stored a second set of data-information-memory data (DIM2) in the HBM IC chips 251, VMIC chip 324, DRAM IC chips 321, or memory chips 687 in the memory modules 159 in a single-module type or in the operation modules 190, in the standard commodity logic drive 300-1. The integral state of GPS functions in the logic section LS3 after the second event E2 may be defined as S2LS3 relating to the second logic configuration L2 for E2, CPM2 and DIM2. The second set of data-information-memory data DIM2 may include newly added information relating to the second event E2 and the data and information reorganized based on DIM1, and thereby keeps useful and important information of the first event E1.

(3) In a third event E3, the driver and/or machine/system drove from San Francisco to San Jose through Freeway 101. The machine/system used the programmable logic blocks LB31, LB32 and LB33 for computing and processing the third event E3 and memorized a third logic configuration L3 for the third event E3 and the related data, information or outcomes of the third event E3. That was: the machine/system (a) formulated the programmable logic blocks LB31, LB32 and LB33 at the third logic configuration L3 based on a third set of configuration-programming-memory data (CPM3) in the programming memory cells 362-1, 362-2, 362-3, 362-4, 490-1, 490-2 and 490-3 of the logic section LS3 and/or the second set of data-information-memory data DIM2 and (b) stored a third set of data-information-memory data (DIM3) in the HBM IC chips 251 in the standard commodity logic drive 300-1. The integral state of GPS functions in the logic section LS3 after the third event E3 may be defined as S3LS3 relating to the third logic configuration L3 for E3, CPM3 and DIM3. The third set of data-information-memory data DIM3 may include newly added information relating to the third event E3 and the data and information reorganized based on DIM1 and DIM2, and thereby keeps useful and important information of the first and second events E1 and E2.

(4) In a fourth event E4 after two months of the third event E3, the driver and/or machine/system drove from San Francisco to San Jose through Freeway 280. The machine/system used the programmable logic blocks LB31, LB32, LB33 and LB34 for computing and processing the fourth event E4 and memorized a fourth logic configuration L4 for the fourth event E4 and the related data, information or outcomes of the fourth event E4. That was: the machine/system (a) formulated the programmable logic blocks LB31, LB32, LB33 and LB34 at the fourth logic configuration L4 based on a fourth set of configuration-programming-memory data (CPM4) in the programming memory cells 362-1, 362-2, 362-3, 362-4, 490-1, 490-2, 490-3 and 490-4 of the logic section LS3 and/or the third set of data-information-memory data DIM3 and (b) stored a fourth set of data-information-memory data (DIM4) in the HBM IC chips 251 in the standard commodity logic drive 300-1. The integral state of GPS functions in the logic section LS3 after the fourth event E4 may be defined as S4LS3 relating to the fourth logic configuration L4 for E4, CPM4 and DIM4. The fourth set of data-information-memory data DIM4 may include newly added information relating to the fourth event E4 and the data and information reorganized based on DIM1, DIM2 and DIM3, and thereby keeps useful and important information of the first, second and third events E1, E2 and E3.

(5) In a fifth event E5 after one week of the fourth event E4, the driver and/or machine/system drove from San Francisco to Cupertino through Freeway 280. Cupertino was in the middle way of the route in the fourth event E4. The machine/system used the programmable logic blocks LB31, LB32, LB33 and LB34 at the fourth logic configuration L4 for computing and processing the fifth event E5 and memorized the fourth logic configuration L4 for the fifth event E5 and the related data, information or outcomes of the fifth event E5. That was: the machine/system (a) formulated the programmable logic blocks LB31, LB32, LB33 and LB34 at the fourth logic configuration L4 based on the fourth set of configuration-programming-memory data (CPM4) in the programming memory cells 362-1, 362-2, 362-3, 362-4, 490-1, 490-2, 490-3 and 490-4 of the logic section LS3 and/or the fourth set of data-information-memory data DIM4 and (b) stored a fifth set of data-information-memory data (DIM5) in the HBM IC chips 251 in the standard commodity logic drive 300-1. The integral state of GPS functions in the logic section LS3 after the fifth event E5 may be defined as S5LS3 relating to the fourth logic configuration L4 for E5, CPM4 and DIM5. The fifth set of data-information-memory data DIM5 may include newly added information relating to the fifth event E5 and the data and information reorganized based on DIM1-DIM4, and thereby keeps useful and important information of the first through fourth events E1-E4.

(6) In a sixth event E6 after six months of the fifth event E5, the driver and/or machine/system was planning to drive from San Francisco to Los Angeles. The driver and/or machine/system looked up a map and found two Freeways 101 and 5 to get to Los Angeles from San Francisco. The machine/system used the programmable logic block LB31 of the logic section LS3 and the programmable logic block LB41 of the logic section LS4 for computing and processing the sixth event E6 and memorized a sixth logic configuration L6 for the sixth event E6 and the related data, information or outcomes of the sixth event E6. The logic section LS4 may have the same architecture as the logic section LB3 illustrated in FIG. 21C, but the four programmable logic blocks LB31, LB32, LB33 and LB34 in the logic section LS3 are renumbered as LB41, LB42, LB43 and LB44 in the logic section LS4 respectively. That was: the machine/system (a) formulated the programmable logic blocks LB31 and LB41 at the sixth logic configuration L6 based on a sixth set of configuration-programming-memory data CPM6 in the programming memory cells 362-1, 362-2, 362-3, 362-4 and 490-1 of the logic section LS3 and those of the logic section LS4 and/or the fifth set of data-information-memory data DIM5 and (b) stored a sixth set of data-information-memory data DIM6 in the HBM IC chips 251 in the standard commodity logic drive 300-1. The integral state of GPS functions in the logic sections LS3 and LS4 after the sixth event E6 may be defined as S6LS3&4 relating to the sixth logic configuration L6 for E6, CPM6 and DIM6. The sixth set of data-information-memory data DIM6 may include newly added information relating to the sixth event E6 and the data and information reorganized based on DIM1-DIM5, and thereby keeps useful and important information of the first through fifth events E1-E5.

(7) In a seventh event E7, the driver and/or machine/system decided to take Freeway 5 to get to Los Angeles from San Francisco. The machine/system used the programmable logic blocks LB31 and LB33 at the second logic configuration L2 and/or the sixth set of data memories DM6 for computing and processing the seventh event E7 and memorized the second logic configuration L2 for the seventh event E7 and the related data, information or outcomes of the seventh event E7. That was: the machine/system (a) used the sixth set of data memories DM6 for logic processing with the programmable logic blocks LB31 and LB33 at the second logic configuration L2 based on the second set of configuration-programming-memory data CPM2 in the programming memory cells 362-1, 362-2, 362-3, 362-4, 490-1 and 490-3 of the logic section LS3 and (b) stored a seventh set of data-information-memory data DIM7 in the HBM IC chips 251 in the standard commodity logic drive 300-1. The integral state of GPS functions in the logic section LS3 after the seventh event E7 may be defined as S7LS3 relating to the second logic configuration L2 for E7, CPM2 and DIM7. The seventh set of data-information-memory data DIM7 may include newly added information relating to the seventh event E7 and the data and information reorganized based on DIM1-DIM6, and thereby keeps useful and important information of the first through sixth events E1-E6.

Figure 21D:
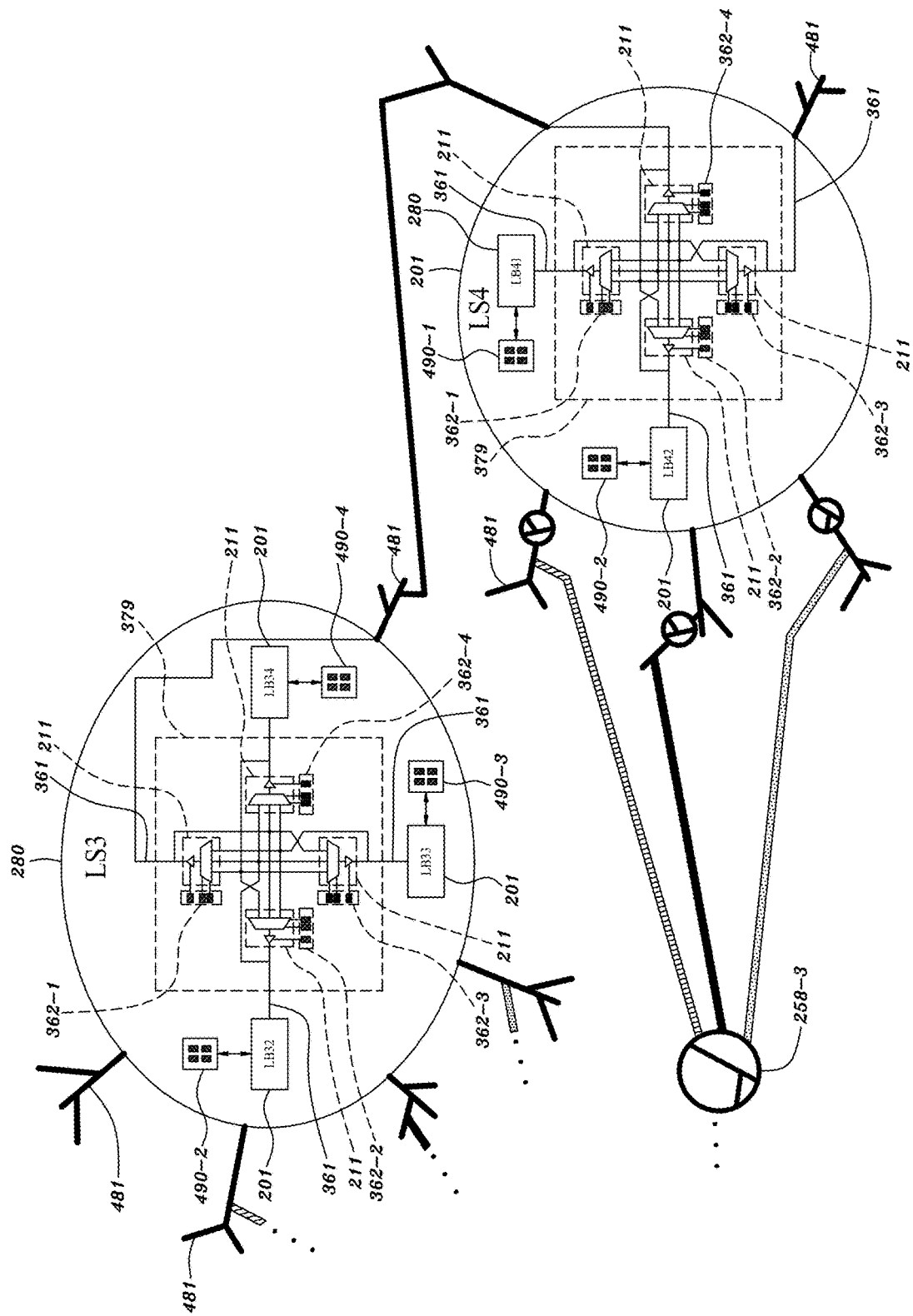

(8) In an eighth event E8 after two weeks of the seventh event E7, the driver and/or machine/system drove from San Francisco to Los Angeles through Freeway 5. The machine/system used the programmable logic blocks LB32, LB33 and LB34 of the logic section LS3 and the programmable logic blocks LB41 and LB42 of the logic section LS4 for computing and processing the eighth event E8 and memorized an eighth logic configuration L8 of the eighth event E8 and the related data, information or outcomes of the eighth event E8. The machine/system used the programmable logic blocks LB32, LB33 and LB34 of the logic section LS3 and the programmable logic blocks LB41 and LB42 of the logic section LS4 for computing and processing the eighth event E8 and memorized the eighth logic configuration L8 for the eighth event E8 and the related data, information or outcomes of the eighth event E8. The logic section LS4 may have the same architecture as the logic section LS3 illustrated in FIG. 21C, but the four programmable logic blocks LB31, LB32, LB33 and LB34 in the logic section LS3 are renumbered as LB41, LB42, LB43 and LB44 in the logic section LS4 respectively. FIG. 21D is a schematic diagram for a reconfigurable plastic, elastic and/or integral architecture for the eighth event E8 in accordance with an embodiment of the present application. Referring to FIGS. 21A-21D, the cross-point switch 379 of the logic section LS3 may have its top terminal switched not to couple to the programmable logic block LB31 (not shown in FIG. 21D but shown in FIG. 21C) but to a first portion of the FISC 20 and SISC 29 of the second semiconductor chip 200-2, like one of the dendrites 481 of the neurons for the logic section LS3. The cross-point switch 379 of the logic section LS4 may have its right terminal switched not to couple to the programmable logic block LB44 (not shown) but to a second portion of the FISC 20 and SISC 29 of the second semiconductor chip 200-2, like one of the dendrites 481 of the neurons for the logic section LS4, connecting to the first portion of the FISC 20 and SISC 29 of the second semiconductor chip 200-2 through a third portion of the FISC 20 and SISC 29 of the second semiconductor chip 200-2. The cross-point switch 379 of the logic section LS4 may have its bottom terminal switched not to couple to the programmable logic block LB43 (now shown) but to a fourth portion of the FISC 20 and SISC 29 of the second semiconductor chip 200-2, like one of the dendrites 481 of the neurons for the logic section LS4. That was: the machine/system (a) formulated the programmable logic blocks LB32, LB33, LB34, LB41 and LB42 at the eighth logic configuration L8 based on an eighth set of configuration-programming-memory data CPM8 in the programming memory cells 362-1, 362-2, 362-3, 362-4, 490-1, 490-2 and 490-3 of the logic section LS3 and the programming memory cells 362-1, 362-2, 362-3, 362-4, 490-1 and 490-2 of the logic section LS4 and/or the seventh set of data-information-memory data DIM7 and (b) stored an eighth set of data-information-memory data (DIM8) in the HBM IC chips 251 in the standard commodity logic drive 300-1. The integral state of GPS functions in the logic sections LS3 and LS4 after the eighth event E8 may be defined as S8LS3&4 relating to the eighth logic configuration L8 for E8, CPM8 and DIM8. The eighth set of data-information-memory data DIM8 may include newly added information relating to the eighth event E8 and the data and information reorganized based on DIM1-DIM7, and thereby keeps useful and important information of the first through seventh events E1-E7.

(9) The event E8 is quite different from the previous first through seventh events E1-E7, and is categorized as a grand event E9, resulting in an integral state S9LS3. In the grand event E9 for grand reconfiguration after the first through eighth events E1-E8, the driver and/or machine/system may reconfigure the first through eighth logic configurations L1-L8 into a ninth logic configuration L9 (1) to formulate the programmable logic blocks LB31, LB32, LB33 and LB34 of the logic section LS3 at the ninth logic configuration L9 based on a ninth set of configuration-programming-memory data CPM9 in the programming memory cells 362-1, 362-2, 362-3 and 362-4 of the logic section LS3 and/or the first through eighth sets of data-information-memory data DIM1-DIM8 for the GPS functions for the locations in the California area between San Francisco and Los Angeles and (2) to store a ninth set of data-information-memory data DIM9 in the data memory cells 490-1, 490-2, 490-3 and 490-4 of the logic section LS3.

The machine/system may perform the grand reconfiguration with a certain given criteria. The grand reconfiguration is like the human brain reconfiguration after a deep sleep. The grand reconfiguration comprises condense or concise processes and learning processes, mentioned as below:

In the condense or concise processes for reconfiguration of data-memory-memory (DM) data in the event E9, the machine/system may check the eighth set of data-information-memory data DIM8 to find identical data-information-memory data, and keep only one of the identical data memories in the logic section LS3; alternatively, the machine/system may check the eighth set of data-information-memory data DIM8 to find similar data with more than 70%, e.g., between 80% and 99%, of similarity among them, and select only one or two from the similar data as representative data-information-memory (DIM) data for the similar data.

In the condense or concise processes for reconfiguration of configuration-programming-memory (CPM) data in the event E9, the machine/system may check the eighth set of configuration-programming-memory data CPM8 for corresponding logic functions to find identical data for the same or similar logic functions, and keep only one of the identical data in the logic section LS3 for the logic functions; alternatively, the machine/system may check the eighth set of configuration-programming-memory data CPM8 for the same or similar logic functions to find similar date with 70%, e.g., between 80% and 99%, of similarity among them, for the same or similar logic functions and keep only one or two from the similar data for the same or similar logic functions as representative configuration-programming-memory (CPM) data for the similar data for the same or similar logic functions.

In the learning processes in the event E9, an algorithm may be performed to (1) CPM1-CPM4, CPM6 and CPM8 for the logic configurations L1-L4, L6 and L8 and (2) DIM1-DIM8, for optimizing, e.g., selecting or screening, CPM1-CPM4, CPM6 and CPM8 into useful, significant and important ones as CPM9 and optimizing, e.g., selecting or screening, DIM1-DIM8 into useful, significant and important ones as DIM9. Further, the algorithm may be performed to (1) CPM1-CPM4, CPM6 and CPM8 for the logic configurations L1-L4, L6 and L8 and (2) DIM1-DIM8 for deleting non-useful, non-significant or non-important ones of the programming memories CPM1-CPM4, CPM6 and CPM8 and deleting non-useful, non-significant or non-important ones of the data memories DIM1-DIM8. The algorithm may be performed based on a statistical method, e.g., the frequency of use of CPM1-CPM4, CPM6 and CPM8 in the events E1-E8 and/or the frequency of use of DIM1-DIM8 in the events E1-E8.

Interposer-to-Interposer Assembly for Logic and Memory Drives

Figure 24:
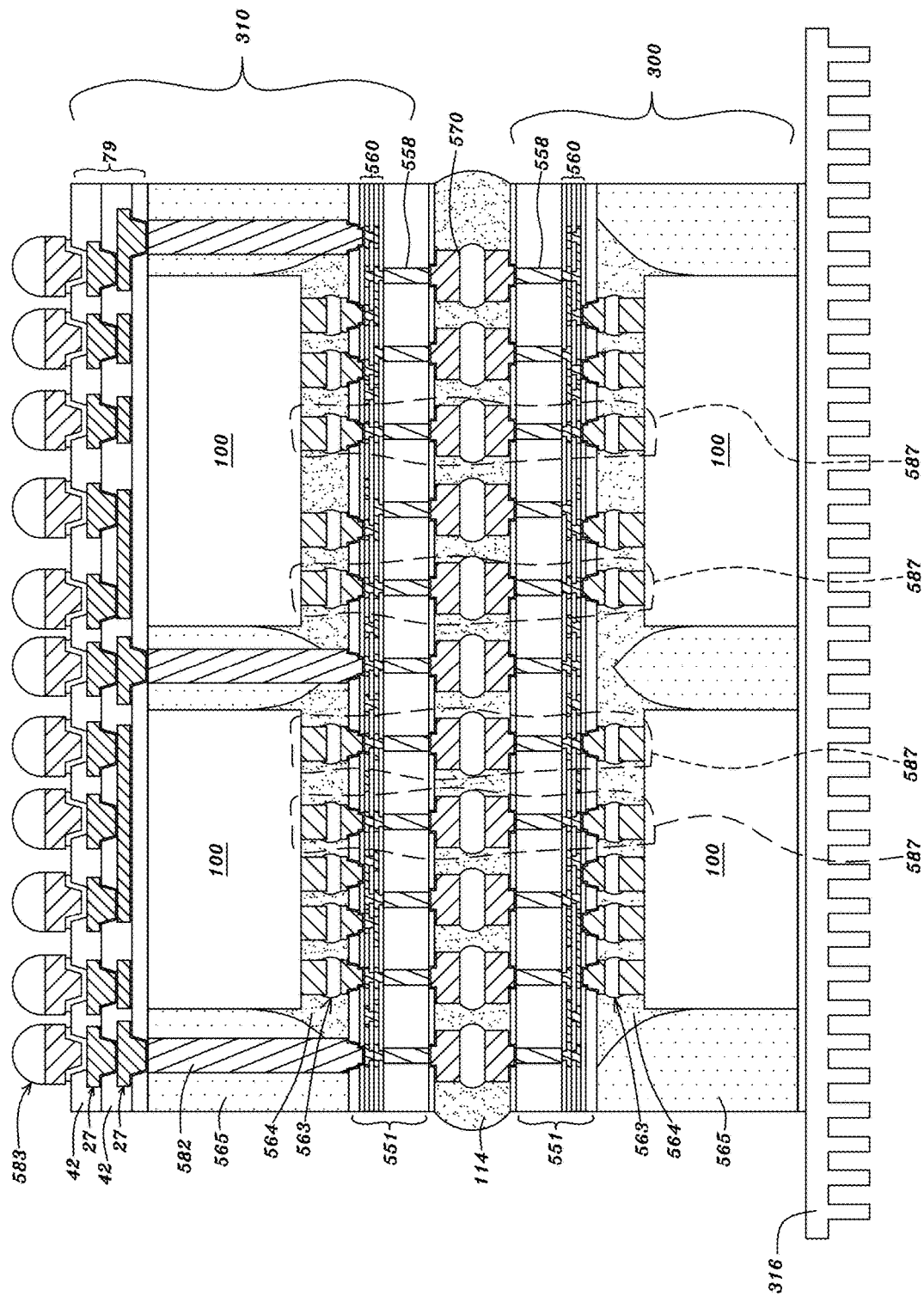
FIG. 24 is a schematically cross-sectional view showing an assembly for logic and memory drives in accordance with an embodiment of the present application.
Figure 25:
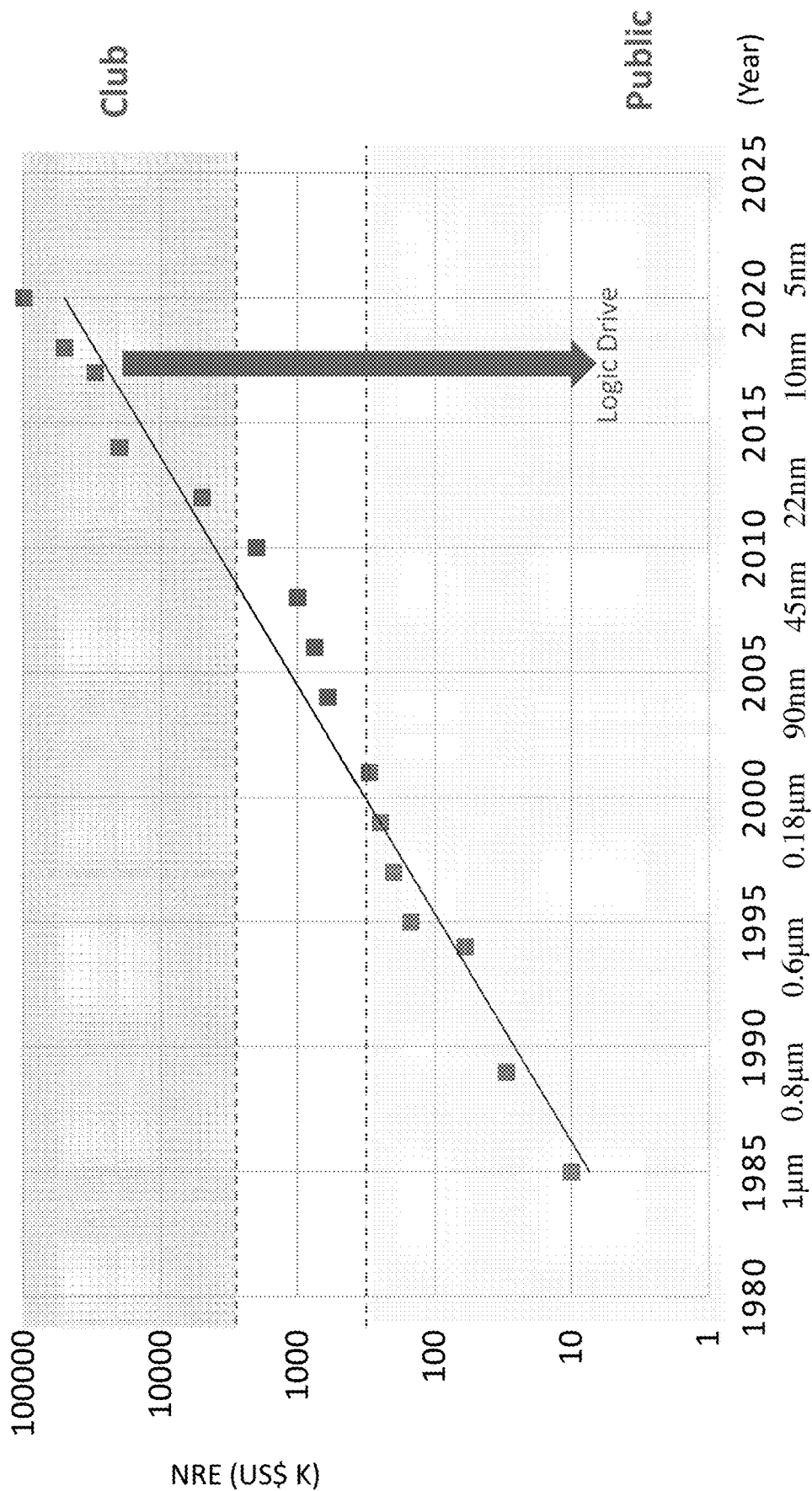
FIG. 25 is a chart showing a trend of relationship between non-recurring engineering (NRE) costs and technology nodes.

FIG. 24 is a schematically cross-sectional view showing an assembly for FOIT logic and memory drives in accordance with an embodiment of the present application. Referring to FIG. 25, all of the FPGA IC chips 200, GPU chips 269a, CPU chips 269b and dedicated programmable interconnection IC chips 410 in the logic drives 300 as seen in FIG. 13 may not be provided but multiple memory chips, e.g., HBM IC chips, cache SRAM chips, DRAM IC chips, or NVMIC chips for MRAM or RRAM, may be provided for a memory drive 310 that also include the interposer 551, through package vias (TPVs) 582, backside metal interconnection scheme (BISD) 79 and metal bumps 570 and 583 as illustrated in FIG. 17. The memory drive 310 may have its metal bumps 570 to be bonded to the metal bumps 570 of the logic drive 300 to form multiple bonded contacts 586 between the memory drive 310 and logic drive 300. Each of stacked vias 587 may be composed of (1) one of the bonded contacts 586, (2) one of stacked portions provided by the vias 558 and interconnection metal layers 6 and/or 27 of FISIP 560 and/or SISIP 588, as seen in FIG. 15, of the interposer 551 of the logic 300, (3) one of the bonded contacts 563 of the logic drive 300, (4) one of stacked portions provided by the vias 558 and interconnection metal layers 6 and/or 27 of FISIP 560 and/or SISIP 588, as seen in FIG. 15, of the interposer 551 of the memory drive 310 and (5) one of the bonded contacts 563 of the memory drive 310, which are aligned in a vertical direction to form vertical signal paths between one of the semiconductor chips 100 of the logic drive 300, such as FPGA IC chip 200, GPU chip 269a or CPU chip 269c as seen in FIG. 14, and one of the semiconductor chips 100 of the memory drive 310, such as HBM IC chip or DRAM IC chip. A plurality of the vertical stacked path 587 having the number equal to or greater than 64, 128, 256, 512, 1024, 2048, 4096, 8K, or 16K, for example, may be connected between said one of the semiconductor chips 100 of the logic drive 300 and said one of the semiconductor chips 100 of the memory drive 310 for parallel signal transmission or power or ground delivery. Further, a heat sink 316 made of copper or aluminum for example may be mounted to backsides of the semiconductor chips 100 of the logic drive 300.

The scope of protection is limited solely by the claims, and such scope is intended and should be interpreted to be as broad as is consistent with the ordinary meaning of the language that is used in the claims when interpreted in light of this specification and the prosecution history that follows, and to encompass all structural and functional equivalents thereof

What is claimed is:

1. A chip package comprising:
   an interconnection scheme comprising a first interconnect therein;
   a semiconductor integrated-circuit (IC) chip coupling to the interconnection scheme, wherein the semiconductor integrated-circuit (IC) chip comprises a memory cell for storing configuration data therein, a switch having input data associated with the configuration data stored in the memory cell, a second interconnect coupling to the switch and a third interconnect coupling to the switch, wherein the switch is configured to control, in accordance with the input data, coupling between the second and third interconnects; and
   a metal interconnect coupling the semiconductor integrated-circuit (IC) chip to the interconnection scheme, wherein the third interconnect couples to the first interconnect through, in sequence, the switch, second interconnect and metal interconnect.

2. The chip package of claim 1, wherein the semiconductor integrated-circuit (IC) chip further comprises a fourth interconnect coupling to the switch, wherein the switch is configured to control coupling between the third interconnect and one or both of the second and fourth interconnects.

3. The chip package of claim 1, wherein the interconnection scheme comprises first and second interconnection metal layers therein and an insulating dielectric layer between the first and second interconnection metal layers, wherein the first interconnect is provided by the first and second interconnection metal layers, wherein the semiconductor integrated-circuit (IC) chip is over the interconnection scheme.

4. The chip package of claim 1, wherein the interconnection scheme is provided by an interposer, wherein the interposer comprises a silicon substrate and a copper via vertically in the silicon substrate, wherein the interconnection scheme is over the silicon substrate, wherein the interconnection scheme comprises a first interconnection metal layer over the silicon substrate, a second interconnection metal layer over the first interconnection metal layer and silicon substrate and an insulating dielectric layer between the first and second interconnection metal layers, wherein the first interconnect is provided by the first and second interconnection metal layers, wherein the semiconductor integrated-circuit (IC) chip is over the interposer.

5. The chip package of claim 4, wherein the second interconnection metal layer comprises a copper layer having a thickness between 0.3 and 20 micrometers.

6. The chip package of claim 4, wherein the first interconnection metal layer comprises a copper layer having a thickness between 3 and 500 nanometers and a titanium-containing layer at a bottom and sidewall of the copper layer.

7. The chip package of claim 1, wherein the metal interconnect comprises a metal bump between the semiconductor integrated-circuit (IC) chip and interconnection scheme, wherein the metal bump couples the semiconductor integrated-circuit (IC) chip to the interconnection scheme, and the third interconnect couples to the first interconnect through, in sequence, the switch, second interconnect and metal bump.

8. The chip package of claim 1, wherein the memory cell comprises a static-random-access memory (SRAM) cell for storing the configuration data therein.

9. The chip package of claim 1, wherein the semiconductor integrated-circuit (IC) chip is a field-programmable-gate-array (FPGA) integrated-circuit (IC) chip.

10. A chip package comprising:
an interconnection scheme comprising first and second interconnects therein;
a first semiconductor integrated-circuit (IC) chip coupling to the interconnection scheme, wherein the first semiconductor integrated-circuit (IC) chip comprises a memory cell for storing configuration data therein and a switch having input data associated with the configuration data stored in the memory cell, wherein the switch is configured to control, in accordance with the input data, coupling between the first and second interconnects; and
a second semiconductor integrated-circuit (IC) chip coupling to the interconnection scheme, wherein the first interconnect couples to the second semiconductor integrated-circuit (IC) chip through, in sequence, the switch and second interconnect.

11. The chip package of claim 10, wherein the first and second semiconductor integrated-circuit (IC) chips are over the interconnection scheme.

12. The chip package of claim 10, wherein the interconnection scheme further comprises a third interconnect coupling to the switch, wherein the switch is configured to control coupling between the first interconnect and one or both of the second and third interconnects.

13. The chip package of claim 10, wherein the interconnection scheme comprises first and second interconnection metal layers therein and an insulating dielectric layer between the first and second interconnection metal layers, wherein the second interconnect is provided by the first and second interconnection metal layers.

14. The chip package of claim 10, wherein the interconnection scheme is provided by an interposer, wherein the interposer comprises a silicon substrate and a copper via vertically in the silicon substrate, wherein the interconnection scheme is over the silicon substrate, wherein the interconnection scheme comprises a first interconnection metal layer over the silicon substrate, a second interconnection metal layer over the first interconnection metal layer and silicon substrate and an insulating dielectric layer between the first and second interconnection metal layers, wherein the second interconnect is provided by the first and second interconnection metal layers, wherein the first and second semiconductor integrated-circuit (IC) chips are over the interposer.

15. The chip package of claim 14, wherein the second interconnection metal layer comprises a copper layer having a thickness between 0.3 and 20 micrometers.

16. The chip package of claim 10, wherein the memory cell comprises a static-random-access memory (SRAM) cell for storing the configuration data therein.

17. The chip package of claim 10, wherein the first semiconductor integrated-circuit (IC) chip is a field-programmable-gate-array (FPGA) integrated-circuit (IC) chip.

18. The chip package of claim 10, wherein the second semiconductor integrated-circuit (IC) chip is a dynamic-random-access-memory (DRAM) IC chip.

19. The chip package of claim 10, wherein the second semiconductor integrated-circuit (IC) chip is a graphic-processing-unit (GPU) chip.

20. The chip package of claim 10, wherein the second semiconductor integrated-circuit (IC) chip is a central-processing-unit (CPU) chip.

* * * * *